US008754489B2

(12) United States Patent
Machida et al.

(10) Patent No.: US 8,754,489 B2
(45) Date of Patent: Jun. 17, 2014

(54) ULTRASONIC TRANSDUCER AND MANUFACTURING METHOD

(75) Inventors: Shuntaro Machida, Kokubunji (JP); Hiroyuki Enomoto, Musashino (JP); Yoshitaka Tadaki, Hanno (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/605,340

(22) Filed: Sep. 6, 2012

(65) Prior Publication Data

US 2012/0326556 A1 Dec. 27, 2012

Related U.S. Application Data

(60) Continuation of application No. 12/407,414, filed on Mar. 19, 2009, now Pat. No. 8,294,225, which is a division of application No. 11/671,040, filed on Feb. 5, 2007, now Pat. No. 7,512,038.

(30) Foreign Application Priority Data

Mar. 31, 2006 (JP) ................................ 2006-096615

(51) Int. Cl.
*H01L 27/14* (2006.01)

(52) U.S. Cl.
USPC ............ 257/414; 257/254; 257/416; 438/50; 438/53; 367/140; 367/181

(58) Field of Classification Search
USPC ..................... 257/414, 416, 254; 438/50, 53; 367/140, 181
See application file for complete search history.

(56) References Cited

U.S. PATENT DOCUMENTS

| | | | | |
|---|---|---|---|---|
| 6,271,620 | B1 | 8/2001 | Ladabaum | |
| 6,320,239 | B1 | 11/2001 | Eccardt et al. | |
| 6,562,650 | B2 * | 5/2003 | Ladabaum | 438/53 |
| 6,571,445 | B2 | 6/2003 | Ladabaum | |
| 6,945,115 | B1 | 9/2005 | Wang | |
| 7,037,746 | B1 | 5/2006 | Smith et al. | |
| 2004/0160144 | A1 * | 8/2004 | Daft et al. | 310/334 |
| 2005/0121734 | A1 | 6/2005 | Degertekin | |
| 2005/0177045 | A1 | 8/2005 | Degertekin et al. | |
| 2005/0203397 | A1 | 9/2005 | Degertekin | |
| 2007/0128758 | A1 * | 6/2007 | Tanaka et al. | 438/50 |

FOREIGN PATENT DOCUMENTS

| | | |
|---|---|---|
| JP | 10-050956 | 2/1998 |
| JP | 2006-041339 | 2/2006 |

OTHER PUBLICATIONS

2003 IEEE Ultrasonics Symposium 1175-1178.
JP Office Action for Japanese Application No. 2012-151983, issued on Sep. 10, 2013.

* cited by examiner

*Primary Examiner* — David Vu
*Assistant Examiner* — Brandon Fox
(74) *Attorney, Agent, or Firm* — Antonelli, Terry, Stout & Kraus, LLP.

(57) ABSTRACT

An ultrasonic transducer includes a first electrode, a first insulation film covering the first electrode, a hollow part overlapping the first electrode on the first insulation film, a second insulation film covering the hollow part, a second electrode overlapping the hollow part on the second insulation film, and an interconnection joined to the second electrode. An edge of the first electrode is formed so as to moderate a step of the first electrode.

5 Claims, 43 Drawing Sheets

ULTRASONIC TRANSDUCER AND MANUFACTURING METHOD

CROSS REFERENCE TO RELATED APPLICATION

This application is a continuation application of U.S. application Ser. No. 12/407,414, filed Mar. 19, 2009, now U.S. Pat. No. 8,294,225, which is a divisional application of U.S. application Ser. No. 11/671,040, filed Feb. 5, 2007, now U.S. Pat. No. 7,512,038, the contents of which are incorporated herein by reference.

CLAIM OF PRIORITY

The present application claims priority from Japanese application JP 2006-096615 filed on Mar. 31, 2006, the content of which is hereby incorporated by reference into this application.

FIELD OF THE INVENTION

The present invention relates to an ultrasonic transducer and a method of manufacturing the same. In particular, it relates to an ultrasonic transducer manufactured by the MEMS (Micro Electro Mechanical System) technique, and a superior method of manufacture.

BACKGROUND OF THE INVENTION

Ultrasonic transducers are used as diagnostic devices for detecting tumors in the human body by the transmission and reception of ultrasonic waves.

Until now, ultrasonic transducers using piezoelectric vibration were used, but due to advances in the MEMS techniques in recent years, a capacitance detection type ultrasonic transducer (CMUT: Capacitive Micromachined Ultrasonic Transducer) wherein a vibrating part comprising a hollow part sandwiched between electrodes is mounted on a silicon substrate, is being intensively developed with a view to commercialization.

For example, U.S. Pat. No. 6,320,239 B1 (patent document 1) discloses a CMUT wherein a silicon substrate is used as the lower electrode.

U.S. Pat. No. 6,271,620 B1 (patent document 2) and 2003 IEEE ULTRASONICS SYMPOSIUM p. 577-p. 580 (non-patent document 1) disclose CMUT formed on lower electrodes which are patterned.

U.S. Pat. No. 6,571,445 B2 (patent document 3) and U.S. Pat. No. 6,562,650 B2 (patent document 4) disclose a technique wherein a CMUT is formed above a signal processing circuit formed on a silicon substrate.

SUMMARY OF THE INVENTION

However, compared to a transducer that uses conventional piezoelectrics, a CMUT has the advantages that a wide ultrasonic wave frequency band can be used, and it has high sensitivity. Microfabrication is also possible since it is manufactured by using LSI processing techniques. CMUT are considered to be indispensable when elements are disposed in an array, the upper electrodes and the lower electrodes of the elements are disposed orthogonally and the elements at the crosspoints are controlled independently, or when the elements are controlled completely independently. This is because although all elements must have interconnections, and there will probably be an enormous number of such interconnections in the array, they can be fabricated using LSI techniques. Hence, finer interconnections can be manufactured, and with CMUT, an ultrasonic transducer can even be mixed together on one chip of a signal processing circuit.

The basic structure and the operation of a CMUT array will now be described referring to FIG. 1 and FIG. 2.

FIG. 1 is a plan of a CMUT array. 203 are lower electrodes, 205 are hollow parts, 207 are upper electrodes, 208 are interconnections joined to upper electrodes, and 210 are wet etching holes for forming the hollow parts 205. The wet etching holes 210 are connected to the hollow parts 205. 101 are pad openings to pads in the same layer as the lower electrodes to supply power to the upper electrodes 207, and 102 are plugs that connect the pads to the interconnections 208. The interconnections 208 that join the upper electrodes 207 are connected to the pads via the plugs 102. 103 are pad openings to supply power to the lower electrodes 203. An insulation film is formed between the upper electrodes 207 and interconnections 208, and the lower electrodes 203, so as to cover the lower electrodes 203 and the hollow parts 205, but it is not shown in the diagram in order to show the hollow parts 205 and lower electrodes 203.

FIG. 2A shows a cross section in the direction A-A' of FIG. 1, and FIG. 2B shows a cross section in the direction B-B' of FIG. 1. As shown in FIG. 2A and FIG. 2B, the lower electrodes 203 are formed on an insulation film 202 formed on a semiconductor substrate 201. The hollow parts 205 are formed above the lower electrodes 203. Between them, an insulation film 204 is formed. An insulation film 206 is formed to cover the hollow parts 205, and the upper electrodes 207 and interconnections 208 which are joined to the upper electrodes, are formed above the insulation film 206. An insulation film 209 and insulation film 211 are formed above the upper electrodes 207 and the interconnections 208. The wet etching holes 210 penetrating these films are formed in the insulation film 206 and insulation film 209. These wet etching holes 210 are formed to form the hollow parts 205, and after the hollow parts 205 are formed, they are filled by the insulation film 211.

It is clear from FIG. 1 and FIG. 2 that because the upper electrodes and lower electrodes are orthogonal, the interconnections joining the upper electrodes extend beyond the step part due to the lower electrodes.

Hereafter, an operation to transmit an ultrasonic wave will be described.

When a direct current voltage and alternating current voltage are superimposed on the pad openings 101 connected to the upper electrodes 207 and pad openings 103 connected to the lower electrodes 203, an electrostatic force acts between the upper electrodes 207 and lower electrodes 203, so the upper electrodes 207, and the insulation films 206, 209, 211 on the hollow parts 205 forming the membranes of the CMUT cells at the crosspoints where the upper electrodes and lower electrodes intersect, vibrate at the frequency of the applied alternating current voltage, and an ultrasonic wave is thereby emitted.

When an ultrasonic wave is received, the insulation films 206, 209, 211 and upper electrodes 207 on the hollow parts 205 vibrate due to the pressure of the ultrasonic waves reaching the device surface. Due to this vibration, the distance between the upper electrodes 207 and lower electrodes 203 changes, and the ultrasonic wave is detected as a variation of the electrical capacitance between the electrodes. Specifically, because the spacing between the electrodes changes, the electrical capacitance between the electrodes changes and a current flows. The ultrasonic wave can be detected by detecting this current.

It is clear also from the aforesaid principle of action that since, when the membranes vibrate due to the electrostatic force resulting from application of the voltage between the electrodes for transmission of the ultrasonic wave and reception of the ultrasonic wave is performed using the electrical capacitance variation between the electrodes due to the vibration of the membranes, the stability of the voltage difference between the electrodes, the electrode spacing and the stability of membrane thickness are important factors to ensure stable device operation and reliability.

Patent document 1 discloses a CMUT array using a silicon substrate implanted by ions as the lower electrodes. However, in this construction, since the resistance of the silicon substrate is large, external drive power must be supplied from near the CMUT so as to suppress voltage drop between the electrodes inside the CMUT array, so if many CMUT are disposed in the form of an array, a large number of power supply points are required.

Patent documents 2, 3, 4, and Non-patent document 1, disclose a structure wherein a metal film is used for the lower electrodes of the CMUT array. In Patent documents 2, 3 and 4, a lower electrode having a thickness of from 250 nm to 500 nm using aluminum (Al), tungsten (W) or copper (Cu) is disclosed, and in Non-patent document 1, a lower electrode having a thickness of 150 nm using chromium as the material, is disclosed. However, even in the case of the lower electrode using a metal film shown above, the lower electrode must have a thickness of 500 nm or more to suppress voltage drop inside the CMUT array.

Thus, a step due to the lower electrodes of 500 nm or more due to splitting of the lower electrodes into component parts, unavoidably occurs. A construction is therefore adopted wherein the interconnection joined to the upper electrodes extends beyond this step, but when forming the metal film to become the interconnection, the coverage of the metal film in the step part decreases compared to the flat part, and the film thickness of the metal film in the step part therefore becomes less. As a result, this causes the resistance of the upper electrodes to increase. In addition, when the upper electrode pattern is fabricated, overetching must be performed to remove surplus metal film in the step part, and this leads to damage such as scraping away of the film underneath the metal film. This means that the films comprising the membrane of the CMUT cell become thinner, and causes a frequency characteristic variation of the CMUT cell. Further, the coverage of the insulation film insulating the lower electrodes and upper electrodes decreases in the step part compared to the flat part, dielectric strength also decreases due to thinning of the insulation film in the step part, and the reliability of the device is impaired.

In addition, since the construction is such that the interconnection joining the upper electrodes extends beyond the step part in the hollow parts, in the same way as the step part in the lower electrodes, this leads to a deterioration of device stability and reliability. In particular, when the membrane is vigorously vibrated to emit a strong ultrasonic wave, sufficient space must be allowed so that the membrane can move, hence the thickness of the hollow parts must be increased, and the effect of the step in the hollow parts cannot be ignored.

It is therefore an object of the invention to provide a structure which suppresses resistance increase of an upper electrode, damage to a membrane and decrease of dielectric strength between an upper electrode and lower electrode, and a method of manufacturing this structure.

These and other aims and novel characteristics will become clear from the description of the specification and the drawings appended thereto.

The essential points of the present application may be described as follows.

The ultrasonic transducer according to the invention includes (a) a first electrode, (b) a first insulation film covering said first electrode, (c) a hollow part overlapping the first electrode on the first insulation film, (d) a second insulation film covering the hollow part, (e) a second electrode overlapping the hollow part on the second insulation film, and (f) an interconnection joined to the second electrode, wherein the width of the interconnection overlapping the edge of the first electrode viewed from the upper surface, is thicker than the width of the interconnection not overlapping the edge of the first electrode viewed from the upper surface.

Alternatively, the ultrasonic transducer of the invention includes (a) a first electrode, (b) a first insulation film covering the first electrode, (c) a hollow part overlapping the first electrode on the first insulation film, (d) a second insulation film covering the hollow part, (e) a second electrode overlapping the hollow part on the second insulation film, and (f) an interconnection joined to the second electrode, wherein the step of the first electrode is moderated by the first electrode having a taper angle. The step of the first electrode is 500 nm or more. Further, the width of the interconnection overlapping the edge of the first electrode viewed from the upper surface, is thicker than the width of the interconnection not overlapping the edge of the first electrode viewed from the upper surface.

Alternatively, the ultrasonic transducer of the invention includes (a) a first electrode, (b) a first insulation film covering the first electrode, (c) a hollow part overlapping the first electrode on the first insulation film, (d) a second insulation film covering the hollow part, (e) a second electrode overlapping the hollow part on the second insulation film, and (f) an interconnection joined to the second electrode, wherein the step of the first electrode is moderated by forming sidewalls due to the insulation film on the edge of the first electrode. The step of the first electrode is 500 nm or more. Further, the width of the interconnection overlapping the edge of the first electrode viewed from the upper surface, is thicker than the width of the interconnection not overlapping the edge of the first electrode viewed from the upper surface.

Alternatively, the ultrasonic transducer of the invention includes (a) a first electrode, (b) a first insulation film covering the first electrode, (c) a hollow part overlapping the first electrode on the first insulation film, (d) a second insulation film covering the hollow part, (e) a second electrode overlapping the hollow part on the second insulation film, and (f) an interconnection joined to the second electrode, wherein one or both of the step of the first electrode and the step of the hollow part is moderated.

Alternatively, the ultrasonic transducer of the invention includes (a) a first electrode, (b) a first insulation film filled in the first electrode, (c) a second insulation film covering the first electrode and the first insulation film, (d) a hollow part overlapping the first electrode on the first insulation film, (e) a third insulation film covering the hollow part, (f) a second electrode overlapping the hollow part on the third insulation film, and (g) an interconnection joined to the second electrode, wherein the surfaces of the first electrode and first insulation film are flattened to the same height. The thickness of the first electrode is 500 nm or more.

Alternatively, the ultrasonic transducer of the invention includes (a) a first electrode, (b) a first insulation film covering the first electrode, (c) a hollow part overlapping the first electrode on the first insulation film, (d) a second insulation film filled in the hollow part, (e) a third insulation film covering the hollow part and the second insulation film, (f) a second electrode overlapping the hollow part on the third insulation film, and (g) an interconnection joined to the second electrode, wherein the surfaces of the hollow part and second insulation film are flattened to the same height.

The method of manufacturing the ultrasonic transducer according to the invention includes the steps of (a) patterning a conductive film to form a first electrode, (b) forming a first insulation film covering the first electrode, (c) flattening the first insulation film to expose the surface of the first electrode, (d) forming a second insulation film covering the first electrode and the first insulation film, (e) forming a sacrifice layer overlapping the first electrode on the second insulation film, (f) forming a third insulation film covering the sacrifice layer and the second insulation film, (g) forming a second electrode overlapping the sacrifice layer on the third insulation film, (h) forming an interconnection joined to the second electrode, (i) forming a fourth insulation film covering the second electrode, the interconnection and the third insulation film, (j) forming an opening penetrating the third insulation film and the fourth insulation film to reach the sacrifice layer, (k) forming a hollow part by removing the sacrifice layer using the opening, and (l) filling the opening by a fifth insulation film to seal the hollow part, wherein the thickness of the first electrode is 500 nm or more.

Alternatively, the method of manufacturing an ultrasonic transducer according to the invention includes the steps of (a) patterning a conductive film to form a first electrode, (b) forming a first insulation film covering the first electrode, (c) forming a sacrifice layer to overlap the first electrode on the first insulation film, (d) forming a second insulation film covering the sacrifice layer and the first insulation film, (e) flattening the second insulation film and exposing the surface of the sacrifice layer, (f) forming a third insulation film covering the second insulation film and the sacrifice layer, (g) forming a second electrode overlapping the sacrifice layer on the third insulation film, (h) forming an interconnection joined to the second electrode, (i) forming a fourth insulation film covering the second electrode, the interconnection and the third insulation film, (j) a step for forming an opening penetrating the third insulation film and the fourth insulation film to reach the sacrifice layer, (k) forming a hollow part by removing the sacrifice layer using the opening, and (l) filling the opening by a fifth insulation film to seal the hollow part.

Further, the method of manufacturing an ultrasonic transducer according to the invention includes the steps of (a) patterning a conductive film to form a first electrode, (b) forming a first insulation film covering the first electrode, (c) forming a sacrifice layer to overlap the first electrode on the first insulation film, (d) forming a second insulation film covering the sacrifice layer, (e) forming a second electrode overlapping the sacrifice layer on the second insulation film, (f) forming an interconnection joined to the second electrode, (g) forming a third insulation film covering the second electrode, the interconnection and the second insulation film, (h) forming an opening penetrating the second insulation film and third insulation film to reach the sacrifice layer, (i) forming a hollow part by removing the sacrifice layer using the opening, and (j) filling the opening by a fourth insulation film to seal the hollow part, wherein in the step for forming the interconnection, the width of the interconnection overlapping the edge of the first electrode viewed from the upper surface, is thicker than the width of the interconnection not overlapping the edge of the first electrode viewed from the upper surface.

Alternatively, the method of manufacturing an ultrasonic transducer according to the invention includes the steps of (a) patterning a conductive film to form a first electrode, (b) forming a first insulation film covering the first electrode, (c) forming a sacrifice layer to overlap the first electrode on the first insulation film, (d) forming a second insulation film covering the sacrifice layer, (e) forming a second electrode overlapping the sacrifice layer on the second insulation film, (f) forming an interconnection joined to the second electrode, (g) forming a third insulation film covering the second electrode, the interconnection and the second insulation film, (h) forming an opening penetrating the second insulation film and third insulation film to reach the sacrifice layer, (i) forming a hollow part by removing the sacrifice layer using the opening, and (j) filling the opening by a fourth insulation film to seal the hollow part, wherein in the step for forming the first electrode, the edge of the first electrode is formed to have a taper angle. The thickness of the first electrode is 500 nm or more. Further, in the step for forming the interconnection, the width of the interconnection overlapping the edge of the first electrode viewed from the upper surface, is thicker than the width of the interconnection not overlapping the edge of the first electrode viewed from the upper surface.

Alternatively, the method of manufacturing an ultrasonic transducer according to the invention includes the steps of (a) patterning a conductive film to form a first electrode, (b) forming a first insulation film covering the first electrode, (c) forming sidewalls on the edge of the first electrode by etching the first insulation film, (d) forming a second insulation film covering the first electrode and the sidewalls, (e) forming a sacrifice layer overlapping the first electrode on the second insulation film, (f) forming a third insulation film covering the sacrifice layer and the second insulation film, (g) forming plural second electrodes overlapping the sacrifice layer on the third insulation film, (h) forming an interconnection joined to the second electrode, (i) forming a fourth insulation film covering the second electrode, the interconnection and the third insulation film, (j) forming an opening penetrating the third insulation film and fourth insulation film to reach the sacrifice layer, (k) forming a hollow part by removing the sacrifice layer using the opening, and (l) filling the opening by a fifth insulation film to seal the hollow part. The thickness of the first electrode is 500 nm or more. Further, in the step for forming the interconnection, the width of the interconnection overlapping the sidewalls viewed from the upper surface, is thicker than the width of the interconnection not overlapping the sidewall viewed from the upper surface.

Alternatively, the method of manufacturing an ultrasonic transducer according to the invention includes the steps of (a) patterning a first insulation film to form a first depression, (b) filling a first conductive film in the first depression, (c) flattening the first conductive film until the surface of the first insulation film is exposed, and forming a first electrode embedded in the first insulation film, (d) forming a second insulation film covering the first electrode and first insulation film, (e) forming a sacrifice layer to overlap the first electrode on the second insulation film, (f) forming a third insulation film covering the sacrifice layer and the second insulation film, (g) forming a second electrode overlapping the sacrifice layer on a third insulation film, (h) forming an interconnection joined to the second electrode, (i) forming a fourth insulation film covering the second electrode, the interconnection and the third insulation film, (j) forming an opening penetrating the third insulation film and fourth insulation film to reach the sacrifice layer, (k) forming a hollow part by removing the sacrifice layer using the opening, and (l) filling the opening by a fifth insulation film to seal the hollow part. The depth of the depression is 500 nm or more.

Alternatively, the method of manufacturing an ultrasonic transducer according to the invention includes the steps of (a)

patterning a conductive film to form a first electrode, (b) forming a first insulation film covering the first electrode, (c) forming a second insulation film covering the first insulation film, (d) forming plural depressions reaching the first insulation film in the second insulation film, (e) filling the film to become a sacrifice layer in the first depression, (f) flattening the film to become the sacrifice layer until the surface of the second insulation film is exposed, and forming the sacrifice layer filled in the second insulation film, (g) forming a third insulation film covering the sacrifice layer and second insulation film, (h) forming a second electrode overlapping the sacrifice layer on the third insulation film, (i) forming an interconnection joined to the second electrode, (j) forming a fourth insulation film covering the second electrode, the interconnection and the third insulation film, (k) forming an opening penetrating the third insulation film and fourth insulation film to reach the sacrifice layer, (l) forming a hollow part by removing the sacrifice layer using the opening, and (m) filling the opening by a fifth insulation film to seal the hollow part.

In the invention disclosed in this application, the advantages obtained from the essential features thereof may be summarized as follows.

By moderating the step of the lower electrode and hollow part, a decrease in film thickness of the upper electrode in the step part of the lower electrode and hollow part can be reduced, so a resistance increase can be suppressed. Further, damage to a membrane due to upper electrode machining can be reduced. Still further, there is provided a structure which suppresses decrease of dielectric strength between the upper and lower electrodes, and a method of manufacturing the same.

BRIEF DESCRIPTION OF THE DRAWINGS

FIG. 34A is a cross-sectional view through a line A-A' in FIG. 1, and FIG. 34B is a cross-sectional view through a line B-B' in FIG. 1.

FIG. 42B is a cross-sectional view through a line B-B' in FIG. 42.

DETAILED DESCRIPTION OF THE PREFERRED EMBODIMENTS

In the following embodiments, when required for better understanding, the description is split into plural sections or aspects, but unless otherwise specified these are not completely unrelated, and any one thereof may be related to a modification, detail or addition to a part or whole of another.

Also, in the following embodiments, when extending to the case of plural elements (including numbers, numerals, amounts and ranges), unless otherwise specified or when there is a clear limitation to a particular number in principle, the invention is not to be construed as being limited to any particular number, and may apply to more of or less than that particular number.

Further, in the following detailed description of the preferred embodiments, it will be understood that the invention is not to be construed as being limited to component elements (including steps, etc.) unless otherwise specified or considered to be clearly essential to do so.

Likewise, in the following embodiments, when extending the description to shapes and positions of component elements or the like, unless otherwise specified or when it would be clearly impossible in principle, the description shall be construed to effectively include approximate or similar shapes and the like.

This applies also to the aforesaid numerals and ranges.

It should be noted that, even in the case of plan drawings, shading may be used to facilitate understanding.

In the following embodiments, with the aim of suppressing resistance increase of the upper electrode, reducing damage to the membrane and suppressing decrease of dielectric strength between the upper and lower electrodes, the width of the interconnection joining the upper electrodes in the step part is increased and the step part is moderated.

First Embodiment

Figure 3:
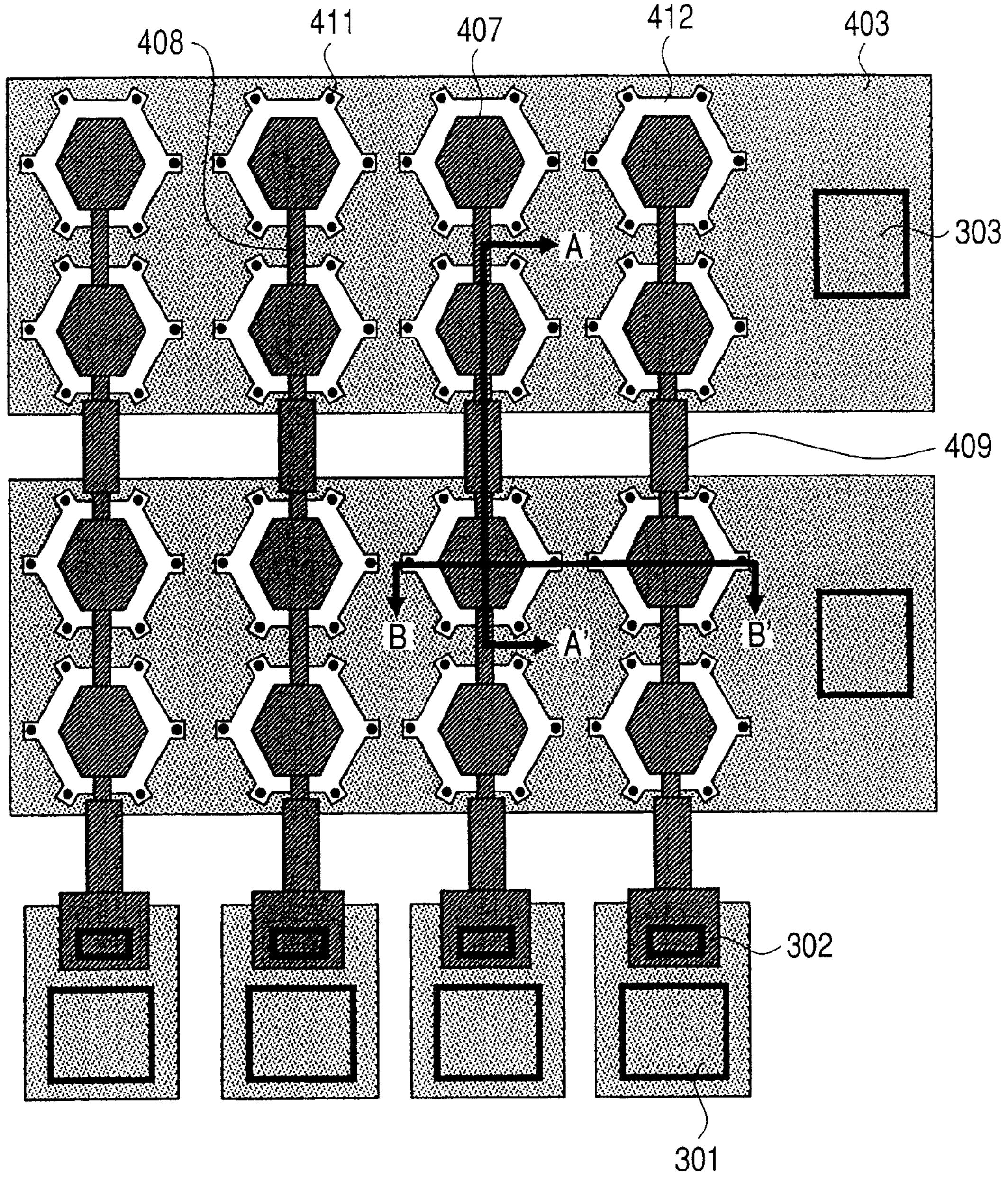
FIG. 3 is an upper plan view showing an ultrasonic transducer according to a first embodiment of the invention.

FIG. 3 is an upper plan view of a CMUT array of this first embodiment.

Figure 2A:
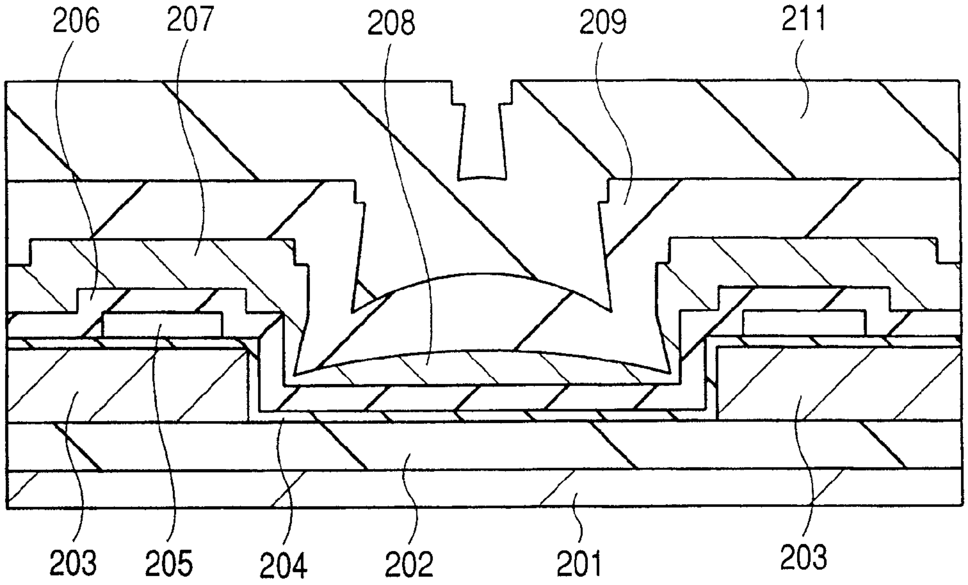
FIG. 2A is a cross-sectional view through a line A-A' in FIG. 1, FIG. 3.
Figure 2B:
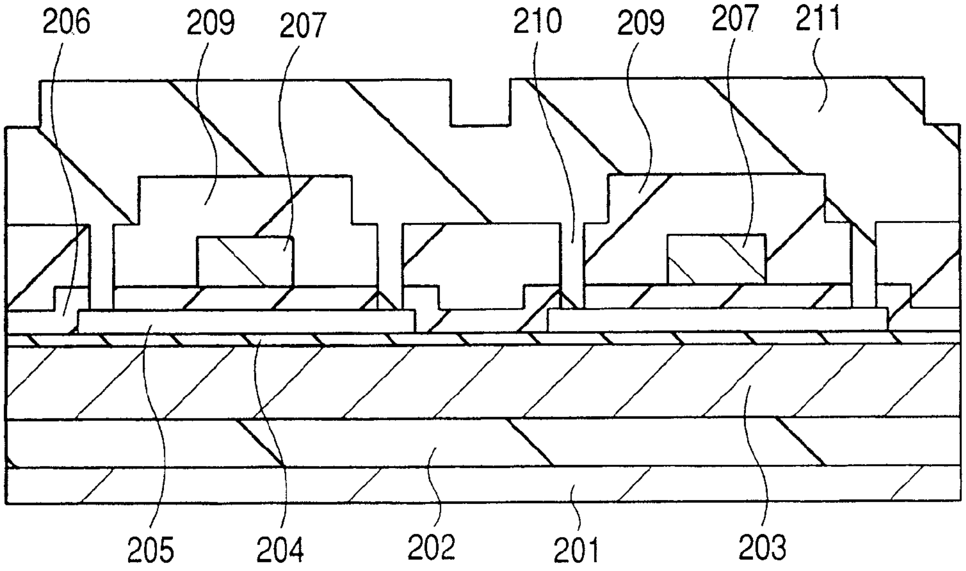
FIG. 2B is a cross-sectional view through a line B-B' in FIG. 1, FIG. 3.

403 are lower electrodes, 412 is a hollow part, 407 are upper electrodes, 408 are interconnections joining the upper electrodes, and 411 are wet etching holes for forming the hollow parts. The wet etching holes 411 are connected to the hollow parts 412. 301 are pad openings provided in the same layer as the lower electrodes to supply power to the upper electrodes 407, and 302 are plugs connecting the pads to the interconnections 408. In other words, the interconnections 408 connecting the upper electrodes to the pads, are connected via the plugs 302. 303 are pad openings to supply power to the lower electrodes 403. An insulation film is formed between the upper electrodes 407, interconnections 408 and lower electrodes 403 so as to cover the lower electrodes 403 and hollow parts 412, but it is not shown in order to show the hollow part 412 and lower electrodes 403. Cross-sections A-A', B-B' in FIG. 3 are respectively identical to FIGS. 2A and 2B.

The essential feature of the first embodiment, as shown by 409 in FIG. 3, is that the width of the interconnections 408 joining the upper electrodes in the step part of the lower electrodes 403, is made larger than the interconnection width outside the step part. By adopting this construction, in the step part when the conductive film to become the upper electrodes 407 and interconnections 408 is deposited, resistance increase is suppressed even if the coverage is lower than in the flat part and the film thickness is small. In other words, in the step part, even if the film thickness of the interconnection 409 is small, resistance increase of the interconnections 409 in the step part is suppressed by making the width of the interconnections 409 thicker. The width of the interconnections 409 may be, for example, about twice the width of the interconnections 408. Specifically, if the width of the interconnections 408 is for example about 3 μm, the width of the interconnections 409 is about 6 μm.

Moreover, by making the width of the interconnections thicker only in the step part, the overlapping part of the interconnections 408 joined to the upper electrodes 407 and lower electrodes 403 is not much increased, so increase of parasitic capacitance between the lower electrodes 403 and interconnections 408 is also suppressed. In FIG. 3, the interconnections are thickened across the whole of the distance between the opposite lower electrodes 403, but it will be understood that they may be thickened only in the step part. In particular, when the thickness of the lower electrodes 403 is set to 500 nm or more to reduce the resistance of the lower electrodes 403, the step of the lower electrodes 403 is then 500 nm or more. In this case, it is obvious that, in the step part when the conductive film to become the upper electrodes 407 and interconnections 408 is deposited, the coverage is lower than in the flat part, and the film thickness is less. Therefore, this construction wherein the width of the interconnections 409 formed in the step part of the lower electrodes 403 is made larger than the width of the interconnections 408 formed outside the step part, as shown in the first embodiment, is particularly effective in the case where the step of the lower electrodes 403 is 500 nm or more.

Next, a method of manufacturing the CMUT array of the first embodiment, will be described referring to the drawings. (a) in FIG. 4-FIG. 11 shows a cross section through A-A' in FIG. 3, and (b) in FIG. 4-FIG. 11 shows a cross-section through B-B' in FIG. 3.

Figure 4A:
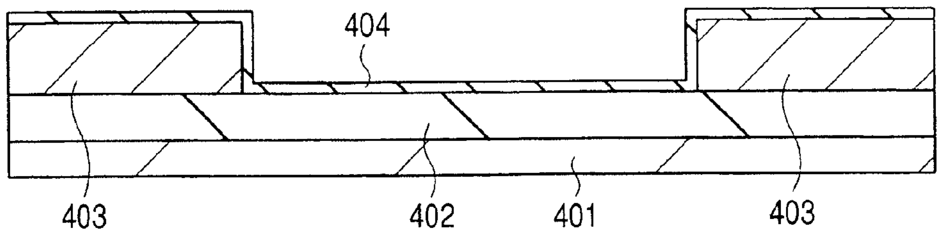
FIG. 4A is a cross-sectional view showing an ultrasonic transducer manufacturing step viewed along a line A-A' in FIG. 3.
Figure 4B:
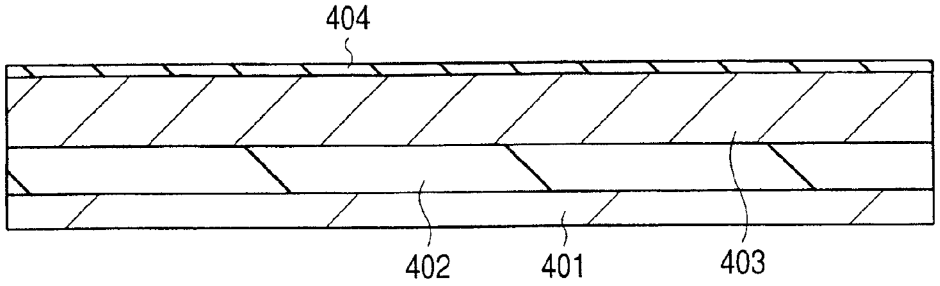
FIG. 4B is a cross-sectional view showing an ultrasonic transducer manufacturing step viewed along a line B-B' in FIG. 3.

First, as shown in FIGS. 4A and 4B, an insulation film 402 of silicon oxide is deposited by plasma CVD (Chemical Vapor Deposition) on a semiconductor substrate 401, and a titanium nitride film, aluminum alloy film and titanium nitride film are subsequently deposited thereon respectively to thicknesses of 100 nm, 600 nm, 100 nm by sputtering. Here, an integrated circuit can also be formed between the semiconductor substrate 401 and insulation film 402 to perform signal processing or the like. For example, a MISFET (Metal Insulator Semiconductor Field Effect Transistor) is formed on the semiconductor substrate 401, and a multilayer interconnection is formed on this MISFET. An insulation film 402 is then formed on the multi-layer interconnection. These integrated circuits are formed using ordinary semiconductor manufacturing techniques.

Subsequently, the lower electrodes 403 are formed by patterning by photolithography and dry etching. The insulation film 404 of silicon oxide is deposited to 100 nm by plasma CVD on these lower electrodes 403.

Figure 5A:
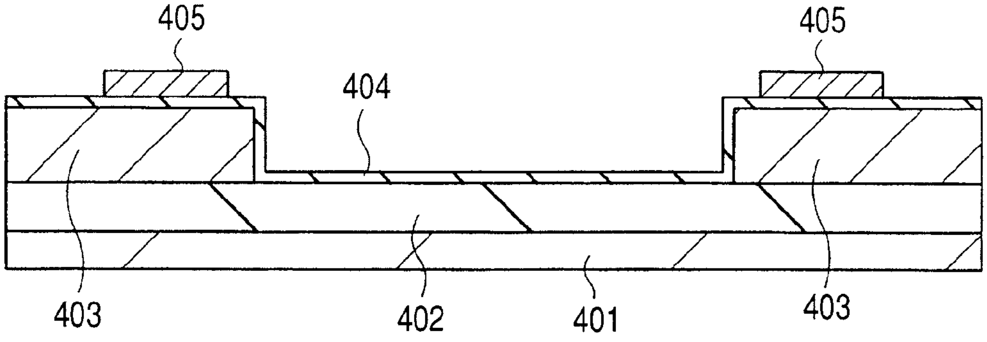
FIG. 5A is a cross-sectional view showing an ultrasonic transducer manufacturing step following FIG. 4A.
Figure 5B:
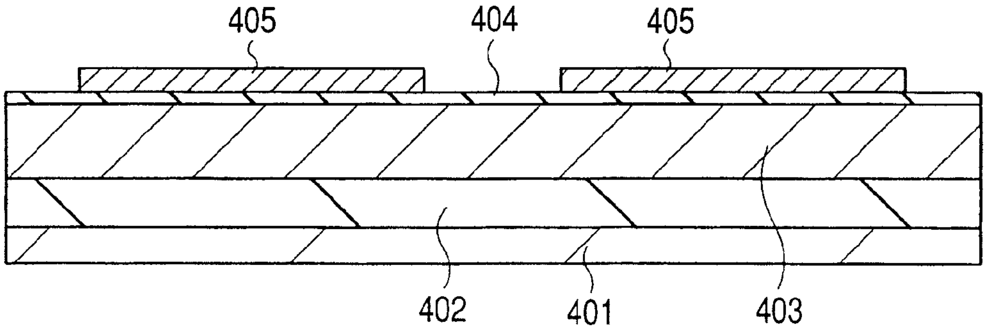
FIG. 5B is a cross-sectional view showing an ultrasonic transducer manufacturing step following FIG. 4B.

Next, a polycrystalline silicon film is deposited to 200 nm by plasma CVD on the upper surface of the insulation film 404. The polycrystalline silicon film is left on the lower electrodes 403 after photolithography and dry etching. This remaining part becomes a sacrifice layer 405, and becomes the hollow part in a subsequent step (FIGS. 5A and 5B).

Figure 6A:
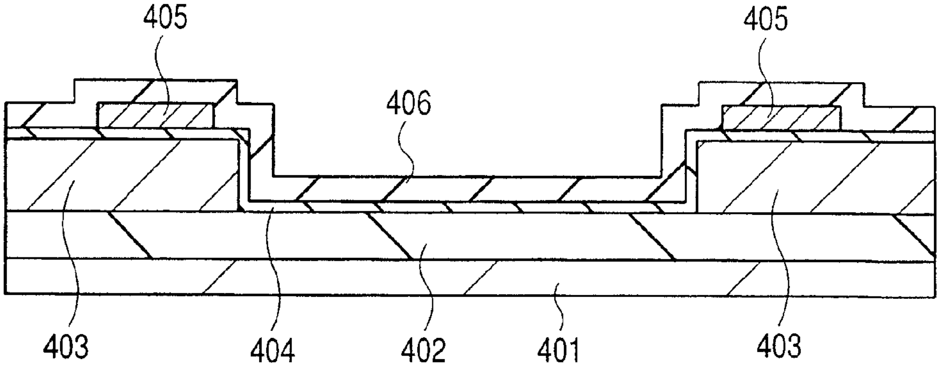
FIG. 6A is a cross-sectional view showing an ultrasonic transducer manufacturing step following FIG. 5A.
Figure 6B:
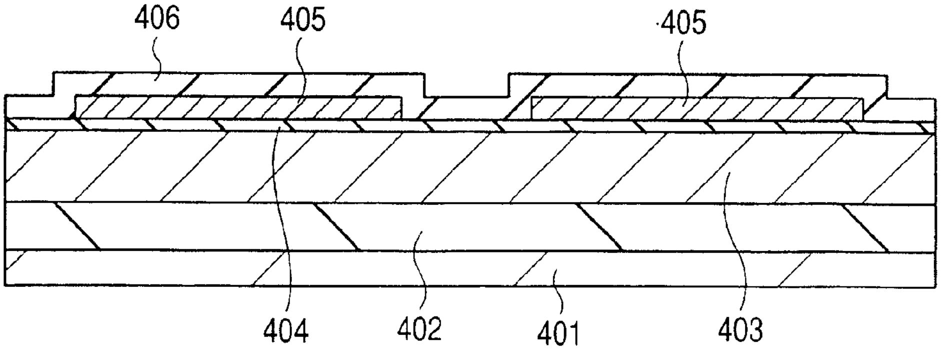
FIG. 6B is a cross-sectional view showing an ultrasonic transducer manufacturing step following FIG. 5B.

Next, an insulation film 406 of silicon oxide is deposited to 200 nm by plasma CVD to cover the sacrifice layer 405 and insulation film 404 (FIGS. 6A and 6B).

Figure 7A:
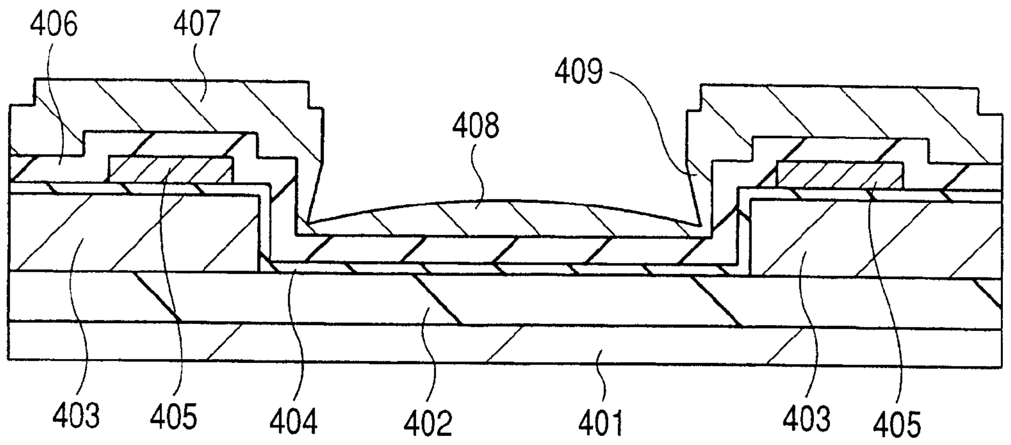
FIG. 7A is a cross-sectional view showing an ultrasonic transducer manufacturing step following FIG. 6A.
Figure 7B:
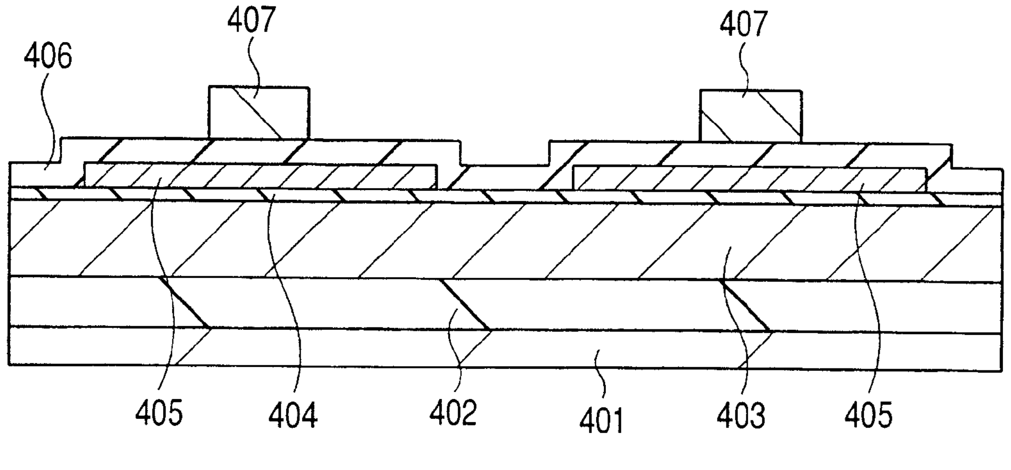
FIG. 7B is a cross-sectional view showing an ultrasonic transducer manufacturing step following FIG. 6B.

Next, a titanium nitride film, and aluminum alloy film and titanium nitride film are respectively deposited to 50 nm, 300 nm, 50 nm by sputtering to form the upper electrodes 407 and the interconnections 408 joining the upper electrodes 407 of the CMUT. The upper electrodes 407 and interconnections 408 are formed by photolithography and dry etching (FIGS. 7A and 7B). At this time, by forming the interconnections 409 in the step part of the lower electrodes 403 thickly using a photolithography mask, only the interconnection width in the step part may be increased without the need for additional steps.

Figure 8A:
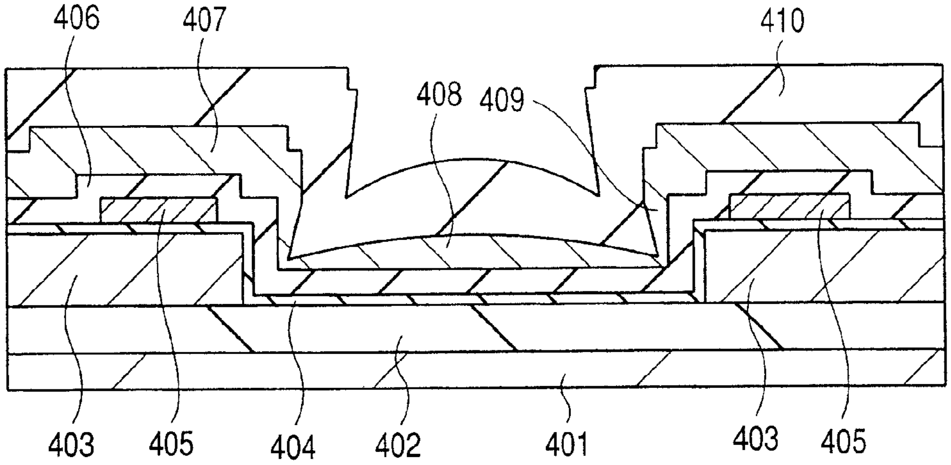
FIG. 8A is a cross-sectional view showing an ultrasonic transducer manufacturing step following FIG. 7A.
Figure 8B:
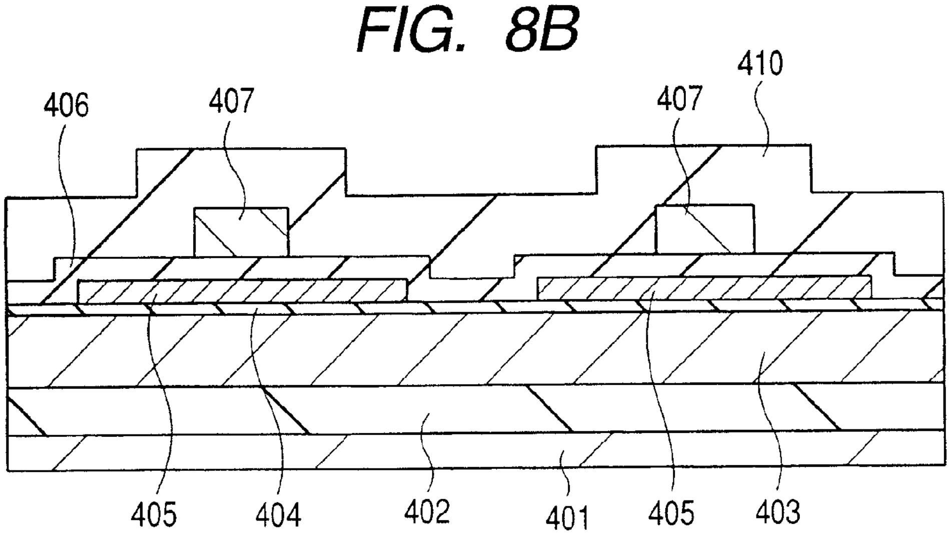
FIG. 8B is a cross-sectional view showing an ultrasonic transducer manufacturing step following FIG. 7B.
Figure 9A:
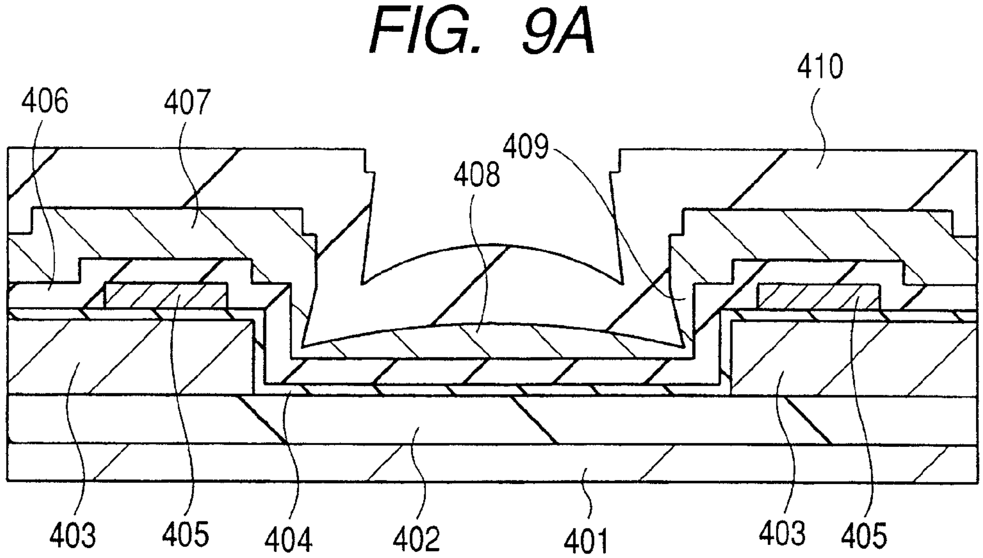
FIG. 9A is a cross-sectional view showing an ultrasonic transducer manufacturing step following FIG. 8A.
Figure 9B:
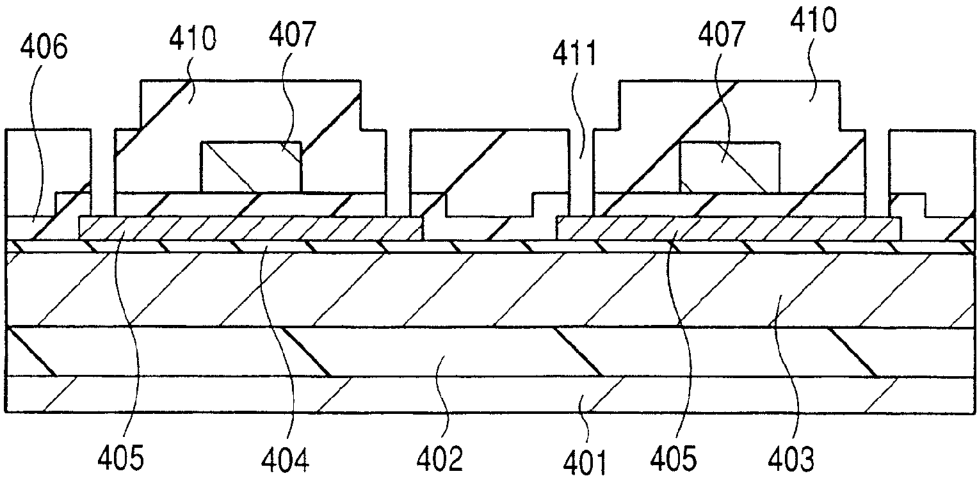
FIG. 9B is a cross-sectional view showing an ultrasonic transducer manufacturing step following FIG. 8B.

Next, an insulation film 410 of silicon nitride is deposited to 500 nm to cover the insulation film 406, upper electrodes 407 and interconnections 408 by plasma CVD (FIGS. 8A and 8B). Next, the wet etching holes 411 which reach the sacrifice layer 405 are formed by photolithography and dry etching on the insulation films 410 and 406 (FIGS. 9A and 9B).

Figure 10A:
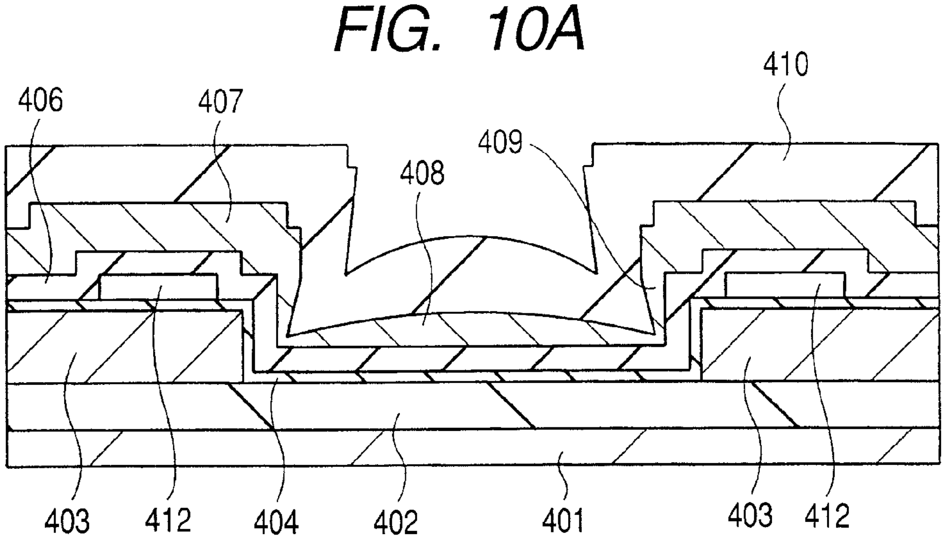
FIG. 10A is a cross-sectional view showing an ultrasonic transducer manufacturing step following FIG. 9A.
Figure 10B:
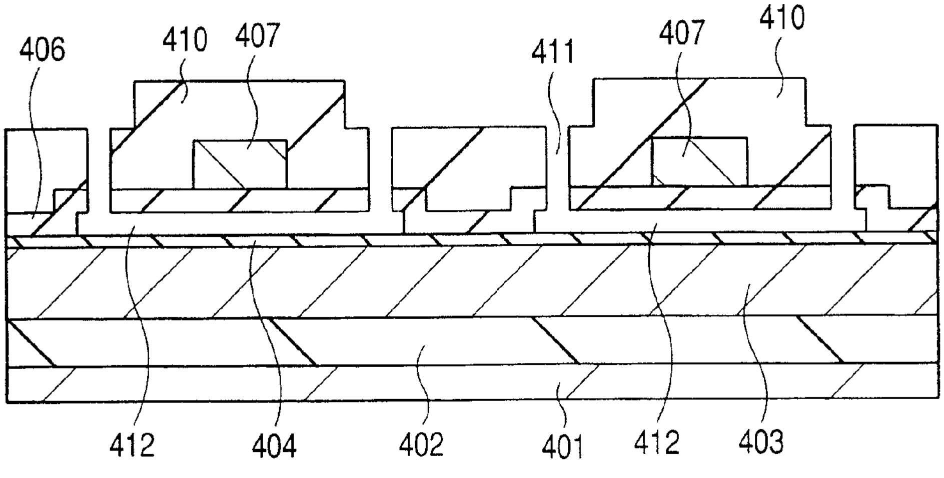
FIG. 10B is a cross-sectional view showing an ultrasonic transducer manufacturing step following FIG. 9B.

Next, the hollow parts 412 are formed by wet etching of the sacrifice layer 405 with potassium hydroxide via the wet etching holes 411 (FIGS. 10A and 10B).

Figure 11A:
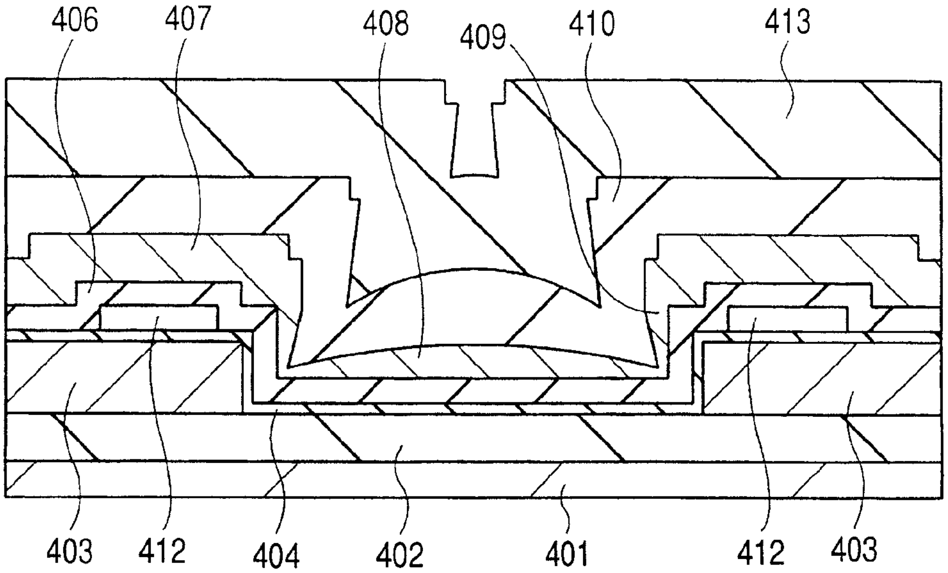
FIG. 11A is a cross-sectional view showing an ultrasonic transducer manufacturing step following FIG. 10A.
Figure 11B:
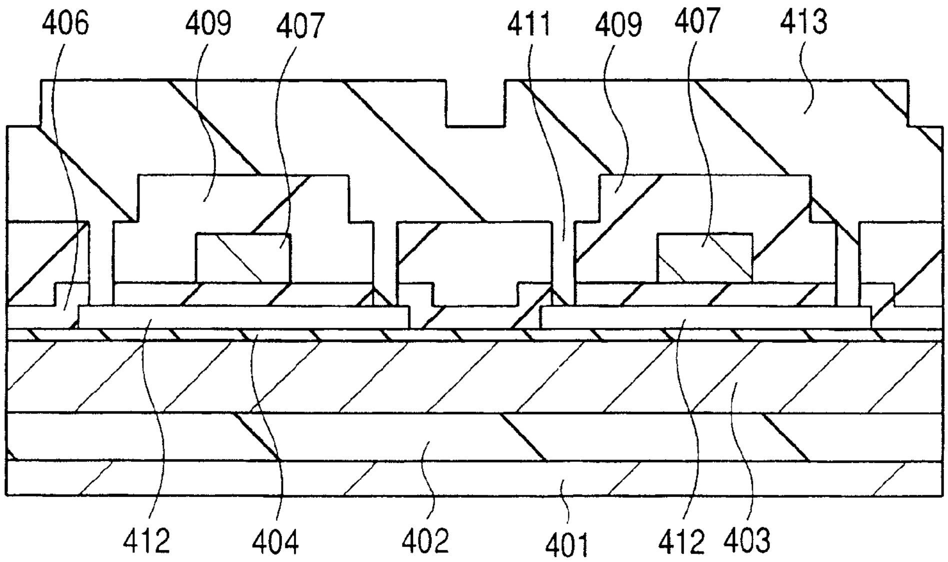
FIG. 11B is a cross-sectional view showing an ultrasonic transducer manufacturing step following FIG. 10B.

Next, an insulation film 413 of silicon nitride is deposited to 800 nm by plasma CVD to fill the wet etching holes 411 (FIGS. 11A and 11B). In this way, the CMUT array of the first embodiment is formed.

As described above, in the CMUT array of the first embodiment, although the coverage in the step part when the conductive film which becomes the upper electrodes 407 and interconnections 408 is deposited, is less than in the flat part and the film thickness is small, resistance increase of the interconnection is suppressed by making the width of the interconnections 408 joining the upper electrodes in the step part of the lower electrodes 403, larger than that of the interconnections outside the step part. Further, by increasing the width of only the step part, there is no significant increase of the overlapping part of the interconnections 408 joining the upper electrodes to the lower electrodes, so increase of parasitic capacitance between the lower electrodes and interconnections is suppressed.

Figure 12:
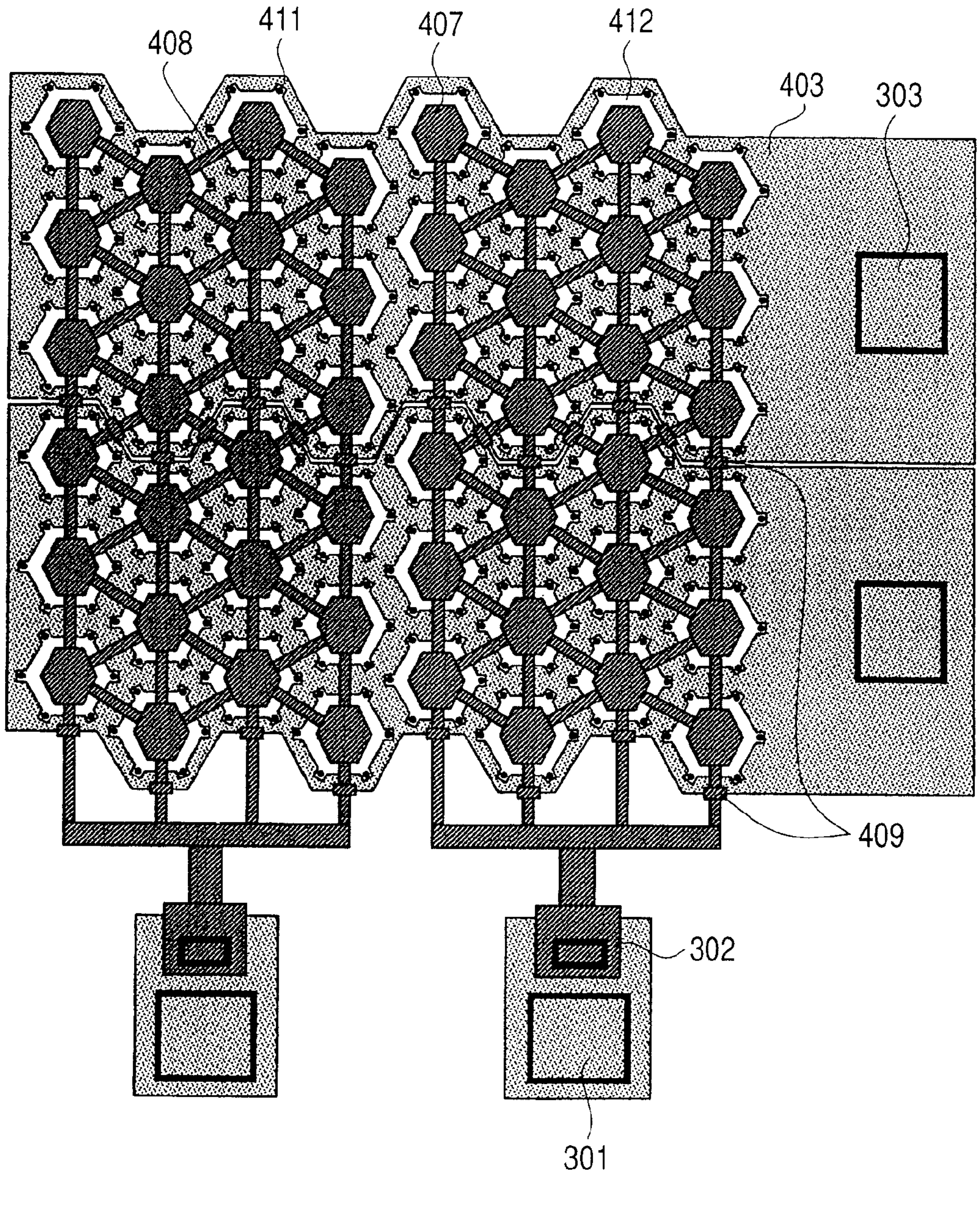
FIG. 12 is an upper plan view showing an ultrasonic transducer according to the first embodiment of the invention.

In the CMUT array shown in FIG. 3, two rows and one column of CMUT cells are disposed at the crosspoints between the lower electrodes 403 and upper electrodes 407, but the situation is identical when there are plural rows and plural columns of CMUT cells so disposed. FIG. 12 is an upper plan view when there are three rows and four columns of CMUT cells. In this case also, an identical effect can be obtained by increasing the width of the interconnections 409 joining the upper electrodes 407 in the step part of the lower electrodes 403. Further, in FIG. 12, the respective interconnections 409 were made thicker in the step part of the lower electrodes 403, but for any interconnection joining the same upper electrodes, by joining only the step parts of the lower electrodes 403 together as shown in FIG. 13, although parasitic capacitance of the lower electrodes 403 and interconnections 409 increases, an identical effect can be obtained as that of making the respective interconnections thicker.

Figure 13:
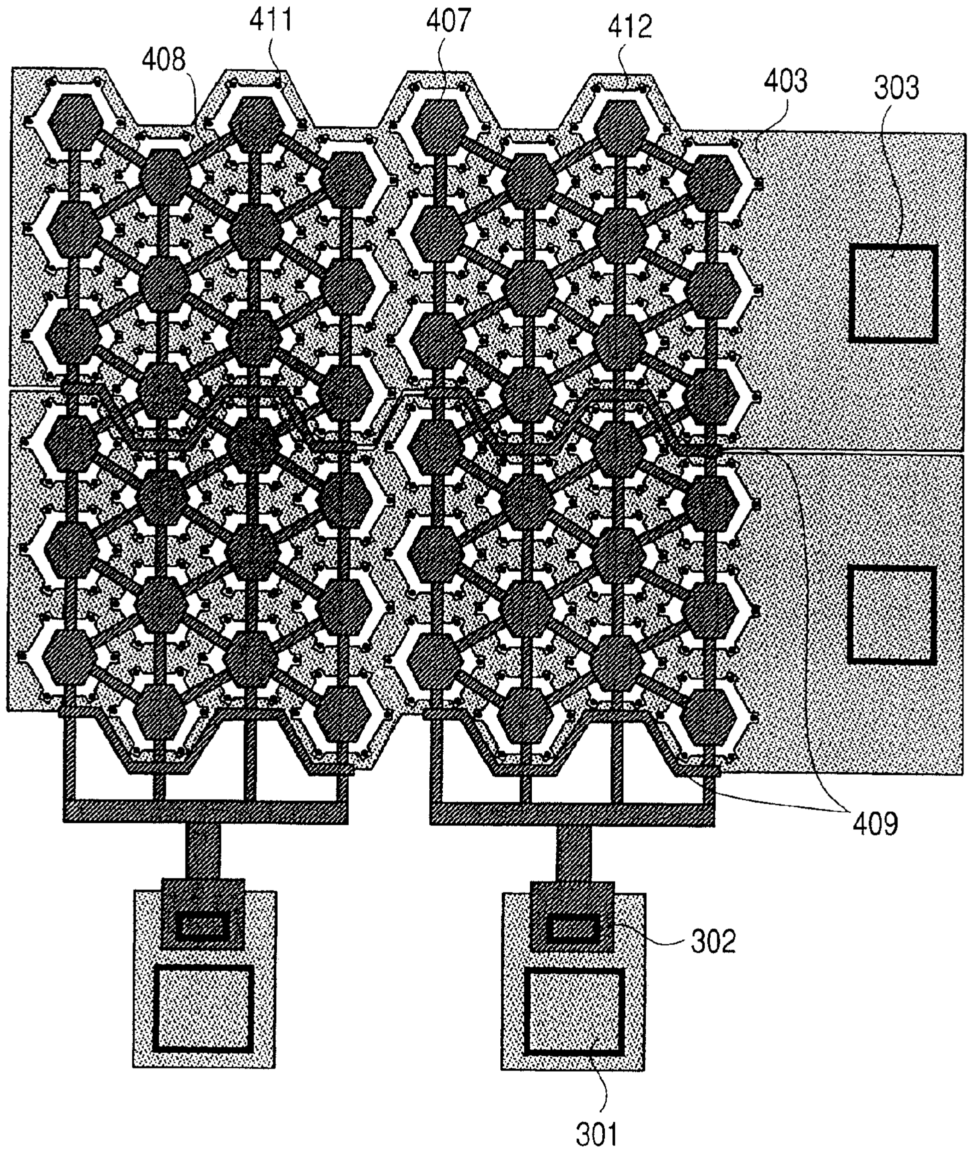
FIG. 13 is an upper plan view showing an ultrasonic transducer according to the first embodiment of the invention.

In FIG. 3, FIG. 12, FIG. 13, the CMUT cells are hexagonal, but the invention is not limited to this shape, and they may for example be circular.

In the above description, only one combination of the materials forming the CMUT cells of the first embodiment was shown. Also, the material of the sacrifice layer preferably retains wet etching selectivity with the material surrounding the sacrifice layer. Therefore, in addition to a polycrystalline silicon film, it may be an SOG (Spin-on Glass) or metal film.

Second Embodiment

In the CMUT array of the second embodiment, the edges of the lower electrodes are tapered to moderate the step of the lower electrodes.

Figure 14:
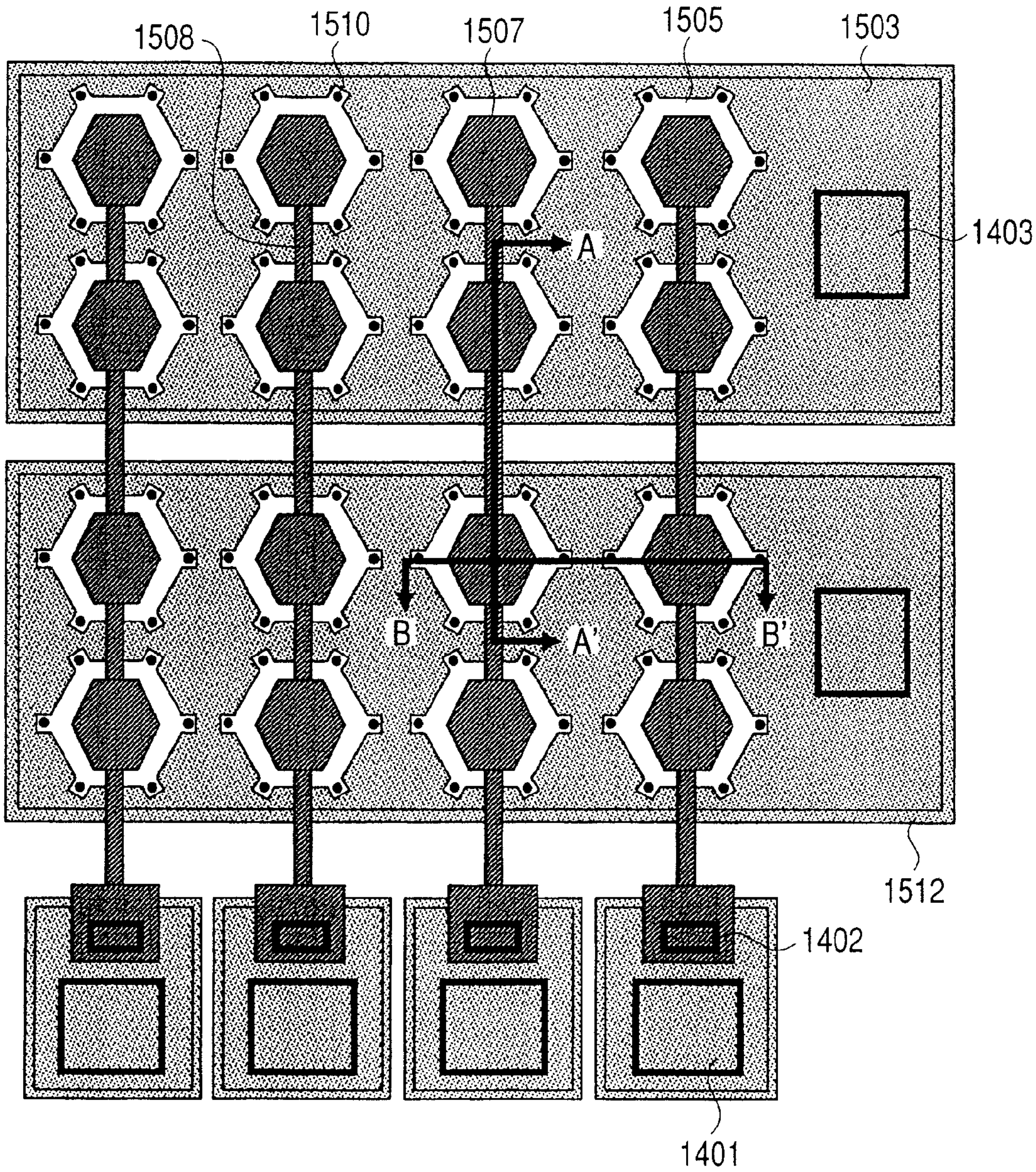
FIG. 14 is an upper plan view showing an ultrasonic transducer according to a second embodiment of the invention.

FIG. 14 is an upper plan view of the CMUT array of the second embodiment. 1503 are lower electrodes, 1505 are hollow parts, 1508 are interconnections joining upper electrodes 1507, and 1501 are wet etching holes for forming hollow parts 1505. The wet etching holes 1510 are connected to the hollow parts 1505. 1401 are pad openings to pads provided in the same layer as the lower electrodes 1503 to supply power to the upper electrodes 1507, and 1402 are plugs joining the pads to the interconnections 1508. In other words, the interconnections 1508 joining the upper electrodes 1507, are connected to the pads via the plugs 1402. 1403 are pad openings to supply power to the lower electrodes 1503. Tapered parts 1512 are formed in the edge of the lower electrodes 1503. An insulation film is formed between the upper electrodes 1507 and interconnections 1508, and the lower electrodes 1503, so as to cover the hollow parts 1505, the tapered parts 1512 and the lower electrodes 1503, but it is not shown in order to show the hollow parts 1505, lower electrodes 1503 and tapered parts 1512.

Figure 15A:
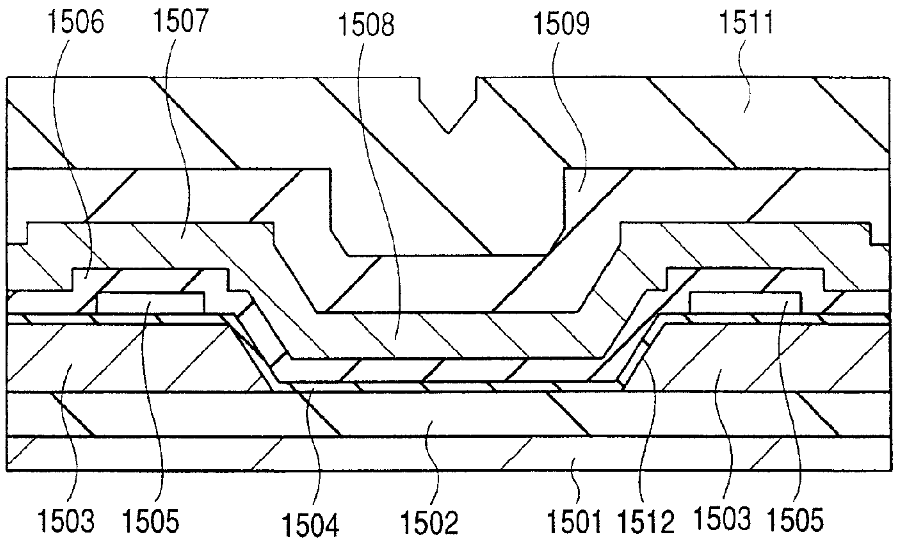
FIG. 15A is a cross-sectional view through a line A-A' in FIG. 14.
Figure 15B:
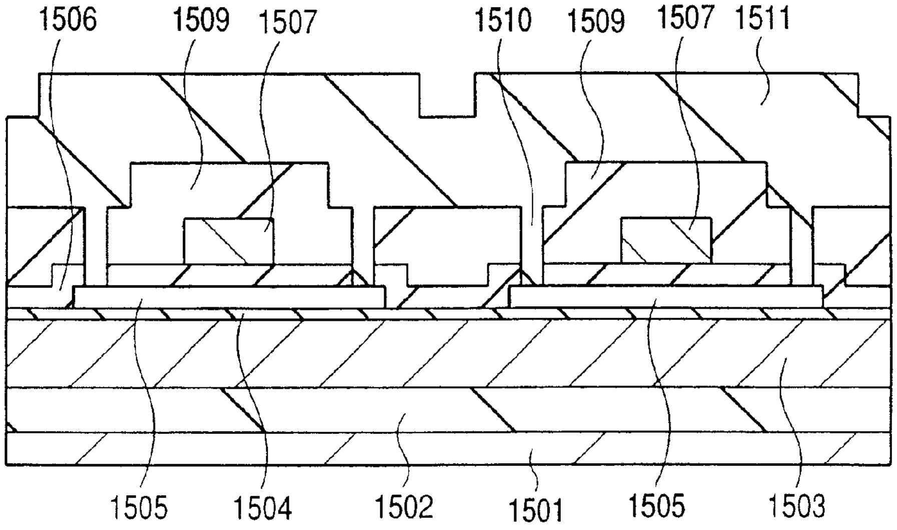
FIG. 15B is a cross-sectional view through a line B-B' in FIG. 14

FIG. 15A shows a cross-section through A-A in FIG. 14, and FIG. 15B shows a cross-section through B-B' in FIG. 14. As shown in FIG. 15A and FIG. 15B, the lower electrodes 1503 are formed on the insulation film 1502 formed on the semiconductor substrate 1501. The sidewalls of the lower electrodes 1503 are formed in the tapered shape 1512. The hollow parts 1505 are formed above the lower electrodes 1503 via an insulation film 1504.

An insulation film 1506 is formed to surround the hollow parts 1505, the upper electrodes 1507 and interconnections 1508 joining the upper electrodes 1507 being formed above the insulation film 1506.

An insulation film 1509 and insulation film 1511 are formed above the upper electrodes 1507 and the interconnection 1508. Wet etching holes 1510 penetrating these films are also formed in the insulation film 1506 and insulation film 1509. These wet etching holes 1510 are formed to form the hollow parts 1505, and after forming the hollow parts 1505, they are filled by the insulation film 1511.

The essential feature of the second embodiment, as shown in FIG. 14 and FIGS. 15A and 15B, is that the edges of the lower electrodes 1503 are tapered.

By adopting this construction, the step of the lower electrodes 1503 is moderated, the coverage in the step part of the interconnections 1508 increases, so resistance increase and interconnection breaks are suppressed. In particular, when the step of the lower electrodes 1503 is 500 nm or more, the coverage in the step part decreases further, so if the step of the lower electrodes 1503 is 500 nm or more, it is effective to provide the tapered parts 1512 in the step part.

Further, when the upper electrodes 1507 and interconnections 1508 are patterned, the local step of the lower electrodes 1503 is moderated, so the overetching amount due to removing interconnection material in the step part can also be reduced. When the overetching amount is large, the membrane film thickness of the CMUT cell varies due to etching of the insulation film 1506 which is the underlayer of the upper electrodes 1507, and this leads to operating characteristic fluctuations. However, in the construction shown in the second embodiment, by tapering the sidewalls of the lower electrodes, the local step is moderated, the overetching amount is reduced, the etching amount of the insulation film 1506 is reduced, and operating stability is enhanced.

In particular, in the insulation films 1504, 1506 which insulate the lower electrodes 1503 and upper electrodes 1507, due to tapering the sidewalls of the lower electrodes, decrease of film thickness in the lower electrode step part is small, decrease of dielectric strength is suppressed, and reliability of the device is enhanced.

In addition, if the width of only the interconnections overlapping the tapered parts 1512 of the sidewalls of the lower electrodes 1503 is made larger as in the first embodiment, resistance increase and interconnection breaks are further suppressed.

The method of manufacturing the CMUT array according to the second embodiment is essentially identical to that of the first embodiment, but is different in that when the lower electrodes 1503 are patterned, the sidewalls are tapered.

To give the sidewalls of the lower electrodes 1503 a taper angle, when the lower electrodes 1503 are patterned by dry etching, a gas which tends to deposit such as a hydrocarbon or the like is mixed with the gas used to etch the metal material to become the lower electrodes 1503. For example, when the lower electrode 1503 is a laminated film comprising a titanium nitride film, aluminum alloy film and titanium nitride film as in the first embodiment, patterning is usually performed using an etching gas containing chlorine, and if a gas such as methane or difluoromethane is mixed therewith, a tapered shape can be patterned with good control. Also, a tapered shape can be obtained in the same way by patterning the lower electrodes 1503 by wet etching.

The CMUT array shown in FIG. 14 consists of two rows and one column of CMUT cells disposed at the crosspoints of the lower electrodes 1503 and upper electrodes 1507, but even if there are plural rows and plural columns of CMUT cells as in the first embodiment, an identical effect can be obtained by patterning the lower electrodes to be tapered.

Also, in FIG. 14, the CMUT cells are hexagonal, but the invention is not limited to this shape, and they may be for example circular.

Among the materials forming the CMUT cells shown in the second embodiment, only one combination thereof was shown. Also, the material of the sacrifice layer preferably retains wet etching selectivity with the materials surrounding the sacrifice layer. Therefore, in addition to a polycrystalline silicon film, it may be an SOG film or metal film.

Third Embodiment

In the CMUT array of the third embodiment, sidewalls are provided on the edges of the lower electrodes to moderate the step of the lower electrodes.

Figure 16:
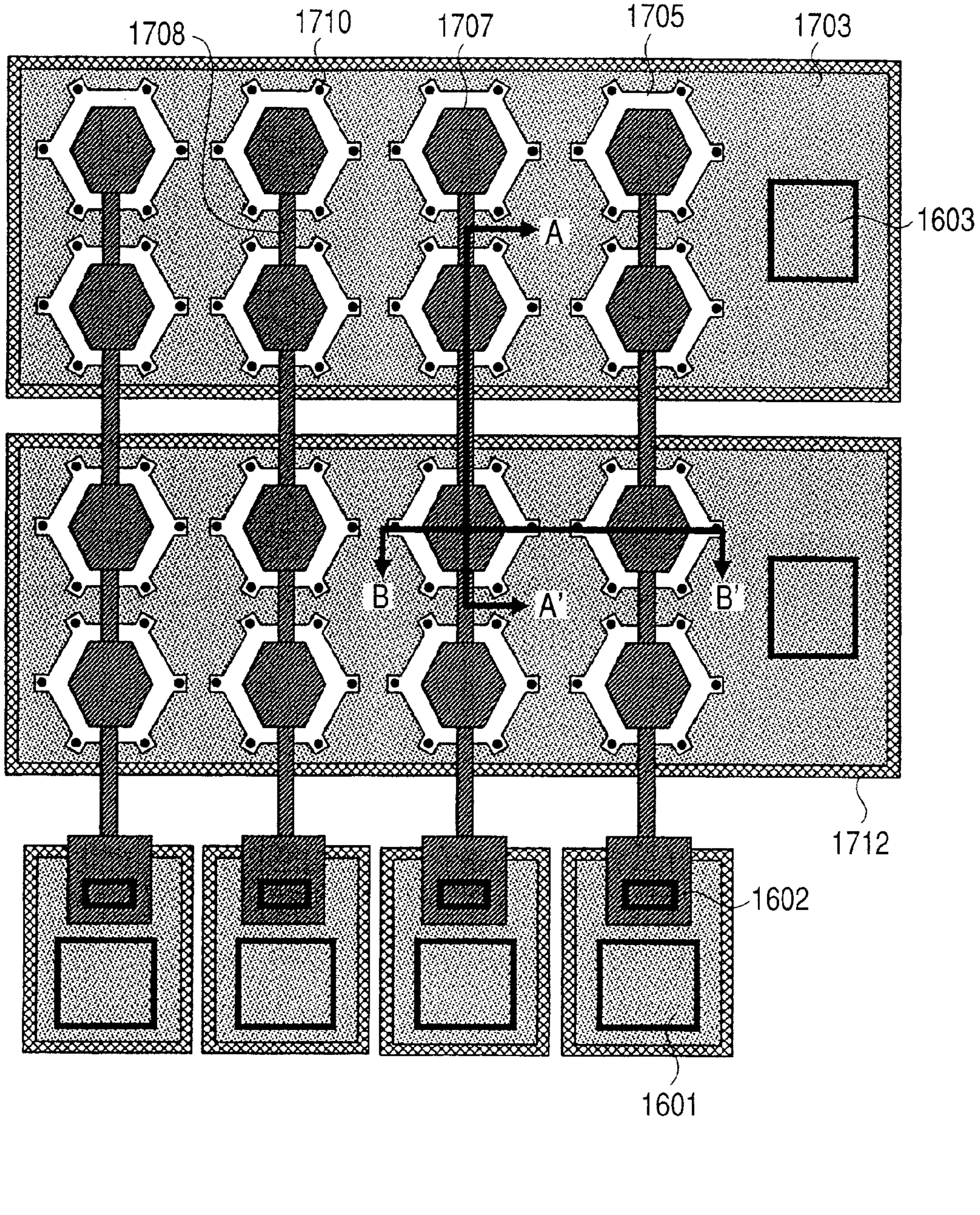
FIG. 16 is an upper plan view showing an ultrasonic transducer according to a third embodiment of the invention.

FIG. 16 is a upper plan view of the CMUT array of this embodiment. 1703 are lower electrodes, 1705 are hollow parts, 1707 are upper electrodes, 1708 is an interconnection joining the upper electrodes 1707, and 1710 are wet etching holes for forming the hollow parts 1705. The wet etching holes 1710 are connected to the hollow parts 1705. 1601 are pad openings to pads provided in the same layer as the lower electrodes 1703 to supply power to the upper electrodes 1707, and 1602 are plugs joining the interconnections 1708 to the pads. In other words, the interconnections 1708 joining the upper electrodes 1707 to the pads are connected via the plugs 1602. 1603 are pad opening to supply power to the lower electrodes 1703. Sidewalls 1712 are formed on the edges of the lower electrodes 1703. An insulation film is formed between the upper electrodes 1707 and interconnections 1708, and the lower electrodes 1703, so as to cover the hollow parts 1705, the sidewalls 1712 and the lower electrodes 1703, but it is not shown in order to show the hollow parts 1705, lower electrodes 1703 and sidewalls 1712.

Figure 17A:
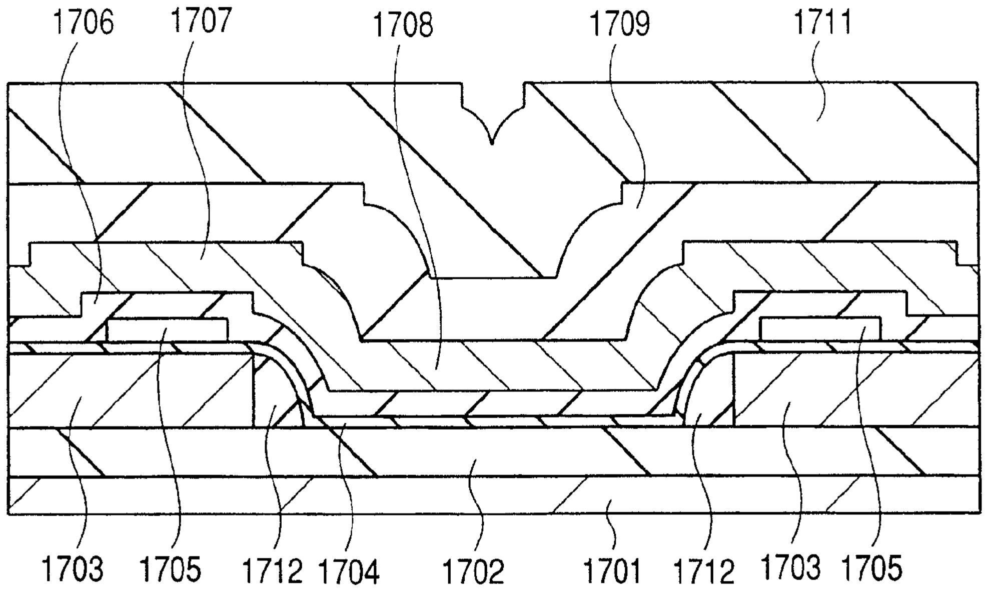
FIG. 17A is a cross-sectional view through a line A-A' in FIG. 16.
Figure 17B:
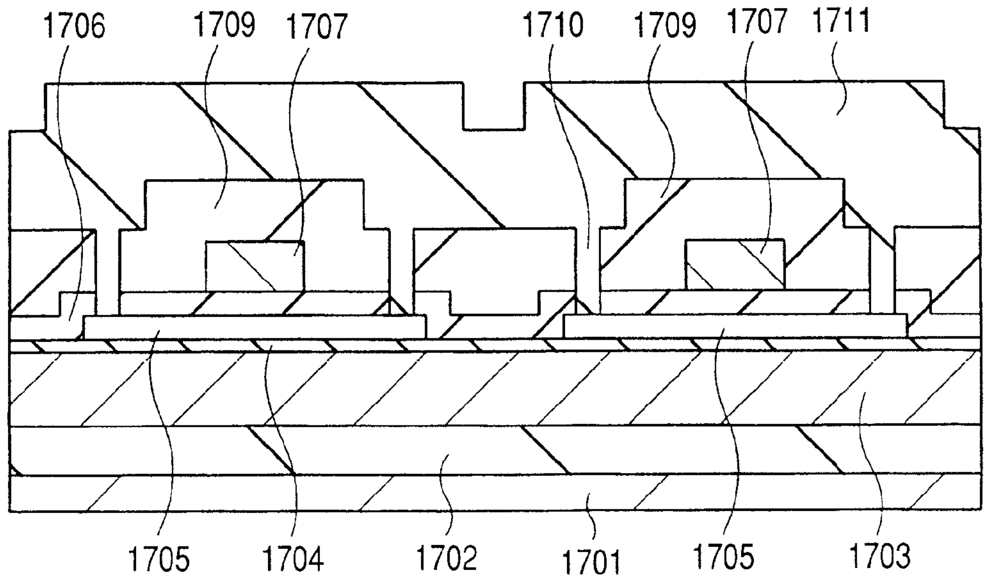
FIG. 17B is a cross-sectional view through a line B-B' in FIG. 16.

FIG. 17A shows a cross-section through A-A' in FIG. 16, and FIG. 17B shows a cross-section through B-B' in FIG. 16. As shown in FIG. 17A and FIG. 17B, the lower electrodes 1703 are formed on the insulation film 1702 formed on the semiconductor substrate 1701. The sidewalls 1712 are formed on the edges of the lower electrodes 1703. The hollow parts 1705 are formed above the lower electrodes 1703 and the sidewalls 1712 via the insulation film 1704.

An insulation film 1706 is formed to surround the hollow parts 1705, and the upper electrodes 1707 and interconnections 1708 joining the upper electrodes 1707, are formed above the insulation film 1706.

An insulation film 1709 and insulation film 1711 are formed above the upper electrodes 1707 and the interconnections 1708. Wet etching holes 1710 penetrating these films are formed in the insulation film 1706 and insulation film 1709. These wet etching holes 1710 are formed to form the hollow parts 1705, and after forming the hollow parts 1705, they are filled by the insulation film 1711.

The essential feature of the third embodiment, as shown in FIG. 16 and FIGS. 17A and 17B, is that the sidewalls 1712 due to the insulation film are provided on the edges of the lower electrodes 1703.

By adopting this construction, the step of the lower electrodes 1703 is moderated, the coverage in the step part of the interconnections 1708 increases, so resistance increase and interconnection breaks are suppressed. In particular, when the step of the lower electrodes 1703 is 500 nm or more, the coverage in the step part decreases further, so if the step of the lower electrodes 1703 is 500 nm or more, it is effective to provide the sidewalls 1712 in the step part.

Further, when the upper electrodes 1507 and interconnections 1708 are patterned, the local step of the lower electrodes 1503 is moderated, so the overetching amount due to removing interconnection material in the step part can also be reduced. When the overetching amount is large, the membrane film thickness of the CMUT cell varies due to etching of the insulation film 1706 which is the underlayer of the upper electrodes 1707, and this leads to operating characteristic fluctuations. However, in the construction shown in the third embodiment, by forming the sidewalls on the edges of the lower electrodes, the local step is moderated, the overetching amount is reduced, the etching amount of the insulation film 1706 is reduced, and operating stability is enhanced.

Further, in the insulation films 1704, 1706 which insulate the lower electrodes 1703 and upper electrodes 1707, due to forming the sidewalls 1712, decrease of film thickness in the lower electrode step part is small, decrease of dielectric strength is suppressed, and reliability of the device is enhanced.

In particular, if the width of only the interconnections overlapping the sidewalls 1712 is made larger as in the first embodiment, resistance increase and interconnection breaks are further suppressed.

The method of manufacturing the CMUT array according to the third embodiment is essentially identical to that of the first embodiment, but is different in that after the lower electrodes 1712 are patterned, sidewalls are formed on the edges of the lower electrodes 1703.

Figure 18A:
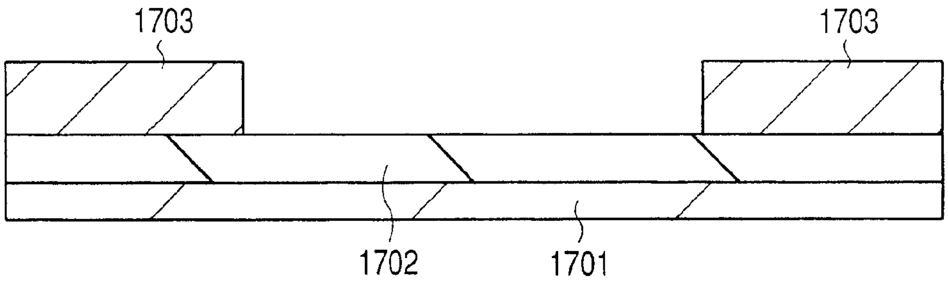
FIG. 18A is a cross-sectional view showing an ultrasonic transducer manufacturing step viewed along a line A-A' in FIG. 16.
Figure 18B:
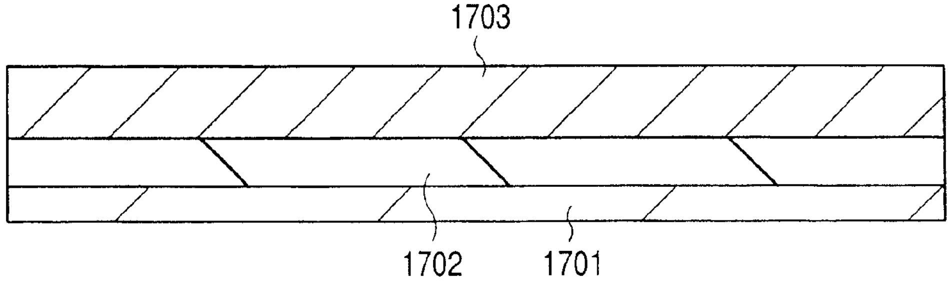
FIG. 18B is a cross-sectional view showing an ultrasonic transducer manufacturing step viewed along a line B-B' in FIG. 16.
Figure 19A:
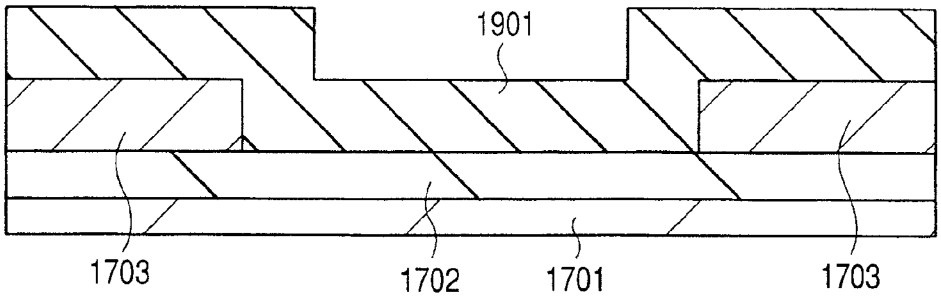
FIG. 19A is a cross-sectional view showing an ultrasonic transducer manufacturing step following FIG. 18A.
Figure 19B:
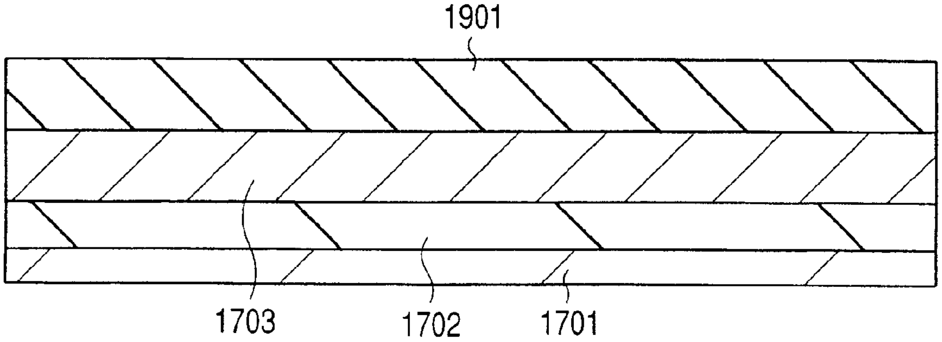
FIG. 19B is a cross-sectional view showing an ultrasonic transducer manufacturing step following FIG. 18B.

FIG. 18-FIG. 20 show the method of manufacturing the sidewalls after forming the lower electrodes. (a) of each figure shows a cross-section through A-A' in FIG. 16 and (b) of each figure shows a cross-section through B-B' in FIG. 16.

First, as shown in FIGS. 18A and 18B, an insulation film 1702 of silicon oxide is formed by plasma CVD on a semiconductor substrate 1701, a titanium nitride film, aluminum alloy film and titanium nitride film are subsequently deposited thereon respectively to thicknesses of 100 nm, 600 nm, 100 nm by sputtering, and the lower electrodes 1703 are formed by patterning by photolithography and dry etching. An insulation film 1901 of silicon oxide is deposited to 600 nm by plasma CVD on these lower electrodes 1703 (FIGS. 19A and 19A).

Figure 20A:
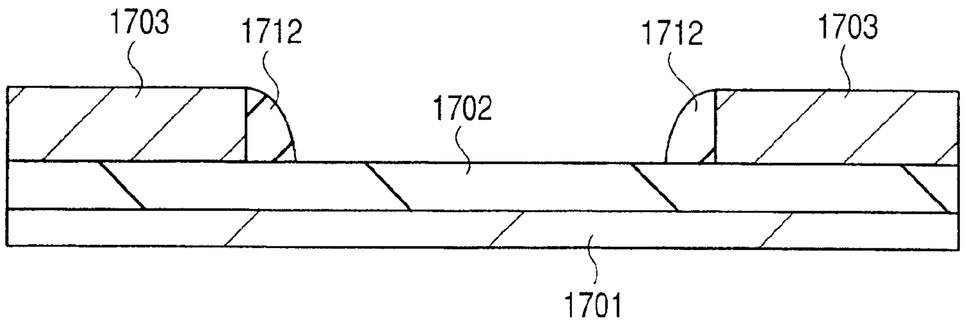
FIG. 20A is a cross-sectional view showing an ultrasonic transducer manufacturing step following FIG. 19A.
Figure 20B:
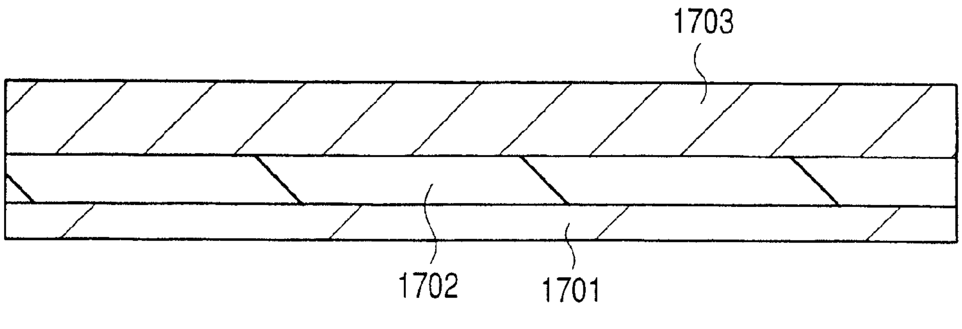
FIG. 20B is a cross-sectional view showing an ultrasonic transducer manufacturing step following FIG. 19B.

Next, by performing anisotropic etching until the surfaces of the lower electrodes 1703 are exposed by dry etching of the insulation film 1901 of silicon oxide, the sidewalls 1712 of silicon oxide are formed on the edges of the lower electrodes 1703 (FIGS. 20A and 20B). The remaining steps are identical to those of the first embodiment.

The CMUT array shown in FIG. 16 consists of two rows and one column of CMUT cells disposed at the crosspoints of the lower electrodes 1703 and upper electrodes 1707, but even if there are plural rows and plural columns of CMUT cells as in the first embodiment, an identical effect can be obtained by providing sidewalls on the edges of the lower electrodes.

Further, in FIG. 16, the CMUT cells are hexagonal, but the invention is not limited to this shape, and they may for example be circular.

Among the materials forming the CMUT cells shown in the third embodiment, only one combination thereof was shown. Also, the material of the sacrifice layer preferably retains wet etching selectivity with the materials surrounding the sacrifice layer. Therefore, in addition to a polycrystalline silicon film, it may be an SOG film or metal film.

Fourth Embodiment

In the CMUT array of the fourth embodiment, flattening is performed on the upper surfaces of the lower electrodes to moderate the step of the lower electrodes.

Figure 21:
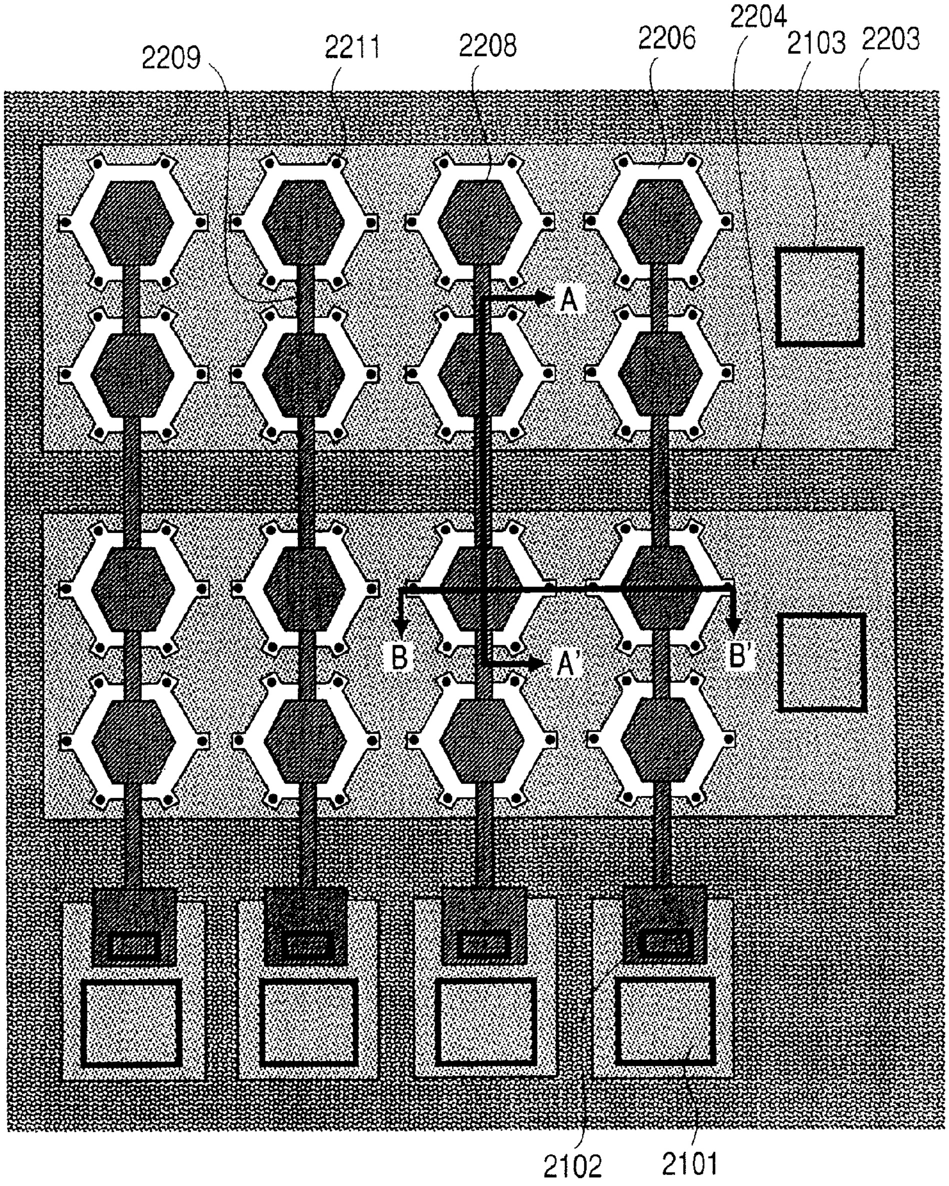
FIG. 21 is an upper plan view showing an ultrasonic transducer according to a fourth embodiment of the invention.

FIG. 21 shows an upper plan view of the CMUT array of the fourth embodiment. 2203 are lower electrodes, 2206 are hollow parts, 2208 are upper electrodes, 2209 are interconnections joining the upper electrodes 2208, and 2211 are wet etching holes for forming the hollow parts 2206. The wet etching holes 2211 are connected to the hollow parts 2206.

2101 are pad openings to pads provided in the same layer as the lower electrodes 2203 to supply power to the upper electrodes 2208, and 2102 are plugs joining the interconnections 2209 to the pads. In other words, the interconnections 2209 joining the upper electrodes 2208 to the pads, are connected via the plugs 2102.

2103 are pad openings to supply power to the lower electrodes 2203. 2204 is an insulation film, and fills the gaps between the lower electrodes 2203. An insulation film is formed between the upper electrodes 2208 and interconnections 2209, and the lower electrodes 2203, so as to cover the hollow parts 2206 and lower electrodes 2203, but it is not shown in order to show the hollow parts 2206, lower electrodes 2203 and insulation film 2204.

Figure 22A:
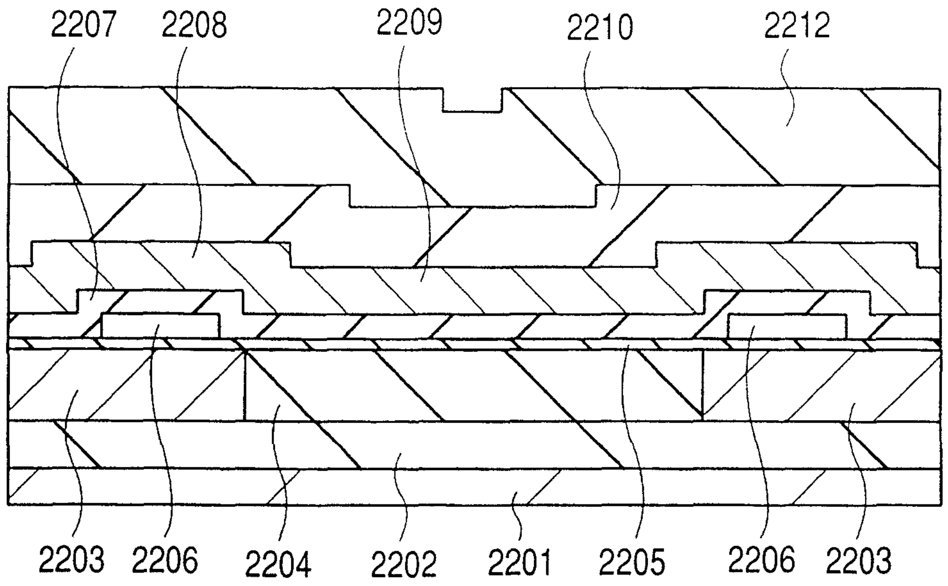
FIG. 22A is a cross-sectional view through a line A-A' in FIG. 21
Figure 22B:
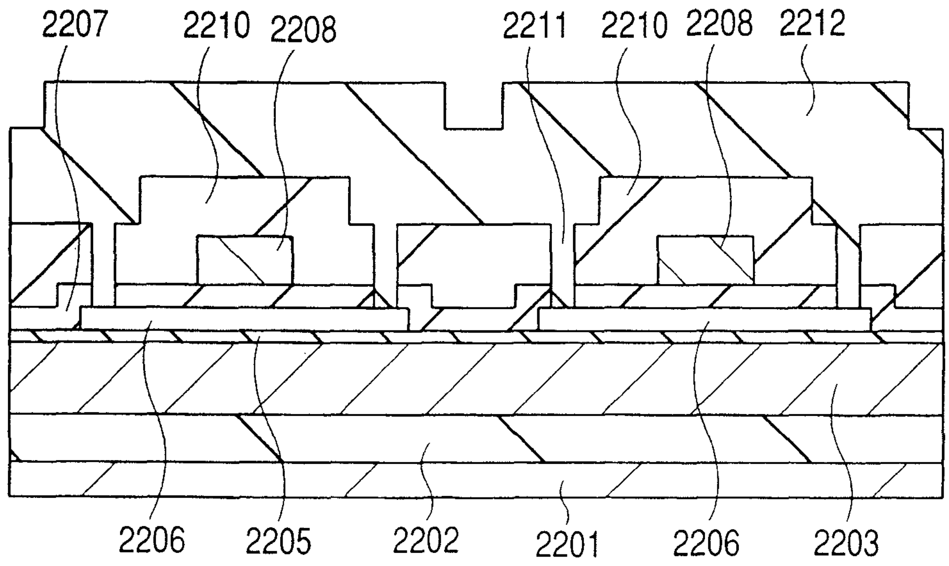
FIG. 22B is a cross-sectional view through a line B-B' in FIG. 21.

FIG. 22A shows a cross-section through A-A' in FIG. 21, and FIG. 22B shows a cross-section through B-B' in FIG. 21.

As shown in FIG. 22A and FIG. 22B, the lower electrodes 2203 are formed on the insulation film 2202 formed on the semiconductor substrate 2201. The insulation film 2204 is filled between the lower electrodes 2203, and is flattened so that the heights of the upper surface of the lower electrodes 2203 and upper surface of the insulation film 2204 coincide. The insulation film 2205 is formed above the lower electrodes 2203 and insulation film 2204, and the hollows 2206 are formed above the lower electrodes 2203 via the insulation film 2205. An insulation film 2207 is formed to surround the hollow parts 2206, the upper electrodes 2208 and interconnections 2209 joining the upper electrodes being formed above the insulation film 2207. The insulation film 2210 and insulation film 2212 are formed above the upper electrodes 2208 and the interconnections 2209. Wet etching holes 2211 penetrating these films are formed in the insulation film 2210 and insulation film 2207. These wet etching holes 2211 are formed to form the hollow parts 2206, and after forming the hollow parts 2206, they are filled by the insulation film 2212.

The essential feature of the fourth embodiment, as shown in FIG. 21, FIGS. 22A and 22B, is that the spaces between the lower electrodes are filled by the insulation film 2204, and flattened.

By adopting this construction, the step of the lower electrodes 2203 is moderated, there is no decrease of coverage in the step part of the interconnections 2209 joining the upper electrodes 2208, so resistance increase and interconnection breaks are suppressed. In particular, when the step of the lower electrodes 2203 is 500 nm or more, the coverage in the step part decreases further, so if the step of the lower electrodes 2203 is 500 nm or more, it is effective to fill the insulation film 2204 between the lower electrodes and flatten it.

Further, when the upper electrodes 2208 are patterned, the lower electrodes 2203 no longer have a step, so overetching due to etching of interconnection material is reduced. When the overetching amount is large, the membrane film thickness of the CMUT cell varies due to etching of the insulation film 2207 which is the underlayer of the upper electrodes 2208, and this leads to operating characteristic fluctuations. However, in the construction shown in the fourth embodiment, the gaps between the lower electrodes are filled by the insulation film and flattened, so the step disappears, and the overetching amount is reduced. Hence, the etching amount of the insulation film 2207 is reduced, and operating stability is enhanced.

Since the lower electrodes 2203 no longer have a step, the dielectric strength of the insulation films 2205, 2207 which insulate the lower electrodes 2203 and upper electrodes 2208 does not decrease, and the reliability of the device is enhanced.

The method of manufacturing the CMUT array according to the fourth embodiment is essentially identical to that of the first embodiment, but is different in that the spaces between the lower electrodes are filled by the insulation film and flattened.

FIG. 23 and FIG. 24 show the steps from forming the insulation film between the lower electrodes to flattening of the insulation film. (a) of each figure shows a cross-section through A-A' in FIG. 21, and (b) of each figure shows a cross-section through B-B' in FIG. 21.

Figure 23A:
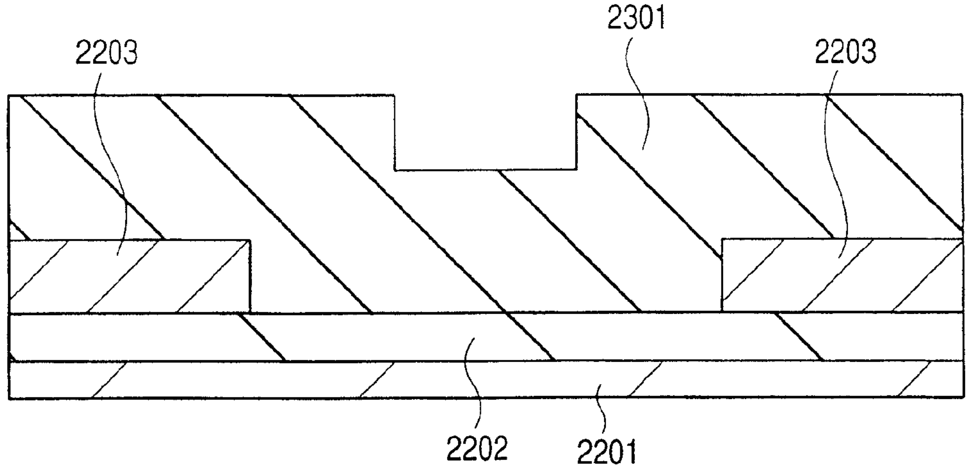
FIG. 23A is a cross-sectional view showing an ultrasonic transducer manufacturing step viewed along a line A-A' in FIG. 21.
Figure 23B:
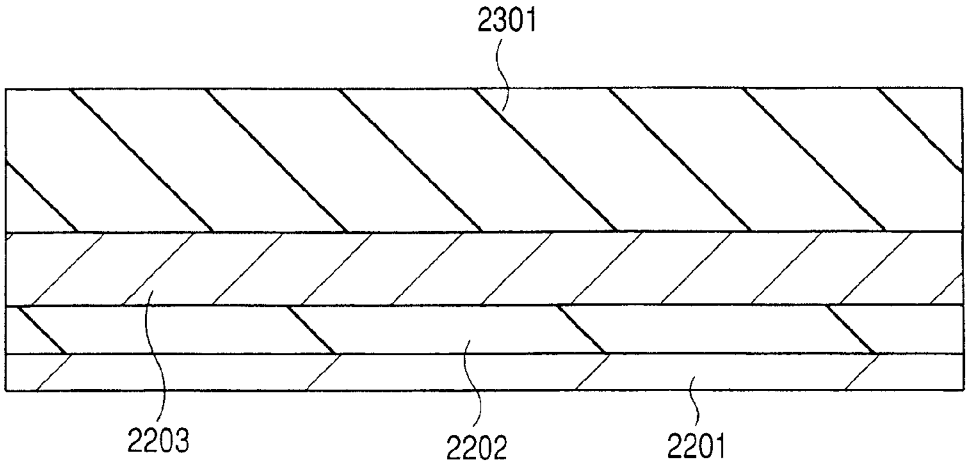
FIG. 23B is a cross-sectional view showing an ultrasonic transducer manufacturing step viewed along a line B-B' in FIG. 21.

First, as shown in FIGS. 23A and 23B, the insulation film 2202 of silicon oxide is deposited by plasma CVD on the semiconductor substrate 2201, a titanium nitride film, aluminum alloy film and titanium nitride film are subsequently deposited thereon respectively to thicknesses of 100 nm, 600 nm, 100 nm by sputtering, and the lower electrodes 2203 are formed by patterning using photolithography and dry etching. The insulation film 2301 of silicon oxide is deposited to 1400 nm by plasma CVD on these lower electrodes 2203.

Figure 24A:
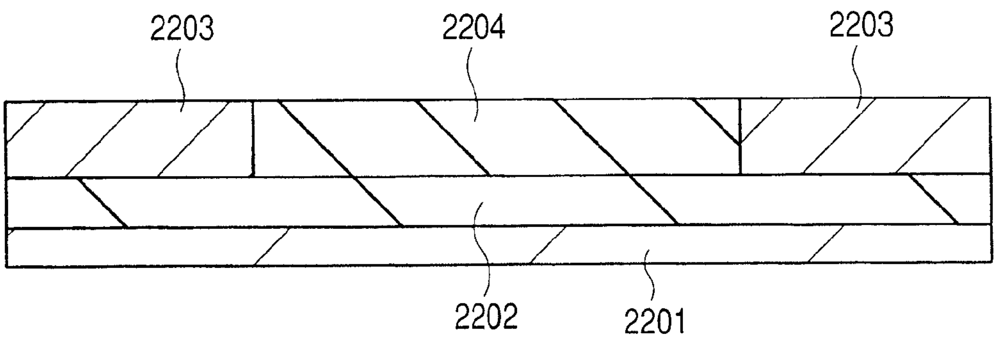
FIG. 24A is a cross-sectional view showing an ultrasonic transducer manufacturing step following FIG. 23A.
Figure 24B:
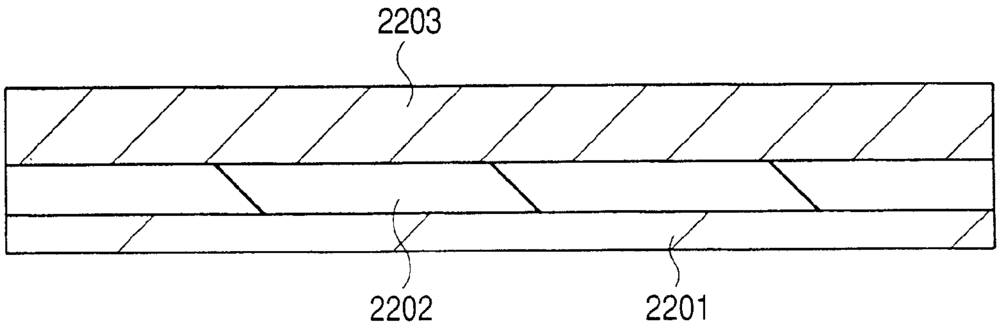
FIG. 24B is a cross-sectional view showing an ultrasonic transducer manufacturing step following FIG. 23B.
Figure 25A:
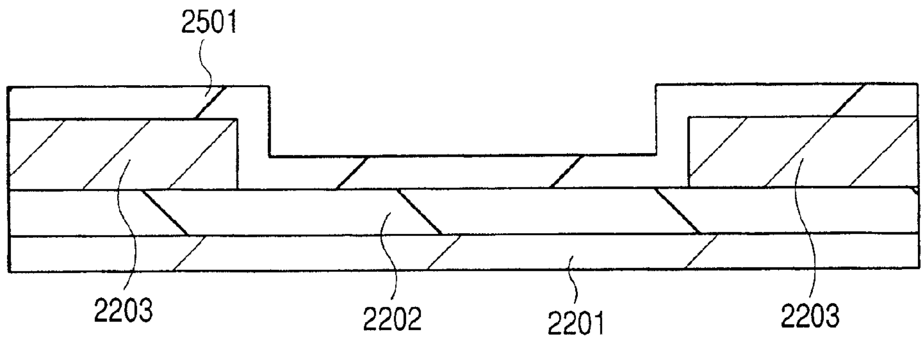
FIG. 25A is a cross-sectional view showing an ultrasonic transducer manufacturing step viewed along a line A-A' in FIG. 21.
Figure 25B:
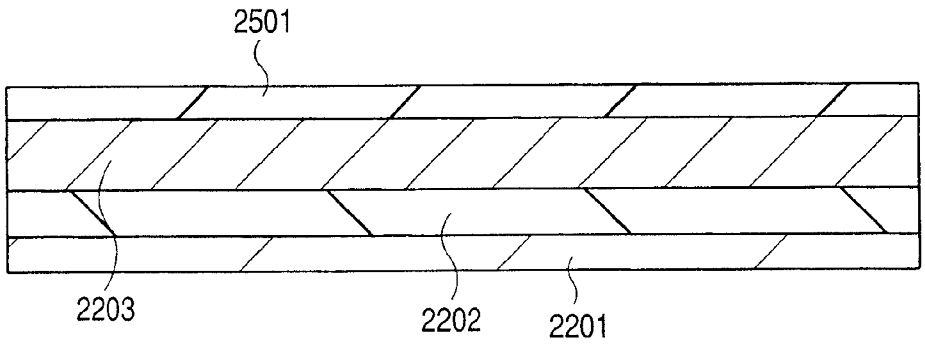
FIG. 25B is a cross-sectional view showing an ultrasonic transducer manufacturing step viewed along a line B-B' in FIG. 21.
Figure 26A:
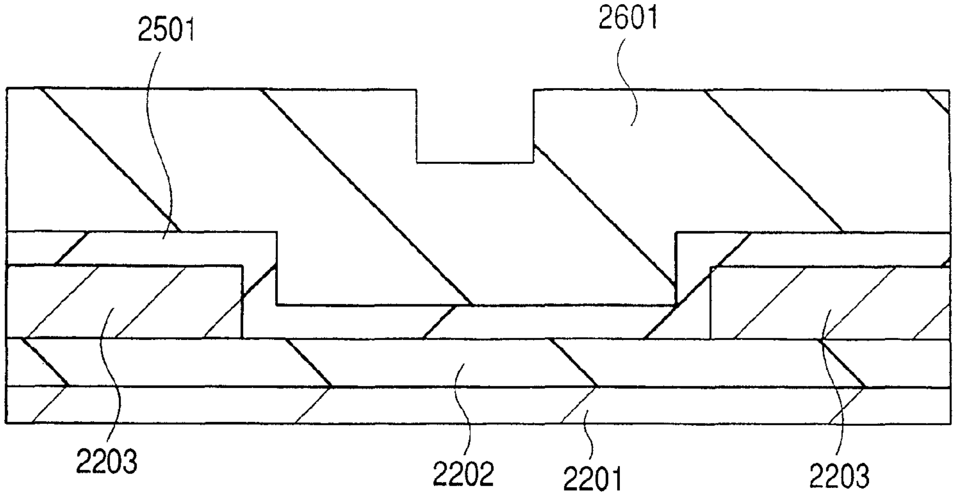
FIG. 26A is a cross-sectional view showing an ultrasonic transducer manufacturing step following FIG. 25A, and FIG. 26*b*) is a cross-sectional view showing an ultrasonic transducer manufacturing step following FIG. 25B.
Figure 26B:
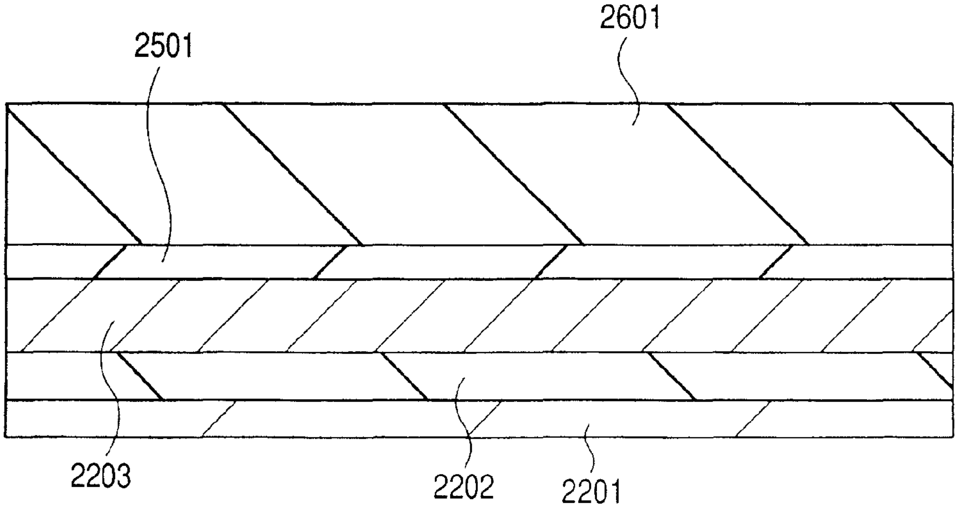
Figure 27A:
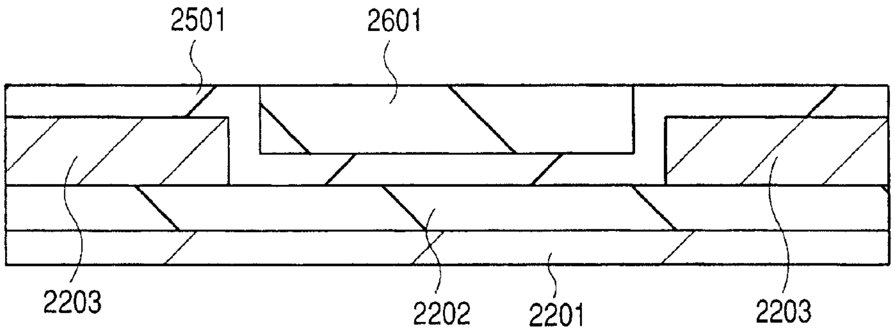
FIG. 27A is a cross-sectional view showing an ultrasonic transducer manufacturing step following FIG. 26A.
Figure 27B:
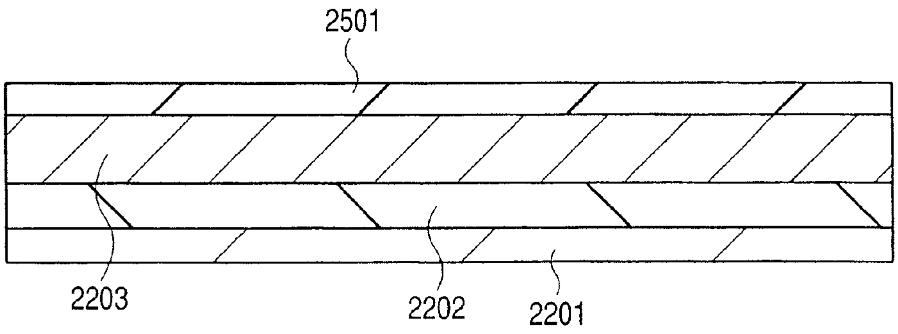
FIG. 27B is a cross-sectional view showing an ultrasonic transducer manufacturing step following FIG. 26B.
Figure 28A:
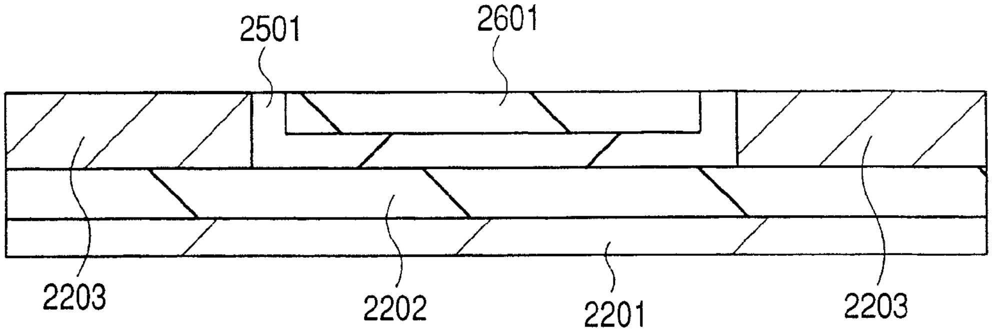
FIG. 28A is a cross-sectional view showing an ultrasonic transducer manufacturing step following FIG. 27A.
Figure 28B:
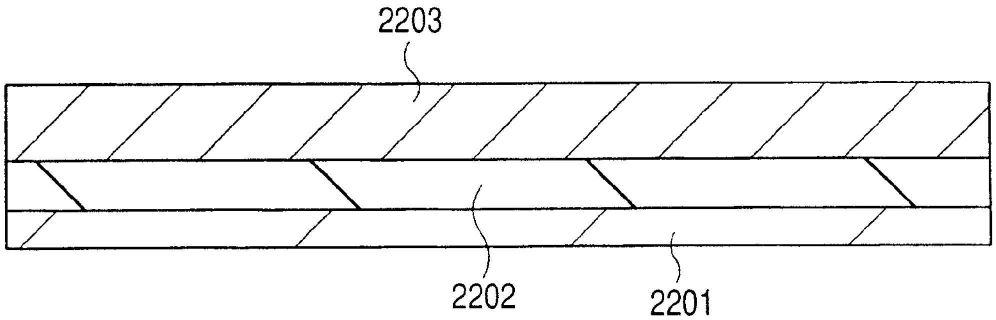
FIG. 28B is a cross-sectional view showing an ultrasonic transducer manufacturing step following FIG. 27B.

Next, by flattening the insulation film 2301 of silicon oxide by CMP (Chemical Mechanical Polishing) until the surfaces of the lower electrodes 2203 are exposed, the insulation film 2204 of silicon oxide, which is filled between the lower electrodes and flattened, is formed (FIGS. 24A and 24B). The subsequent steps are identical to those of the first embodiment.

In the fourth embodiment, the insulation film 2301 of silicon oxide was flattened by CMP until the surfaces of the lower electrodes 2203 were exposed, but an identical shape can be obtained by flattening by CMP until just before the surfaces of the lower electrodes 2203 are exposed, and then etching the insulation film 2301 of silicon oxide by dry etching until the surfaces of the lower electrodes 2203 are exposed.

In order to flatten the silicon oxide film with high precision, a stopper film for CMP flattening may be inserted as shown in FIG. 25-FIG. 28. (a) of each figure shows a cross-section through A-A' in FIG. 21, and (b) of each figure shows a cross-section through B-B' in FIG. 21. As shown in FIGS. 25A and 25B, after forming the lower electrodes 2203, an insulation film 2501 of silicon nitride is formed to 200 nm by plasma CVD as the stopper film for CMP flattening. An insulation film 2601 of silicon oxide is then deposited to 1400 nm on the insulation film 2501 of silicon nitride by plasma CVD (FIGS. 26A and 26B). Next, the insulation film 2601 of silicon oxide is flattened by CMP polishing until the upper surface of the insulation film 2501 of silicon nitride is exposed (FIGS. 27A and 27B). At that time, the polishing rate ratio during CMP of the silicon oxide film and silicon nitride film is 2-3, so the polishing of the upper surface of the insulation film 2501 of silicon nitride can be stopped with fine control. Subsequently, the surfaces of the lower electrodes 2203 are exposed by uniform rate dry etching of the insulation film 2601 of silicon oxide and the insulation film 2501 of silicon nitride, and the spaces between the lower electrodes are flattened (FIGS. 28A and 28B).

In this fourth embodiment, the insulation film 2204 filled between the lower electrodes 2203 was formed by plasma CVD, but alternatively, an SOG film may be filled by a coating technique. In this case, after filling the SOG film, by dry etching until the surfaces of the lower electrode are exposed, an identical flattened structure to that of FIG. 24 and FIG. 28 can be obtained.

Further, an identical structure wherein the lower electrodes are flattened on their upper surface may be formed by forming the lower electrodes by damascene interconnections. In this case, a groove is first formed by etching in the insulation film, the material to become the lower electrode is filled in this groove, and the surplus lower electrode material which has spilled out from the groove is polished off.

The CMUT array shown in FIG. 21 consists of two rows and one column of CMUT cells disposed at the crosspoints of the lower electrodes 2203 and upper electrodes 2208, but even if there are plural rows and plural columns of CMUT cells as in the first embodiment, an identical effect can be obtained by flattening the upper surface of the lower electrodes.

Further, in FIG. 21, the CMUT cells are hexagonal, but the invention is not limited to this shape, and they may be for example circular.

Among the materials forming the CMUT cells shown in the fourth embodiment, only one combination thereof was shown. Also, the material of the sacrifice layer preferably retains wet etching selectivity with the materials surrounding the sacrifice layer. Therefore, in addition to a polycrystalline silicon film, it may be an SOG film or metal film.

Fifth Embodiment

In the CMUT array of the fifth embodiment, the upper surface of the lower electrodes is flattened to moderate the step of the lower electrodes, and a dummy pattern for flattening is also formed on the same layer as the lower electrodes.

Figure 29:
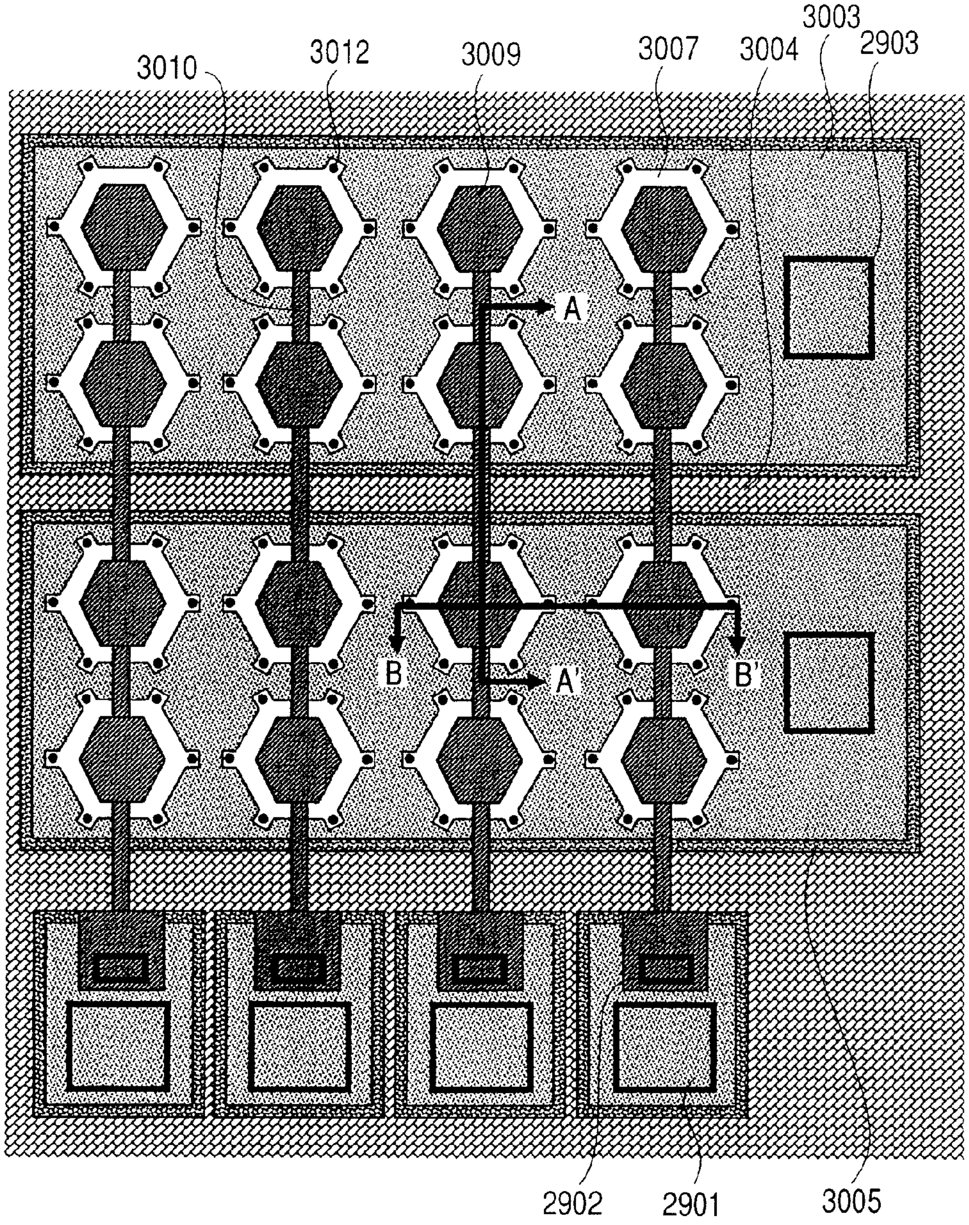
FIG. 29 is an upper plan view of an ultrasonic transducer according to a fifth embodiment of the invention.

FIG. 29 shows an upper plan view of the CMUT array of the fifth embodiment. 3303 are lower electrodes, 3307 are hollow parts, 3309 are upper electrodes, 3010 are interconnections joining the upper electrodes 3009, and 3012 are wet etching holes for forming the hollow parts 3007. The wet etching holes 3012 are connected to the hollow parts 3007.

2901 are pad openings to pads provided in the same layer as the lower electrodes 3003 to supply power to the upper electrodes 3009, and 2902 are plugs joining the interconnections 3010 to the pads. In other words, the interconnections 3010 joining the upper electrodes 3009 to the pads are connected via the plugs 2902. 2903 are pad openings to supply power to the lower electrodes 3003. A dummy pattern 3004 for flattening is formed between the lower electrodes 3003. 3005 are insulation films filling the gaps between the dummy pattern 3004 and lower electrodes 3003.

An insulation film is formed between the upper electrodes 3009 and interconnections 3010, and the lower electrodes 3003, so as to cover the hollow parts 3007, dummy pattern 3004, insulation films 3005 and lower electrodes 3003, but it is not shown so as to show the hollow parts 3007, lower electrodes 3003, dummy pattern 3004 and insulation films 3005.

Figure 30A:
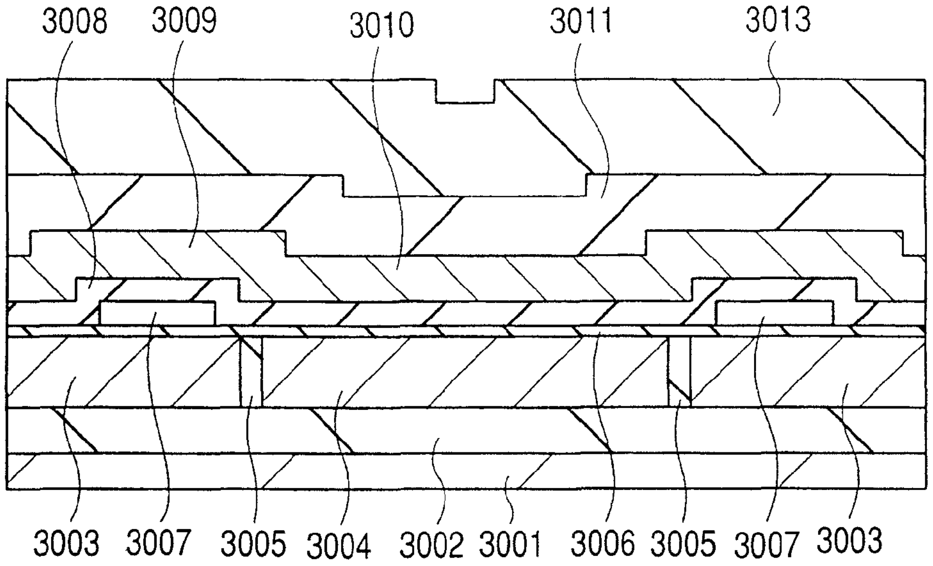
FIG. 30A is a cross-sectional view through a line A-A' in FIG. 29.
Figure 30B:
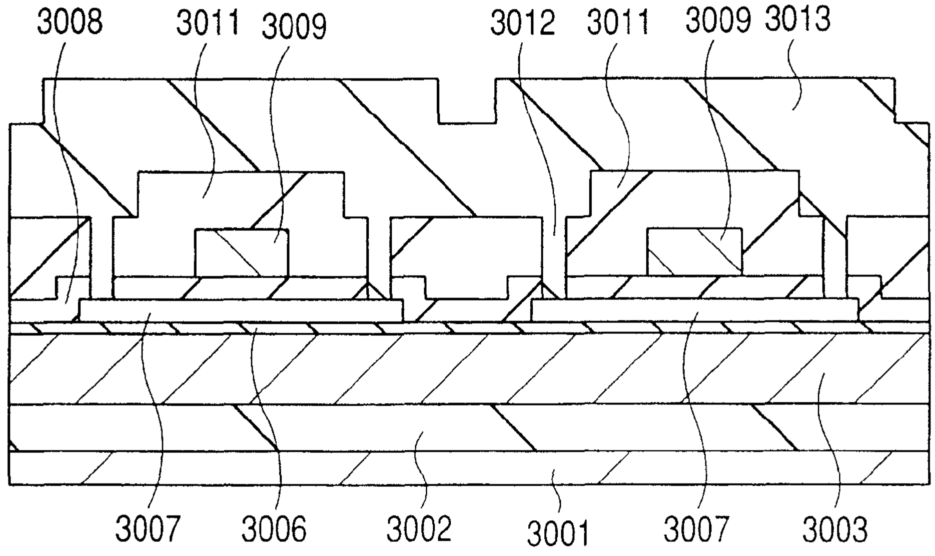
FIG. 30B is a cross-sectional view through a line B-B' in FIG. 29.

FIG. 30 shows an upper plan view of the CMUT array of the fifth embodiment. FIG. 30A shows a cross-section through A-A' in FIG. 29, and FIG. 30B shows a cross-section through B-B' in FIG. 29.

As shown in FIG. 30A and FIG. 30B, the lower electrodes 3003 are formed on the insulation film 3002 formed on the semiconductor substrate 3001. The dummy pattern 3004 for flattening is also formed at the same time as the lower electrodes 3003. Specifically, the lower electrodes 3003 and dummy pattern 3004 are formed to have the same height.

The insulation film 3005 is filled between the lower electrode 3003 and dummy pattern 3004, and is flattened so that the heights of the upper surfaces of the lower electrode 3003 and dummy pattern 3004, and the upper surface of the insulation film 3005, coincide. The insulation film 3005 is provided to electrically insulate the lower electrode 3003 and dummy pattern 3004.

The insulation film 3006 is formed on the lower electrodes 3003, dummy pattern 3004 and insulation films 3005, the hollow parts 3007 being formed on the lower electrodes 3003 via the insulation film 3006. An insulation film 3008 is formed to surround the hollow parts 3007, and the upper electrodes 3009 and interconnections 3010 joining the upper electrodes are formed above the insulation film 3008. An insulation film 3011 and insulation film 3013 are formed above the upper electrodes 3009 and interconnections 3010. Wet etching holes 3012 penetrating these films are also formed in the insulation film 3011 and insulation film 3008. These wet etching holes 3012 are formed to form the hollow parts 3007, and after forming the hollow parts 3007, they are filled by an insulation film 3013.

The essential features of this fifth embodiment, as shown in FIG. 29, FIGS. 30A and 30B are that the dummy pattern 3004 is provided between the lower electrodes 3003, and that the insulation films 3005 are filled in the gaps between the lower electrodes 3003 and dummy pattern 3004, and flattened.

By adopting this construction, flattening characteristics in CMP flattening of the step of the lower electrodes 3003 are further enhanced. If there were no dummy pattern 3004, when the insulation films 3005 are CMP polished, the drop amount of the insulation films 3005 in areas where the lower electrodes 3003 are not present in the underlayer, might increase due to the phenomenon known as dishing. However, in the structure shown in the fifth embodiment, CMP flattening of the insulation films 3005 is enhanced by the dummy pattern 3004, and the step of the lower electrodes 3003 is further moderated, so resistance increase and breaks in the interconnections 3010 are suppressed. By forming the dummy pattern 3004 in the lower electrodes 3003 from an identical material to that of the lower electrodes 3003, dishing which would occur if the dummy pattern 3004 were not formed, is prevented. In particular, when the step of the lower electrode 1503 is 500 nm or more, the coverage of the deposited film in the step part decreases further, so if the step of the lower electrode 1503 is 500 nm or more, it is effective to fill the dummy pattern 3004 and insulation films 3005 in the lower electrodes 3003 and flatten them.

Further, the overetching amount when the upper electrode 3009 is patterned, is reduced, the etching amount of the insulation film 3008 is reduced, and operating stability is enhanced.

Still further, since the lower electrodes 3003 no longer have a step, the dielectric strength of the insulation films 3006, 3008 which insulate the lower electrodes 3003 and upper electrodes 3009 does not decrease, and the reliability of the device is enhanced.

The method of manufacturing the CMUT array according to the fifth embodiment is essentially identical to that of the fourth embodiment, but is different in that the dummy pattern is formed in the same layer as the lower electrodes.

FIG. 31-FIG. 33 show the manufacturing method from forming the lower electrodes and dummy pattern for flattening, and forming the insulation film which fills the spaces between the lower electrodes, up to the flattening of the insulation film. (a) of each figure shows a cross-section through A-A' in FIG. 29, and (b) of each figure shows a cross-section through B-B' in FIG. 29.

Figure 31A:
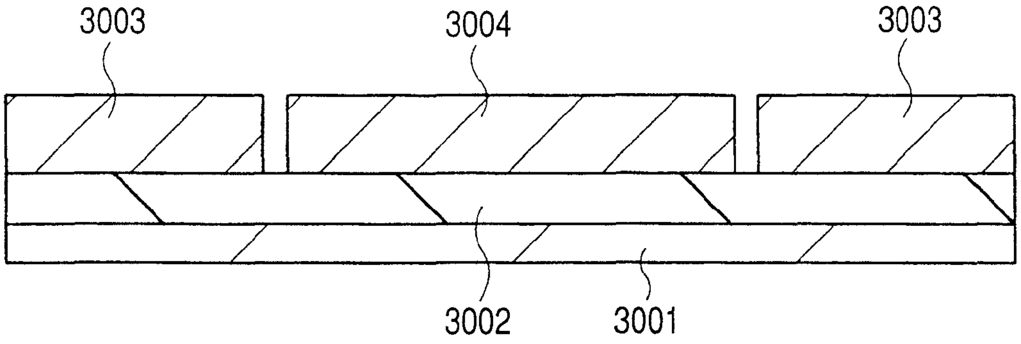
FIG. 31A is a cross-sectional view showing an ultrasonic transducer manufacturing step viewed along a line A-A' in FIG. 29.
Figure 31B:
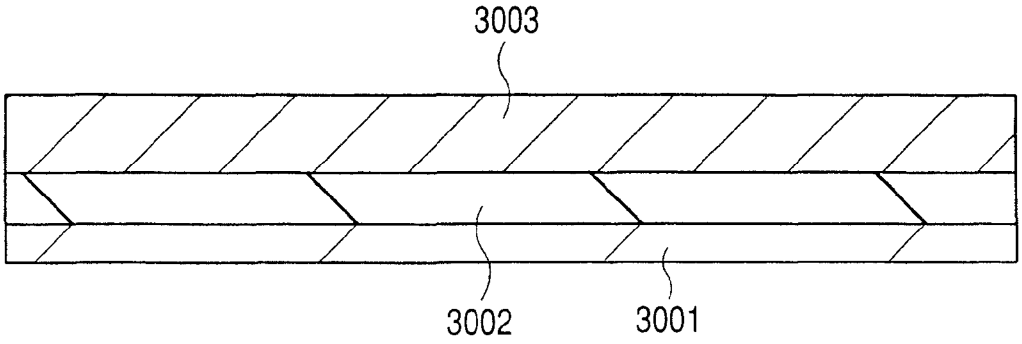
FIG. 31B is a cross-sectional view showing an ultrasonic transducer manufacturing step viewed along a line B-B' in FIG. 29.
Figure 32A:
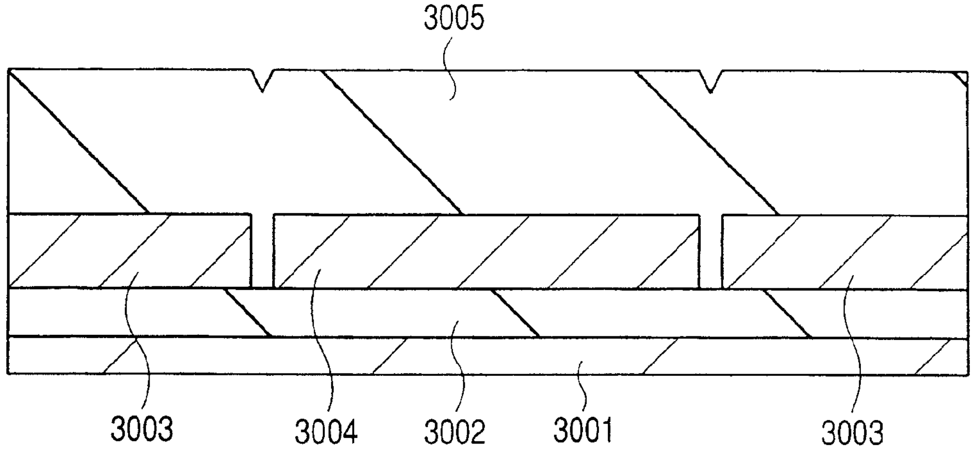
FIG. 32A is a cross-sectional view showing an ultrasonic transducer manufacturing step following FIG. 31A.
Figure 32B:
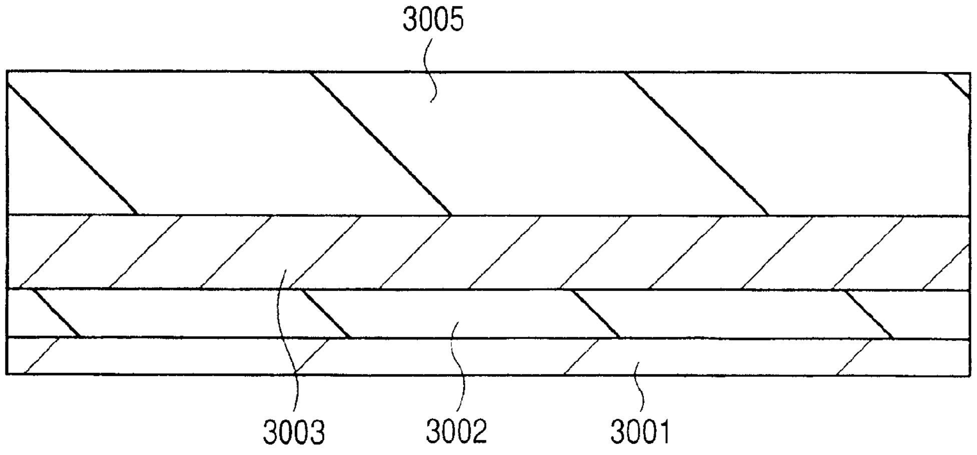
FIG. 32B is a cross-sectional view showing an ultrasonic transducer manufacturing step following FIG. 31B.

First, as shown in FIGS. 31A and 31B, the insulation film 3002 of silicon oxide is formed by plasma CVD on the semiconductor substrate 3001. Next, after depositing a titanium nitride film, aluminum alloy film and titanium nitride film respectively to 100 nm, 600 nm, 100 nm by sputtering, the lower electrodes 3003 are formed by patterning by photolithography and dry etching. At this time, the dummy pattern 3004 for flattening is formed simultaneously. The insulation film 3005 of silicon oxide is deposited to 1400 nm by plasma CVD on the lower electrodes 3003 and dummy pattern 3004 (FIGS. 32A and 32B).

Figure 33A:
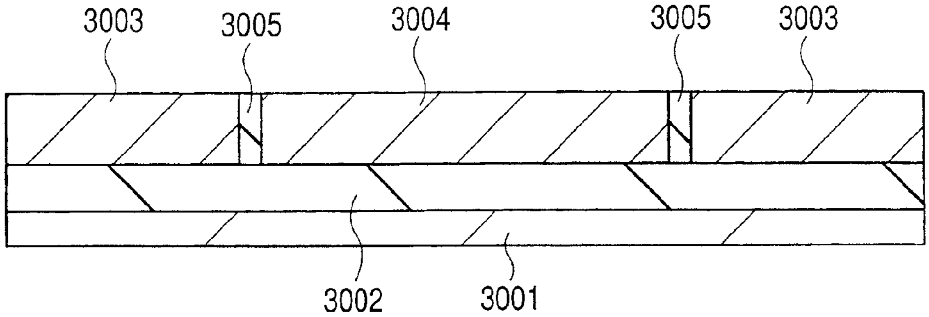
FIG. 33A is a cross-sectional view showing an ultrasonic transducer manufacturing step following FIG. 32A.
Figure 33B:
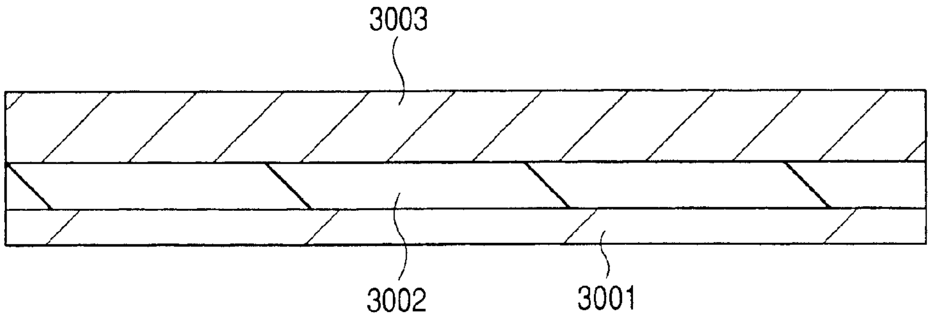
FIG. 33B is a cross-sectional view showing an ultrasonic transducer manufacturing step following FIG. 32B.

Next, a structure wherein the insulation film 3005 of silicon oxide is filled between the lower electrodes and dummy pattern, and flattened, is formed by CMP flattening of the insulation film 3005 of silicon oxide until the surfaces of the lower electrodes 3003 and dummy pattern 3004 are exposed (FIGS. 33A and 33B). The subsequent steps are identical to those of the fourth embodiment.

In the fifth embodiment, the silicon oxide film was flattened by CMP until the surfaces of the lower electrodes 3003 and dummy pattern 3004 were exposed, but an identical effect can be obtained by CMP flattening until just before the surfaces of the lower electrodes 3003 are exposed, and then dry etching the silicon oxide film until the surfaces of the lower electrodes 3003 and dummy pattern are exposed.

To flatten the silicon oxide film with high precision, a stopper film for CMP flattening may be inserted above the lower electrodes 3003 and dummy pattern 3004.

Further, in this fifth embodiment, the insulation film 3005 filling the gaps between the lower electrodes 2203 and dummy pattern 3004 was formed by plasma CVD, but alternatively, an SOG film may be filled by a coating technique. In this case, after filling the gaps between the lower electrodes 3003 and dummy pattern 3004 by coating the SOG film, a flattened structure identical to that of FIG. 33 can be obtained by dry etching until the surfaces of the lower electrodes 3003 and dummy pattern 3004 are exposed, An identical flattened structure may be obtained also by forming the lower electrodes 3003 by damascene interconnections. In this case, a groove for the lower electrodes and a groove for the dummy pattern are first formed by etching in the insulation film, the material to become the lower electrodes 3003 is filled in these grooves, and the surplus lower electrode material which has spilled out from the grooves is polished off.

The CMUT array shown in FIG. 29 consists of two rows and one column of CMUT cells disposed at the crosspoints of the lower electrodes 3003 and upper electrodes 3009, but even if there are plural rows and plural columns of CMUT cells as in the first embodiment, an identical effect can be obtained by flattening the upper surface of the lower electrodes and forming the dummy pattern for flattening in the same layer.

Further, in FIG. 29, the CMUT cells are hexagonal, but the invention is not limited to this shape, and they may be for example circular.

Among the materials forming the CMUT cells shown in the fifth embodiment, only one combination thereof was shown. Also, the material of the sacrifice layer preferably retains wet etching selectivity with the materials surrounding the sacrifice layer. Therefore, in addition to a polycrystalline silicon film, it may be an SOG film or metal film.

Sixth Embodiment

In the CMUT array of the sixth embodiment, the hollow parts are flattened over to moderate the step of the lower electrodes and hollow parts.

Figure 1:
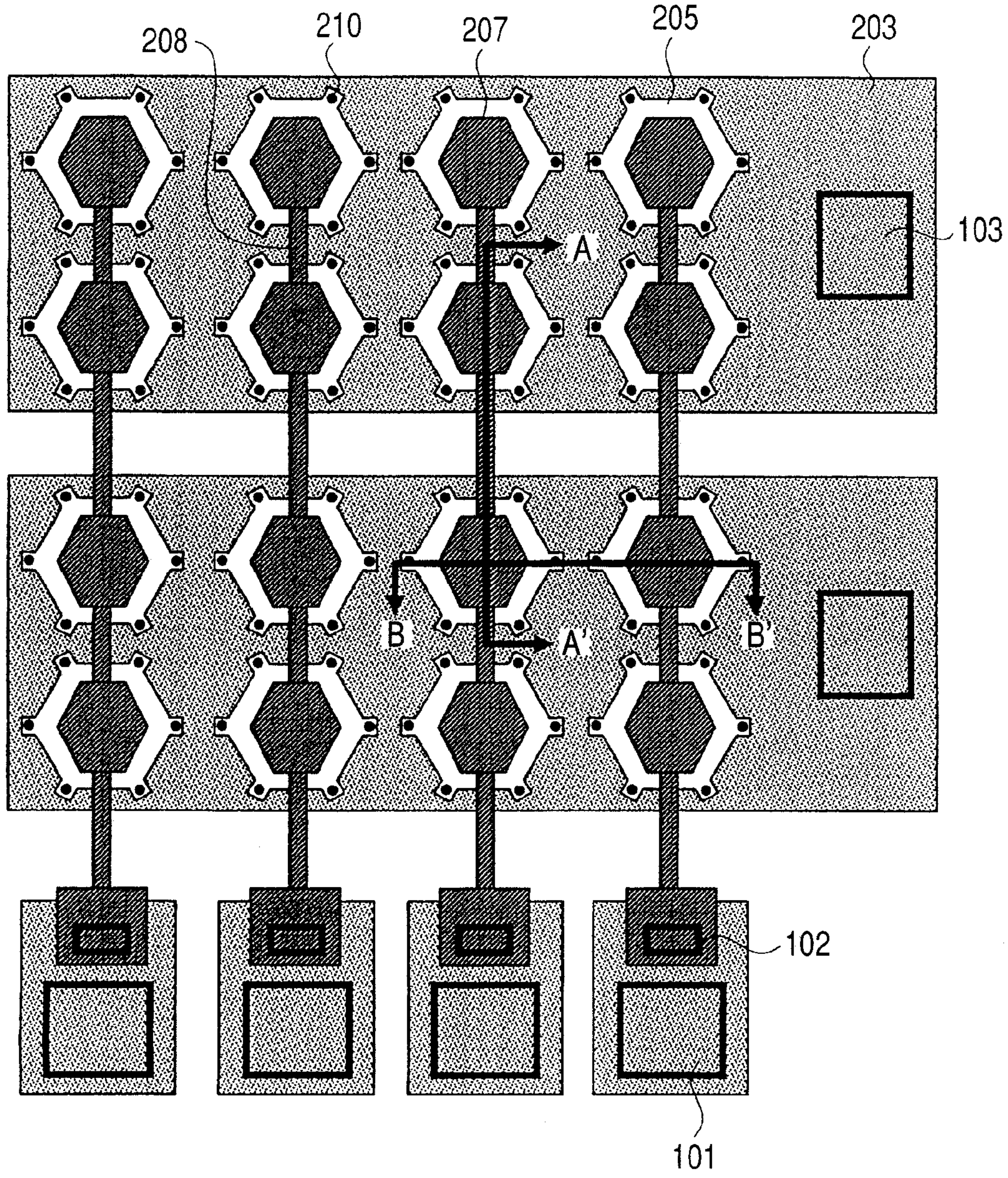
FIG. 1 shows an upper plan view of an ultrasonic transducer conceived by the inventors.
Figure 34A:
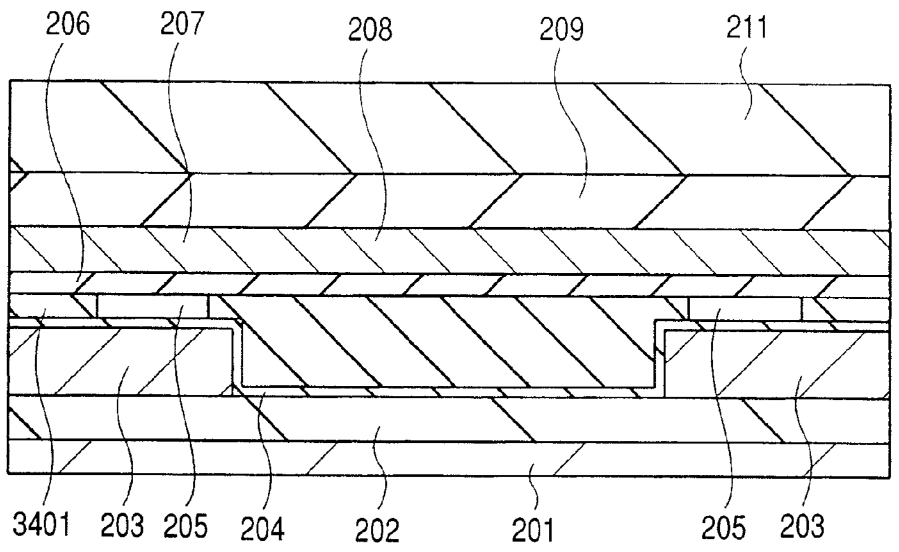
FIGS. 34A and 34B are cross-sectional views of an ultrasonic transducer according to a sixth embodiment of the invention.

An upper plan view of the CMUT array of the sixth embodiment is identical to that of FIG. 1 with respect to the positions of the electrodes and hollow parts, so a cross-section of the CMUT array according to the sixth embodiment will now be described referring to FIG. 34. FIG. 34A shows a cross-section through A-A' in FIG. 1, and FIG. 34B shows a cross-section through B-B' in FIG. 1.

Figure 34B:
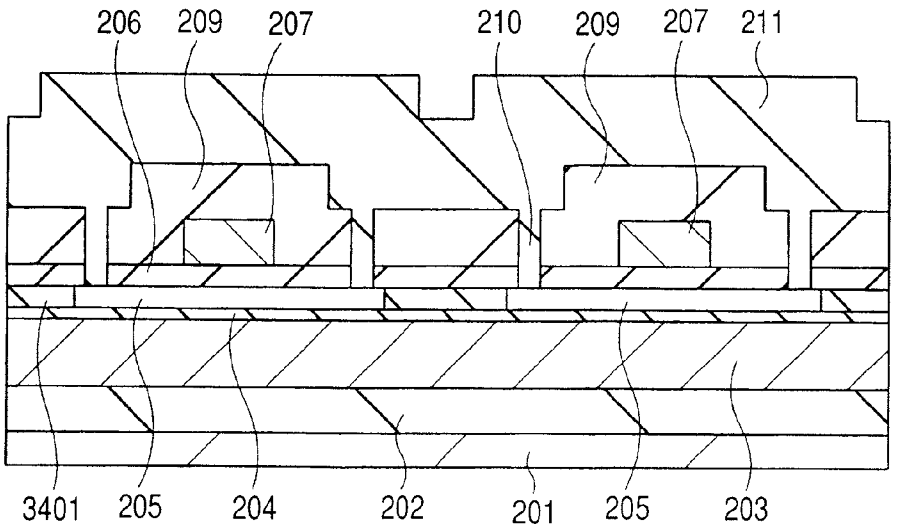

As shown in FIG. 34A and FIG. 34B, the lower electrodes 203 are formed on the insulation film 202 formed on the semiconductor substrate 201. The hollow parts 205 are formed above the lower electrodes 203 via the insulation film 204, insulation films 3401 are formed to cover the insulation film 204 and hollow parts 205, and the insulation films 3401 are flattened so that they have same height as the upper surfaces of the hollow parts.

The insulation film 206 is formed to surround the hollow parts 205 and insulation films 3401, and the interconnection 208 joining the upper electrodes 207, is formed above the insulation film 206. The insulation film 209 and insulation film 211 are formed above the upper electrodes 207 and interconnection 208. The wet etching holes 210 penetrating these films are also formed in the insulation film 209 and insulation film 206. These wet etching holes 210 are formed to form the hollow parts 205, and after forming the hollow parts 205, they are filled by the insulation film 211.

The essential feature of the sixth embodiment, as shown in FIGS. 34A and 34B, is that the insulation film 3401 is flattened on the upper surface of the hollow parts 205.

By adopting this construction, the step of the lower electrodes 203 is moderated, the step of the hollow parts 205 is moderated at the same time, the interconnection 208 joining the upper electrodes is not affected by the steps, and resistance increase and interconnection breaks are suppressed.

When the upper electrodes 207 are patterned, since there is no longer a step, overetching due to etching of interconnection material is reduced. When the overetching amount is large, the membrane film thickness of the CMUT cell varies due to etching of the insulation film 206 underneath the upper electrode 207, and this leads to operating characteristic fluctuations, but in the structure shown in the sixth embodiment, the etching amount of the insulation film 206 is reduced, so operating stability is enhanced.

Further, as shown in FIG. 34A, the interconnection 208 is disposed on the flattened insulation film 206, so dielectric strength with respect to the lower electrode does not decrease, and the reliability of the device is enhanced.

The method of manufacturing the CMUT array according to the sixth embodiment is essentially identical to that of the first embodiment, but is different in that flattening is performed on the upper surface of the hollow parts.

FIG. 35-FIG. 37 show the process up to forming of sacrifice layers, and the subsequent filling and flattening of the insulation film. (a) of each figure shows a cross-section through A-A' in FIG. 1, and (b) of each figure shows a cross-section through B-B' in FIG. 1.

Figure 35A:
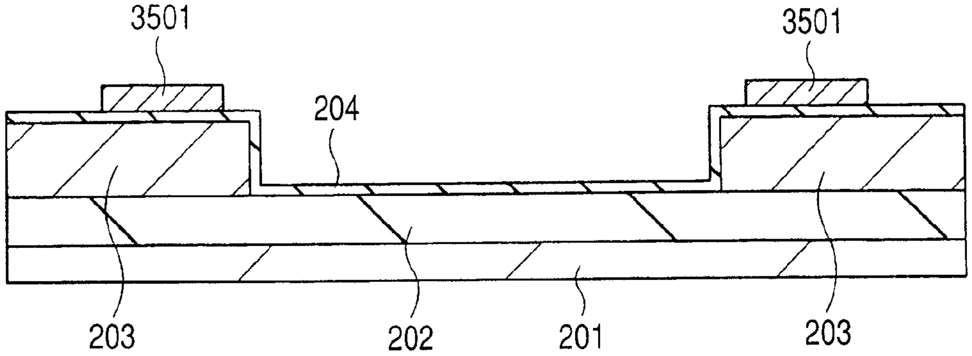
FIG. 35A is a cross-sectional view showing an ultrasonic transducer manufacturing step following FIG. 34A.
Figure 35B:
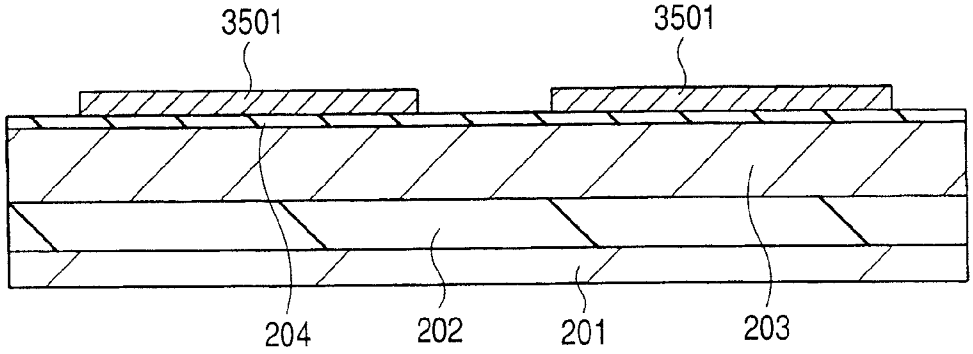
FIG. 35B is a cross-sectional view showing an ultrasonic transducer manufacturing step following FIG. 34B.

First, as shown in FIGS. 35A and 35B, the insulation film 202 of silicon oxide is deposited by plasma CVD on a semiconductor substrate 201, a titanium nitride film, aluminum alloy film and titanium nitride film are subsequently deposited thereon respectively to thicknesses of 100 nm, 600 nm, 100 nm by sputtering, and the lower electrodes 203 are formed by patterning using photolithography and dry etching. The insulation film 204 of silicon oxide is deposited to 100 nm by plasma CVD on these lower electrodes 203. Next, a polycrystalline silicon film is deposited to 200 nm by plasma CVD on the upper surface of the insulation film 204. The polycrystalline silicon film is left on the lower electrode after photolithography and dry etching. This remaining part becomes sacrifice layers 3501, and becomes the hollow parts 205 in FIG. 34 in a subsequent step.

Figure 36A:
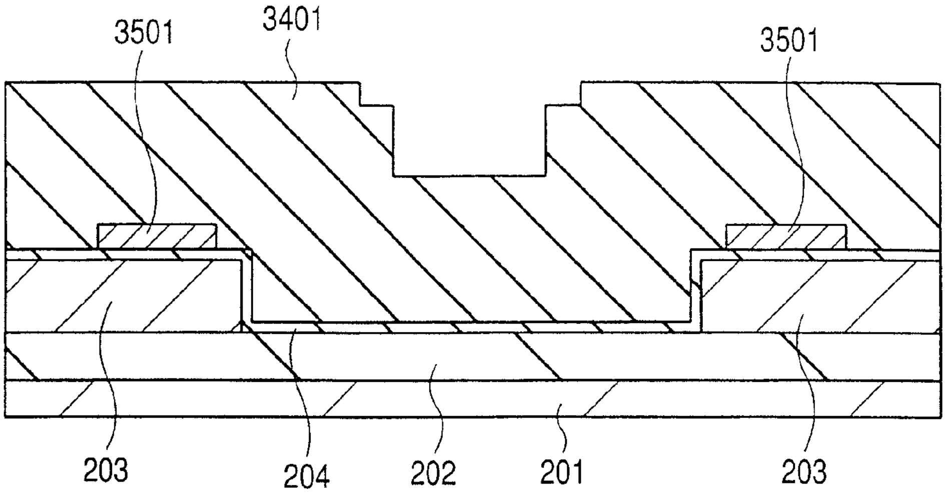
FIG. 36A is a cross-sectional view showing an ultrasonic transducer manufacturing step following FIG. 35A.
Figure 36B:
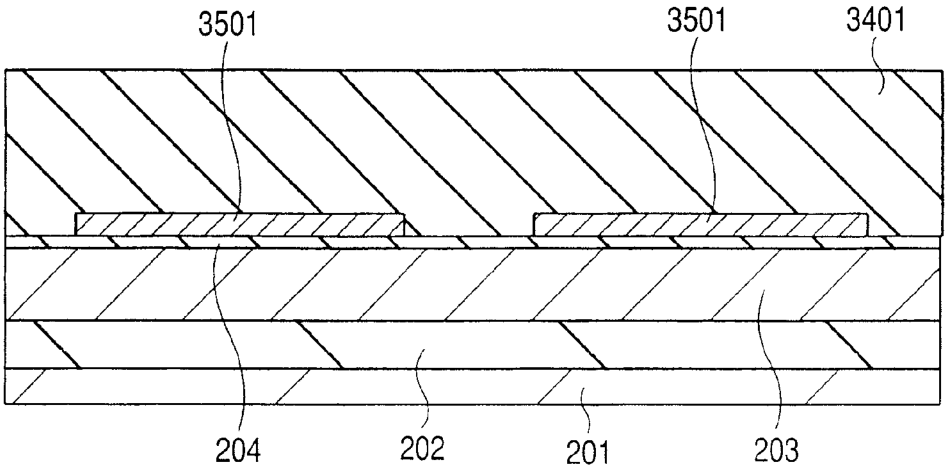
FIG. 36B is a cross-sectional view showing an ultrasonic transducer manufacturing step following FIG. 35B.

Next, an insulation film 3401 of silicon oxide is deposited to 1400 nm by plasma CVD to cover the sacrifice layers 3501 and insulation film 204 (FIGS. 36A and 36B).

Figure 37A:
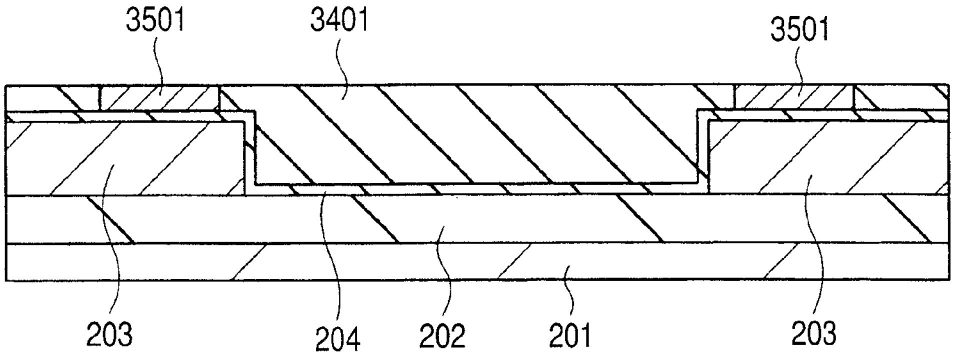
FIG. 37A is a cross-sectional view showing an ultrasonic transducer manufacturing step following FIG. 36A.
Figure 37B:
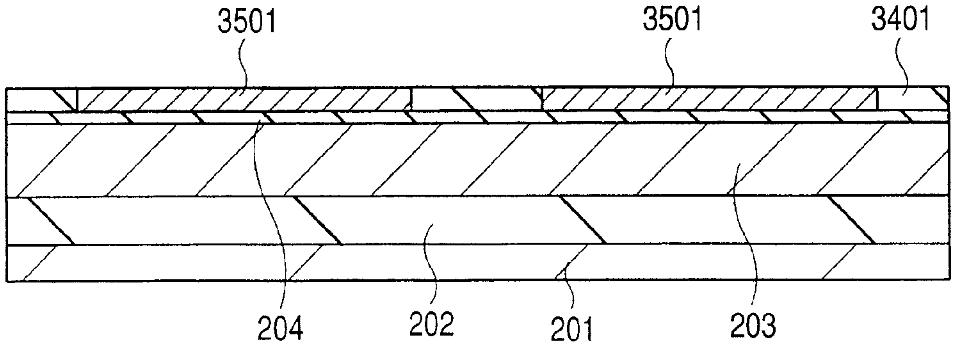
FIG. 37B is a cross-sectional view showing an ultrasonic transducer manufacturing step following FIG. 36B.

Subsequently, a structure is obtained wherein the upper surface of the sacrifice layers is flattened by CMP polishing of the insulation film 3401 of silicon oxide until the upper surfaces of the sacrifice layers 3501 are exposed (FIGS. 37A and 37B). The subsequent steps are identical to those of the first embodiment.

In the sixth embodiment, the insulation film 3401 of silicon oxide was flattened by CMP until the upper surfaces of the sacrifice layers 3501 were exposed, but an identical structure can be obtained by CMP flattening until just before the upper surfaces of the sacrifice layers 3501 are exposed, and then etching the insulation film 3401 of silicon oxide by dry etching until the upper surfaces of the sacrifice layers 3501 are exposed.

Further, in order to flatten the insulation film 3401 of silicon oxide with high precision, a stopper film for CMP flattening may be inserted above the sacrifice layers 3501 and insulation film 204. In this case, an identical flattened structure can be obtained, after polishing of the insulation film 3401 is stopped by the flattening stopper film, by uniform rate dry etching of the stopper film and insulation film 3401 until the upper surfaces of the sacrifice layers 3501 are exposed.

In this sixth embodiment, the insulation film 3401 which is flattened was formed by plasma CVD, but alternatively, an SOG film may be filled by a coating technique. In this case, after coating the SOG film, a flattened structure identical to that of FIG. 37 can be obtained by dry etching until the upper surfaces of the sacrifice layers are exposed.

The CMUT array shown in FIG. 1 consists of two rows and one column of CMUT cells disposed at the crosspoints of the lower electrodes 203 and upper electrodes 207, but even if there are plural rows and plural columns of CMUT cells as in the first embodiment, an identical effect can be obtained by flattening above the hollow parts.

Further, in FIG. 1, the CMUT cells are hexagonal, but the invention is not limited to this shape, and they may be for example circular.

Among the materials forming the CMUT cells shown in the sixth embodiment, only one combination thereof was shown. Also, the material of the sacrifice layers preferably retains wet etching selectivity with the materials surrounding the sacrifice layers. Therefore, in addition to a polycrystalline silicon film, it may be an SOG film or metal film.

Seventh Embodiment

In the CMUT array of the seventh embodiment, a dummy pattern for flattening is formed in the same layer as the lower electrode, and flattening is performed above the hollow part, to moderate the step of the lower electrodes and hollow part.

Figure 38:
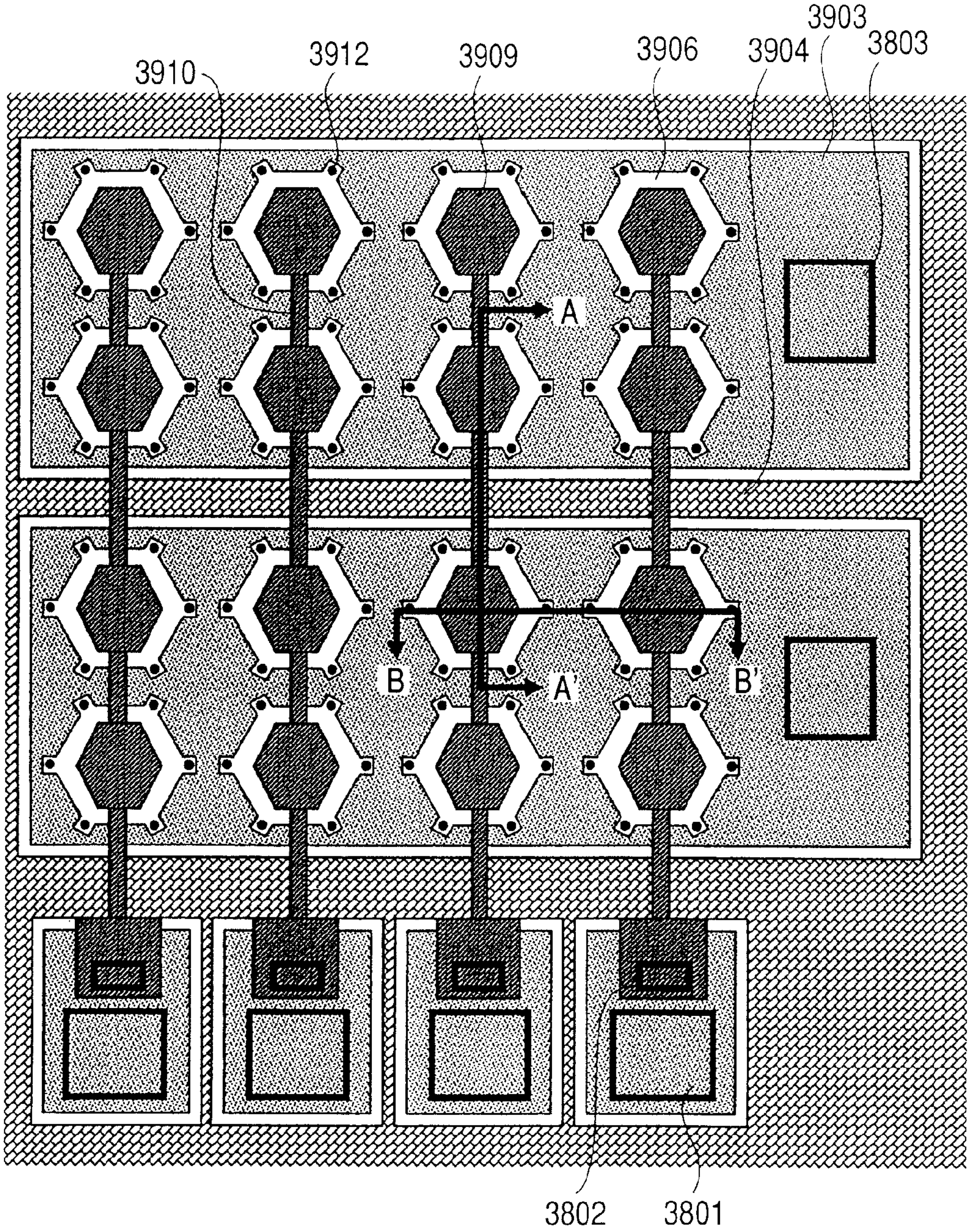
FIG. 38 is an upper plan view showing an ultrasonic transducer according to a seventh embodiment of the invention.

FIG. 38 shows an upper plan view of the CMUT array of the seventh embodiment.

3903 are lower electrodes, 3906 are hollow parts, 3909 are upper electrodes, 3910 are interconnections joining the upper electrodes 3909, and 3912 are wet etching holes for forming the hollow parts 3906. The wet etching holes 3912 are connected to the hollow parts 3906.

3801 are pad openings to pads provided in the same layer as the lower electrodes 3903 to supply power to the upper electrodes 3909, and 3802 are plugs joining the interconnections 3910 to the pads. In other words, the interconnections 3910 joining the upper electrodes 3909 to the pads are connected via the plugs 3802. 3803 are pad openings to supply power to the lower electrodes 3903. A dummy pattern 3904 for flattening is formed in the lower electrodes 3903. An insulation film is formed between the upper electrodes 3909 and lower electrodes 3903 so as to cover the hollow parts 3906, dummy pattern 3904 and lower electrodes 3903, but it is not shown so as to show the hollow parts 3906, lower electrodes 3903 and dummy pattern 3904.

Figure 39A:
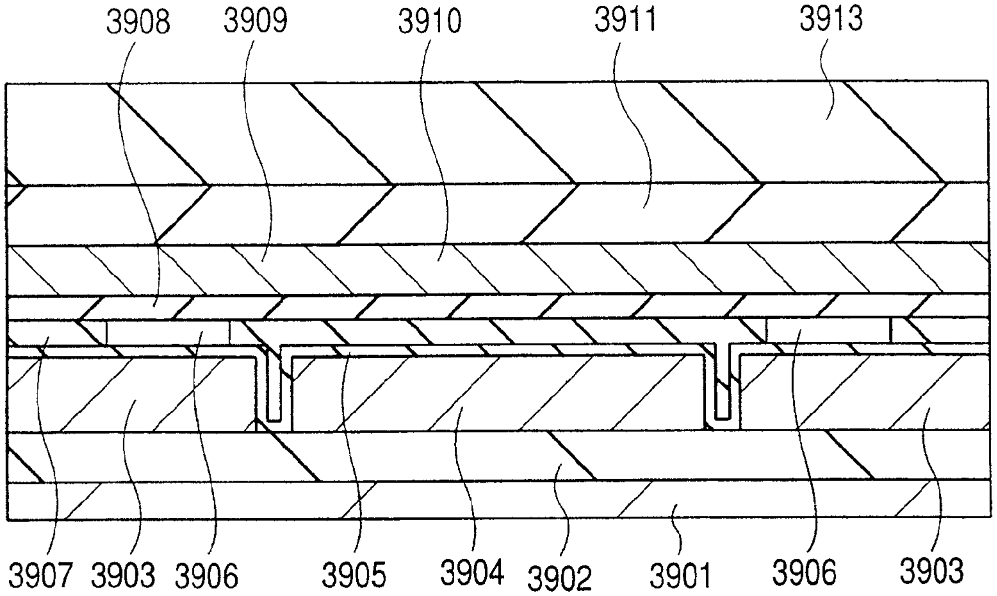
FIG. 39A is a cross-sectional view through a line A-A' in FIG. 38.
Figure 39B:
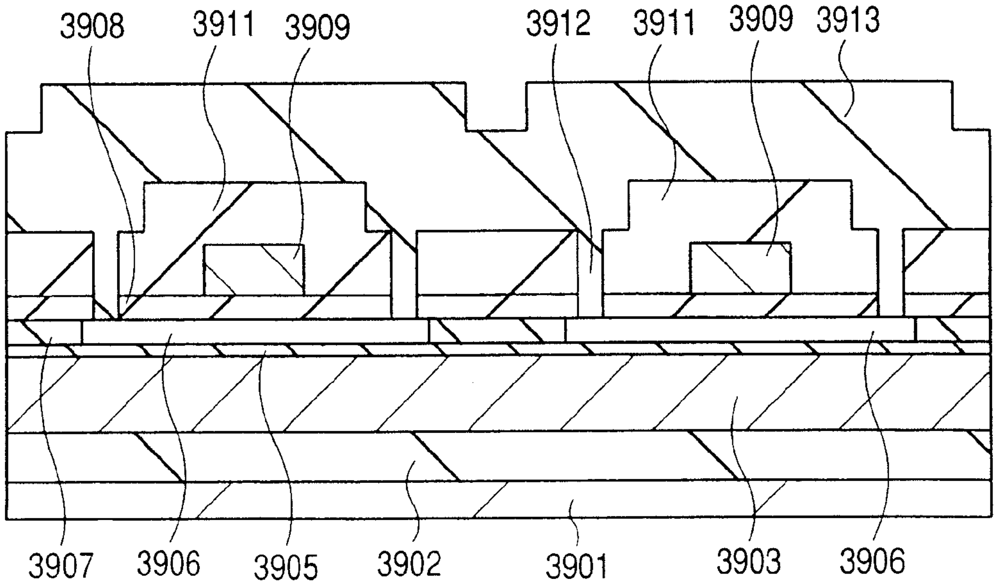
FIG. 39B is a cross-sectional view through a line B-B' in FIG. 38.

FIG. 39A shows a cross-section through A-A' in FIG. 38, and FIG. 39B shows a cross-section through B-B' in FIG. 38.

As shown in FIG. 39A and FIG. 39B, the lower electrodes 3903 are formed on the insulation film 3902 formed on the semiconductor substrate 3901. The dummy pattern 3904 for flattening is also formed at the same time as the lower electrodes 3903. The hollow parts 3906 are formed via the insulation film 3905 on the lower electrodes 3903, insulation films 3907 are formed to cover the insulation film 3905 and hollow parts 3906, and the insulation films 3907 are flattened so that they are the same height as the upper surfaces of the hollow parts. An insulation film 3908 is formed to cover the hollow parts 3906 and insulation film 3907, and the upper electrodes 3909 and interconnections 3910 joining the upper electrodes 3909, are formed above the insulation film 3908. An insulation film 3911 and insulation film 3913 are formed above the upper electrodes 3909. Wet etching holes 3912 penetrating these films are formed in the insulation film 3908 and insulation film 3911. These wet etching holes 3912 are formed to form the hollow parts 3906, and after forming the hollow parts 3906, they are filled by the insulation film 3913.

The characteristic of this seventh embodiment, as shown in FIG. 38 and FIGS. 39A and 39B, is that the dummy pattern 3904 is provided between the lower electrodes 3903, gaps between the lower electrodes 3903 and dummy pattern 3904 are filled by the insulation film 3907, the insulation film 3907 is also formed on the hollow parts 3906 and the insulation film 3905, and the insulation films 3907 are flattened on the upper surfaces of the hollow parts 3906.

By adopting this construction, flattening characteristics in CMP flattening of the step of the lower electrodes 3903 are further enhanced.

If there were no dummy pattern 3904, when the insulation films 3907 are CMP polished, the drop amount of the insulation films 3907 in areas where the lower electrodes 3903 are not present in the underlayer, might increase due to the phenomenon known as dishing. However, in the structure shown in the seventh embodiment, flattening by CMP of the insulation films 3907 is enhanced by the dummy pattern 3904, and the step of the lower electrodes 3903 is further moderated.

Therefore, compared to the case when there is no dummy pattern 3904, the interconnections 3910 joining the upper electrodes 3909 are affected even less by the step, and resistance increase and interconnection breaks are suppressed.

Further, when the upper electrodes 3910 are patterned, since there is no longer a step, overetching due to etching of interconnection material is reduced. In particular, as shown in FIG. 39A, the interconnections 3910 are disposed on the flattened insulation film 3908, so reliability of the device is enhanced without decreasing dielectric strength with respect to the lower electrodes 3903.

The method of manufacturing the CMUT array according to the seventh embodiment is essentially identical to that of the sixth embodiment, but is different only in that the dummy pattern for flattening is formed in the same layer as the lower electrodes.

As in the sixth embodiment, flattening may be performed by CMP after forming an insulation film by plasma CVD, or flattening may be performed by a combination of CMP and dry etching. Moreover, an identical flattened structure can be obtained, after inserting the flattening stopper film above the hollow parts to stop polishing of the insulation film, by uniform rate dry etching of the stopper film and insulation film until the upper surfaces of the sacrifice layers are exposed.

By filling an SOG film by coating and dry etching without using a CMP step, an identical flattened structure can be obtained by performing etch back until the upper surfaces of the sacrifice layers are exposed.

Further, by performing flattening on the upper surfaces of the hollow parts 3906, an identical structure can be obtained also by forming the sacrifice layers to become the hollow parts 3906 by damascene interconnections. In this case, a groove is first formed by etching in the insulation film, the material to become the sacrifice layers is filled in this groove, and the surplus material which has spilled out from the groove is polished.

The CMUT array shown in FIG. 38 consists of two rows and one column of CMUT cells disposed at the crosspoints of the lower electrodes 3903 and upper electrodes 3909, but even if there are plural rows and plural columns of CMUT cells as in the first embodiment, an identical effect can be obtained by forming a dummy pattern for flattening in the same layer as the lower electrodes and flattening above the hollow parts.

Further, in FIG. 38, the CMUT cells are hexagonal, but the invention is not limited to this shape, and they may example be circular.

Among the materials forming the CMUT cells shown in the seventh embodiment, only one combination thereof was shown. Also, the material of the sacrifice layers preferably retains wet etching selectivity with the materials surrounding the sacrifice layers. Therefore, in addition to a polycrystalline silicon film, it may be an SOG film or metal film.

Eighth Embodiment

In the CMUT array of the eighth embodiment, to moderate the step of the lower electrodes and hollow parts, a dummy pattern for flattening is formed in the same layer as the lower electrodes and hollow parts, and flattening is performed above the hollow parts.

Figure 40:
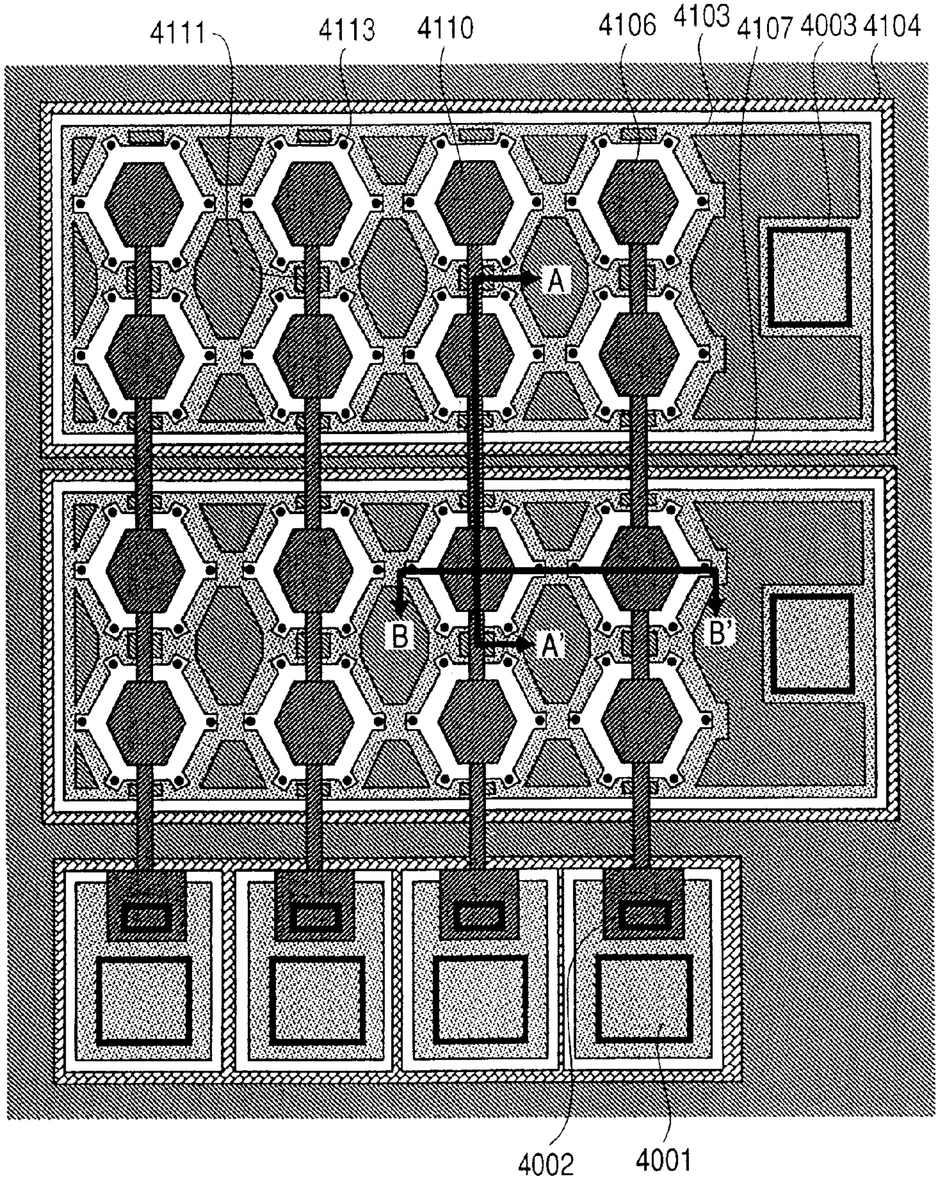
FIG. 40 is an upper plan view showing an ultrasonic transducer according to an eighth embodiment of the invention.

FIG. 40 shows an upper plan view of the CMUT array of the eighth embodiment. 4103 are lower electrodes, 4106 are hollow parts, 4110 are upper electrodes, 4111 are interconnections joining the upper electrodes 4110, and 4113 are wet etching holes for forming the hollow parts 4106. The wet etching holes 4113 are connected to the hollow parts 4106. 4001 are pad openings to pads provided in the same layer as the lower electrodes 4103 to supply power to the upper electrodes 4110, and 4002 are plugs joining the interconnections 4111 to the pads. The interconnections 4111 joining the upper electrodes 4110 to the pads are connected via the plugs 4002. 4003 are pad openings to supply power to the lower electrodes 4103. A dummy pattern 4104 for flattening the lower electrodes 4103, is formed in the same layer as the lower electrodes 4103. 4107 is a dummy pattern formed in the same layer as the hollow parts.

An insulation film is formed between the upper electrodes 4110 and lower electrodes 4103 so as to cover the hollow parts 4106, dummy patterns 4104, 4107 and lower electrodes 4103, but it is not shown so as to show the hollow parts 4106, lower electrodes 4103, and dummy patterns 4104, 4107.

FIG. 41 shows a cross-sectional view of the CMUT array of the eighth embodiment.

Figure 41A:
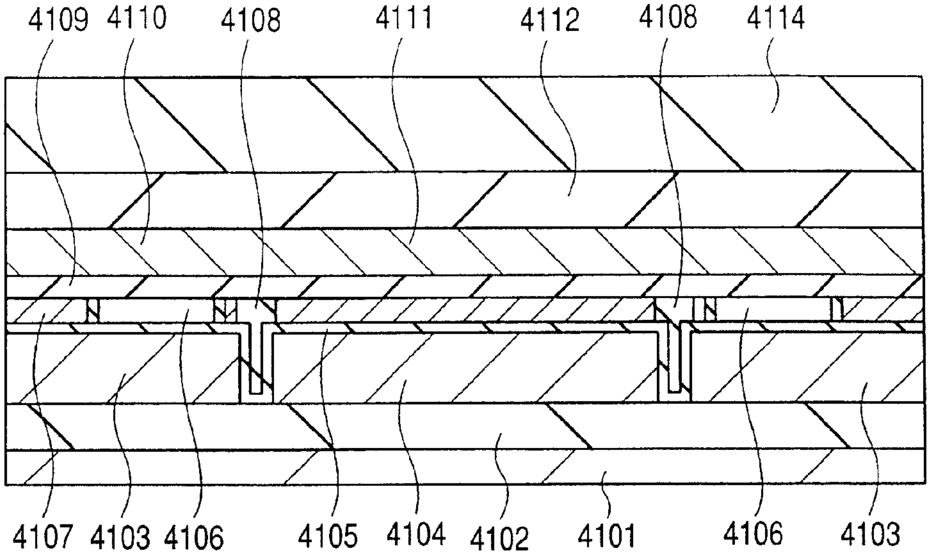
FIG. 41A is a cross-sectional view through a line A-A' in FIG. 40.
Figure 41B:
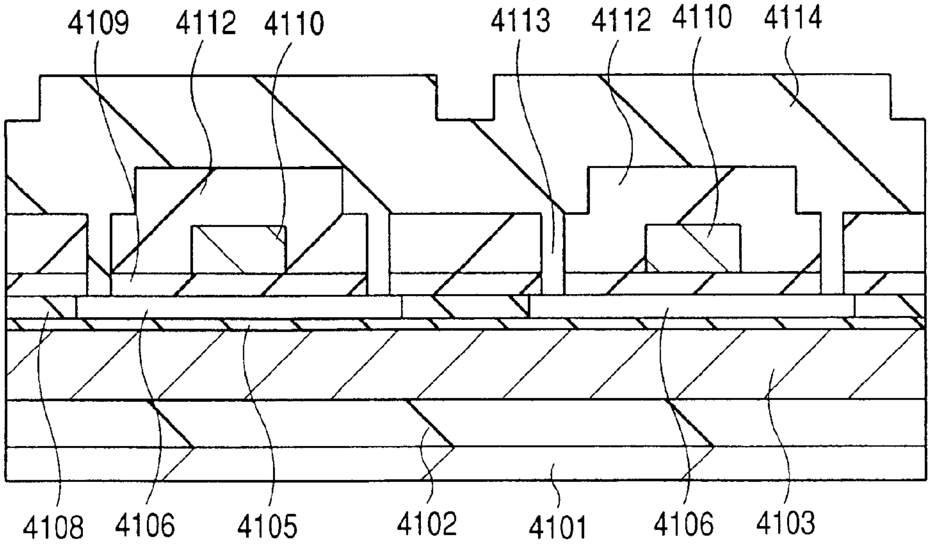
FIG. 41B is a cross-sectional view through a line B-B' in FIG. 40.

FIG. 41A shows a cross-section through A-A' in FIG. 40, and FIG. 41B is a cross-section through B-B' in FIG. 40.

As shown in FIG. 41A and FIG. 41B, the lower electrodes 4103 are formed on the insulation film 4102 formed on the semiconductor substrate 4101.

The dummy pattern 4104 for flattening is also formed at the same time as the lower electrodes 4103. Hollow parts 4106 are formed via the insulation film 4105 above the lower electrodes 4103. The dummy pattern 4107 for flattening is formed also in the same layer as the hollow parts. An insulation film 4108 is formed to cover the insulation film 4105, hollow parts 4106 and dummy pattern 4107, and the insulation film 4108 is flattened so that it is the same height as the upper surfaces of the hollow parts. An insulation film 4109 is formed to cover the hollow parts 4106, dummy pattern 4107 and insulation film 4108, and the upper electrodes 4110 and interconnections 4111 joining the upper electrodes are formed above the insulation film 4109. An insulation film 4112 and insulation film 4114 are formed above the upper electrodes 4110. Wet etching holes 4113 penetrating these films are formed in the insulation film 4109 and insulation film 4112. These wet etching holes 4113 are formed to form the hollow parts 4106, and after forming the hollow parts 4106, they are filled by an insulation film 4114.

The characteristic of this eighth embodiment, as shown in FIG. 40 and FIGS. 41A and 41B, is that the dummy patterns 4104, 4107 are provided in the same layer as the lower electrodes 4103 and the same layer as the hollow parts, the gaps between the lower electrodes 4103 and dummy pattern 4104, and the hollow parts 4106 and dummy pattern 4107, are filled by the insulation film 4108, and the insulation film 4108 is flattened on the upper surfaces of the hollow parts 4106.

By adopting this construction, CMP flattening characteristics for flattening the step of the lower electrodes 4103 and hollow parts 4106 are further enhanced.

If there were no dummy patterns 4104, 4107, when the insulation film 4108 is CMP polished, the drop amount of the insulation film 4108 in areas where the lower electrodes 4103 or hollow parts 4106 are not present in the underlayer, would increase due to the phenomenon known as dishing. However, in the structure shown in the eighth embodiment, flattening by CMP of the insulation film 4108 is enhanced by the dummy patterns 4104, 4107, and the steps of the lower electrodes 4103 and hollow parts 4106 are further moderated.

Further, when the upper electrodes 4110 are patterned, since there is no longer a step, overetching due to etching of interconnection material is further reduced. In particular, as shown in FIG. 41A, the interconnections 4111 are disposed on the flattened insulation film 4109, so reliability of the device is enhanced without decreasing dielectric strength with respect to the lower electrodes 4103.

The method of manufacturing the CMUT array according to the eighth embodiment is essentially identical to that of the seventh embodiment, but is different in that the dummy pattern is formed in the same layer as the hollow parts.

In the eighth embodiment, as in the seventh embodiment, it is evident that flattening may be performed by CMP only, or by a combination of CMP and dry etching. Further, as in the seventh embodiment, the CMP stopper film may be inserted above the sacrifice layer.

Also in the eighth embodiment, an SOG film may be filled by coating an insulation film to perform flattening. In this case, after coating the SOG film, a flattened structure identical to that of FIG. 41 can be obtained by dry etching until the upper surface of the sacrifice layer is exposed.

Further, to perform flattening of the upper surfaces of the hollow parts 4106, an identical structure can be obtained by forming the sacrifice layer to become the hollow parts 4106 by damascene interconnections. In this case, a groove is first formed by etching in the insulation film, the material to become the sacrifice layer is filled in this groove, and the surplus material which has spilled out from the groove is polished.

The CMUT array shown in FIG. 40 consists of two rows and one column of CMUT cells disposed at the crosspoints of the lower electrodes 4103 and upper electrodes 4110, but even if there are plural rows and plural columns of CMUT cells as in the first embodiment, an identical effect can be obtained by forming a dummy pattern for flattening in the same layer as the lower electrodes and hollow parts, and flattening above the hollow parts.

Further, in FIG. 40, the CMUT cells are hexagonal, but the invention is not limited to this shape, and they may be for example circular.

Among the materials forming the CMUT cells shown in the eighth embodiment, one combination thereof was shown. Also, the material of the sacrifice layer preferably retains wet etching selectivity with the materials surrounding the sacrifice layer. Therefore, in addition to a polycrystalline silicon film, it may be an SOG film or metal film.

Ninth Embodiment

In the CMUT array of the ninth embodiment, to moderate the step of the lower electrode and hollow part, a dummy pattern for flattening is formed in the same layer as the lower electrodes and hollow parts, and flattening is performed above the lower electrodes and hollow parts.

Figure 42:
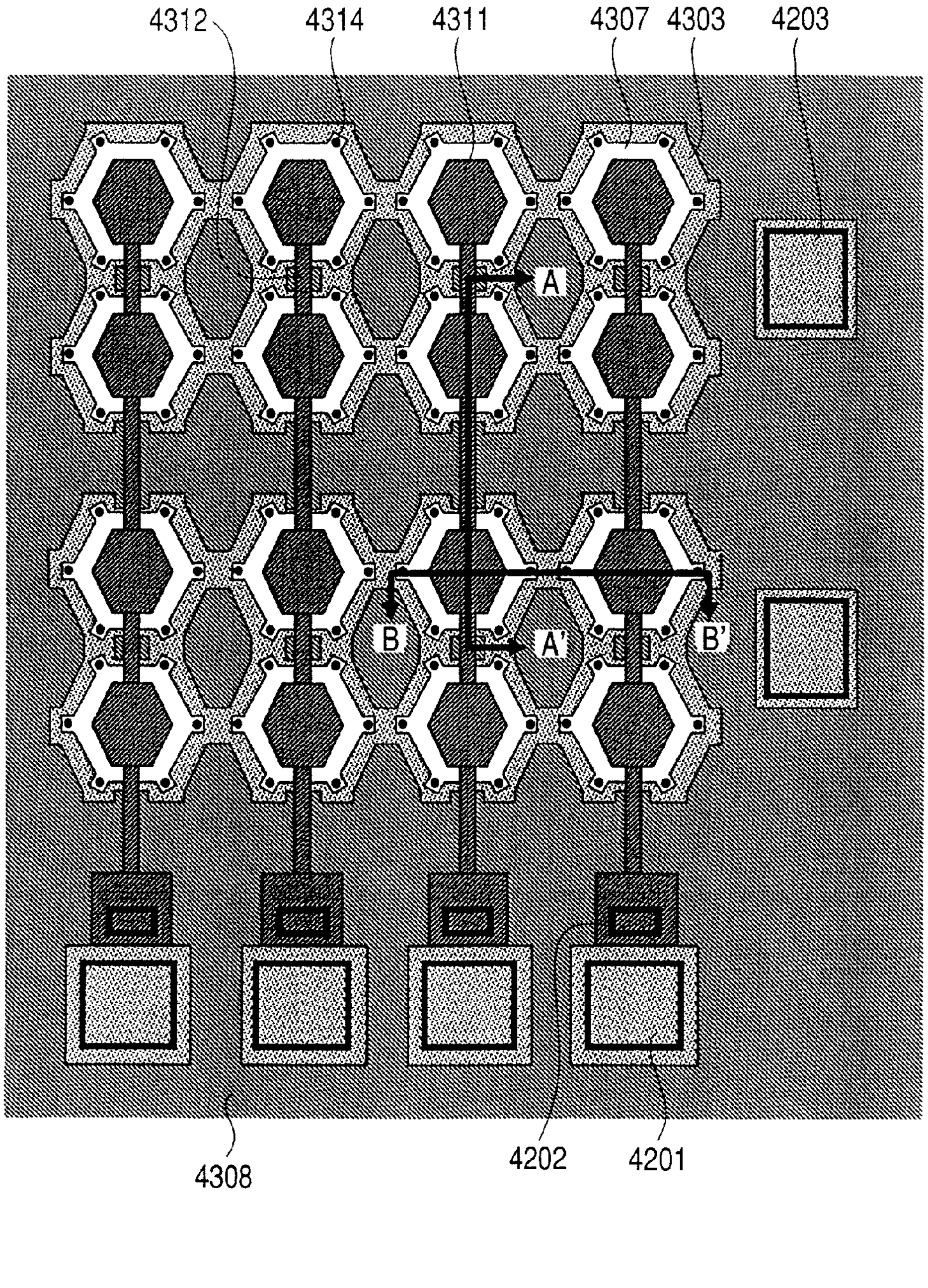
FIG. 42 shows an upper plan view showing an ultrasonic transducer according to a ninth embodiment of the invention.

FIG. 42 shows an upper plan view of the CMUT array of the ninth embodiment. 4303 are lower electrodes, 4307 are hollow parts, 4311 are upper electrodes, 4312 are interconnections joining the upper electrodes 4311, and 4314 are wet etching holes for forming the hollow parts 4307. The wet etching holes 4314 are connected to the hollow parts 4307. 4201 are pad openings to pads provided in the same layer as the lower electrodes 4303 to supply power to the upper electrodes 4311, and 4202 are plugs joining the interconnections 4312 to the pads. In other words, the interconnections 4312 joining the upper electrodes 4311 and the pads are connected via the plugs 4202. 4203 are pad openings to supply power to the lower electrodes 4303. 4308 is a dummy pattern formed in the same layer as the hollow parts. A dummy pattern for flattening between the lower electrodes 4303 is formed in the same layer as the lower electrodes 4303, but it is covered by the dummy pattern 4308 and is therefore not shown. An insulation film is formed to cover the hollow parts 4307, dummy pattern in the same layer as the lower electrode, dummy pattern 4308 in the same layer as the hollow part and lower electrode 4303, but it is not shown so as to show the hollow parts 4307, lower electrodes 4303, and dummy pattern 4308.

FIG. 43 shows a cross-sectional view of the CMUT array of the ninth embodiment.

Figure 43A:
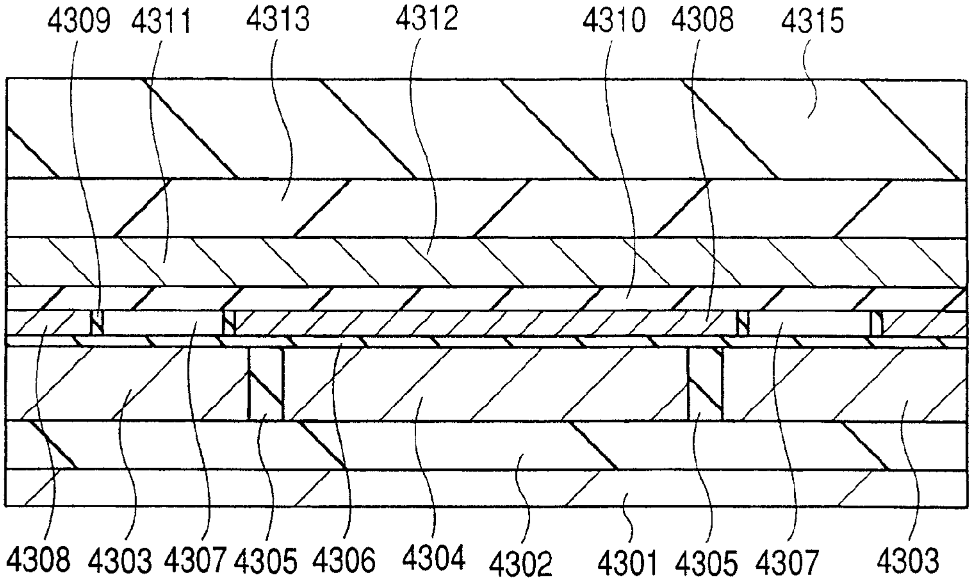
FIG. 43A is a cross-sectional view through a line A-A' in FIG. 42.
Figure 43B:
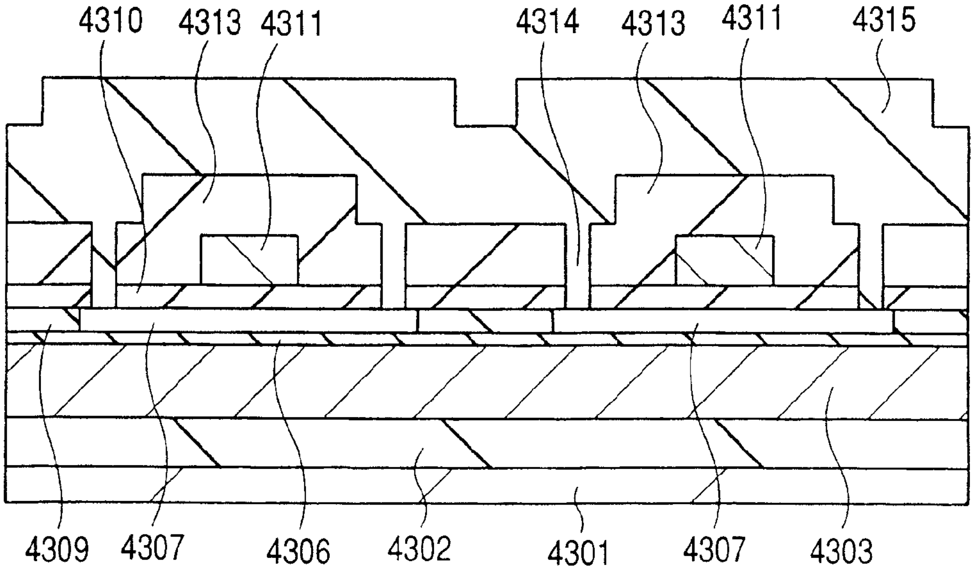

FIG. 43A shows a cross-section through A-A' in FIG. 42 and FIG. 43B shows a cross-section through B-B' in FIG. 42.

As shown in FIG. 43A and FIG. 43B, the lower electrodes 4303 of the CMUT are formed on the insulation film 4302 formed on the semiconductor substrate 4301. A dummy pattern 4304 for flattening is also formed at the same time as the lower electrodes 4303. An insulation film 4305 is filled between the lower electrodes 4303 and dummy pattern 4304, and is flattened so that the heights of the upper surfaces of the lower electrodes 4303 and insulation film 4305, coincide. An insulation film 4306 is formed above the lower electrodes 4303, dummy pattern 4304 and insulation film 4305, and the hollow parts 4307 are formed on the lower electrodes 4303 via the insulation film 4306.

The insulation film 4308 for flattening is also formed in the same layer as the hollow parts 4307. An insulation film 4309 is formed to cover the hollow parts 4307 and dummy pattern 4308, and the insulation film 4309 is flattened so that it is the same height as the upper surfaces of the hollow parts. An insulation film 4310 is formed to cover the hollow parts 4307, the dummy pattern 4308 and insulation film 4309, and upper electrodes 4311 and interconnections 4312 joining the upper electrodes are formed above the insulation film 4310. An insulation film 4313 and insulation film 4315 are formed above the upper electrodes 4311. Wet etching holes 4314 penetrating these films are formed in the insulation film 4310 and insulation film 4313. These wet etching holes 4314 are formed to form the hollow parts 4307, and after forming the hollow parts 4307, they are filled by an insulation film 4315.

The characteristic of this ninth embodiment, as shown in FIG. 42 and FIGS. 43A and 43B, is that the dummy pattern 4304 is formed in the same layer as the lower electrodes 4303, the insulation film 4305 is filled in the gaps between the lower electrodes 4303 and dummy pattern 4304, and the insulation film 4305 is flattened on the upper surface of the lower electrodes. Further, the dummy pattern 4308 is provided in the same layer as the hollow parts 4307, an insulation film 4309 is filled in the gaps between the hollow parts 4307 and dummy pattern 4308, and the insulation film 4309 is flattened on the upper surfaces of the hollow parts 4307.

By adopting this construction, flattening is performed on the lower electrodes 4303, so the dummy pattern 4308 can be disposed in the same layer as the hollow parts 4307 without being affected by the position of the lower electrodes 4303, and the flatness in the flattening of the steps of the lower electrodes 4303 and hollow parts 4307 is further improved.

If flattening were not performed on the lower electrodes 4303, the dummy pattern 4308 in the same layer as the hollow parts 4307 could be disposed only on the lower electrodes 4303 or on the dummy pattern 4304 in the same layer as the lower electrodes 4303. Therefore, in areas where the hollow parts 4307 and the dummy pattern 4308 are not present in the same layer as the hollow parts 4307, the drop amount of the insulation film 4309 when the insulation film 4309 is CMP polished would increase due to the phenomenon known as dishing. However, in the construction shown in the ninth embodiment, as shown in FIGS. 42, 43A, and 43B, the dummy pattern 4308 can be disposed in the same layer as the hollow parts 4307 without being affected by the positions of the lower electrodes 4303 and dummy pattern 4304 in the same layer as the lower electrodes 4303, so CMP flattening of the insulation film filling the gaps between the hollow parts 4307 and the dummy pattern 4308 in the same layer as the hollow parts 4307 is enhanced, and the step of the hollow parts 4307 is further moderated.

In the method of manufacturing the CMUT array according to the ninth embodiment, the disposing of the dummy pattern in the same layer as the lower electrodes and flattening are identical to those of the fifth embodiment. The disposing of the dummy pattern for flattening in the same layer as the hollow parts is identical to that of the eighth embodiment, except that the dummy pattern is disposed without being affected by the position of the lower electrodes and dummy pattern in the same layer as the lower electrodes.

Also in the ninth embodiment, it will be evident that the flattening may be performed by CMP alone, or by a combination of CMP and dry etching. Further, a CMP stopper film may also be inserted above the sacrifice layer.

Also in this ninth embodiment, an SOG film may be filled by coating an insulation film for flattening. In this case, after coating of the SOG film, a flattened structure identical to that of FIG. 43 may be obtained by dry etching until the upper surface of the sacrifice layer is exposed.

The CMUT array shown in FIG. 42 consists of two rows and one column of CMUT cells disposed at the crosspoints of the lower electrodes 4303 and upper electrodes 4311, but even if there are plural rows and plural columns of CMUT cells as in the first embodiment, an identical effect can be obtained by performing flattening on the lower electrodes and on the hollow parts.

Further, in FIG. 42, the CMUT cells are hexagonal, but the invention is not limited to this shape, and they may be for example circular.

Among the materials forming the CMUT cells shown in the ninth embodiment, only one combination thereof was shown. Also, the material of the sacrifice layer preferably retains wet etching selectivity with the materials surrounding the sacrifice layer. Therefore, in addition to a polycrystalline silicon film, it may be an SOG film or metal film.

The invention as conceived by the inventors has been described herein referring to specific embodiments, but it is not to be construed as being limited in anyway thereby, various modifications being possible within the scope and spirit of the appended claims.

The ultrasonic transducer of the invention has wide application in those institutions which perform ultrasound examinations such as medical facilities, and in manufacturing industries using test equipment. Further, the manufacturing method has wide application in those industries manufacturing ultrasonic transducers.

What is claimed is:

1. An ultrasonic transducer, comprising:

(a) a first electrode;

(b) a first insulation film covering the first electrode;

(c) a hollow part overlapping the first electrode on the first insulation film;

(d) a second insulation film covering the hollow part;

(e) a second electrode overlapping the hollow part on the second insulation film; and (f) an interconnection joined to the second electrode;

wherein an edge of the first electrode is formed so as to moderate a step of the first electrode;

wherein the step of the first electrode is moderated by the first electrode having a taper angle.

2. The ultrasonic transducer according to claim 1, wherein the step of the first electrode has a dimension of at least 500 nm.

3. The ultrasonic transducer according to claim 1, wherein a width of a portion of the interconnection overlapping the edge of the first electrode viewed from an upper surface, is thicker than a width of another portion of the interconnection not overlapping the edge of the first electrode viewed from the upper surface.

4. An ultrasonic transducer formed on a substrate, comprising:

(a) a first electrode;

(b) a first insulation film covering the first electrode;

(c) a hollow part overlapping the first electrode on the first insulation film;

(d) a second insulation film covering the hollow part;

(e) a second electrode overlapping the hollow part on the second insulation film; and (f) an interconnection joined to the second electrode;

wherein an edge of the first electrode is formed so as to moderate a step of the first electrode;

wherein the step of the first electrode is moderated by forming a sidewall due to an insulation film on the edge of the first electrode; and wherein the step of the first electrode has a height dimension extending above the substrate, of at least 500 nm.

5. An ultrasonic transducer, comprising:

(a) a first electrode;

(b) a first insulation film covering the first electrode;

(c) a hollow part overlapping the first electrode on the first insulation film;

(d) a second insulation film covering the hollow part;

(e) a second electrode overlapping the hollow part on the second insulation film; and (f) an interconnection joined to the second electrode;

wherein an edge of the first electrode is formed so as to moderate a step of the first electrode;

wherein the step of the first electrode is moderated by forming a sidewall due to an insulation film on the edge of the first electrode; and wherein a width of a portion of the interconnection overlapping the side wall on the edge of the first electrode viewed from an upper surface, is thicker than a width of another portion of the interconnection not overlapping the edge of the first electrode viewed from the upper surface.

* * * * *